(12) United States Patent  
Kim

(10) Patent No.: US 12,013,552 B2  
(45) Date of Patent: Jun. 18, 2024

(54) CAMERA MODULE

(71) Applicant: LG INNOTEK CO., LTD., Seoul (KR)

(72) Inventor: Dong Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 995 days.

(21) Appl. No.: 16/965,582

(22) PCT Filed: Jan. 23, 2019

(86) PCT No.: PCT/KR2019/000936  
§ 371 (c)(1),  
(2) Date: Jul. 28, 2020

(87) PCT Pub. No.: WO2019/147003  
PCT Pub. Date: Aug. 1, 2019

(65) Prior Publication Data  
US 2021/0048563 A1 Feb. 18, 2021

(30) Foreign Application Priority Data  
Jan. 29, 2018 (KR) .......................... 10-2018-0010622

(51) Int. Cl.  
*G02B 3/14* (2006.01)  
*G02B 7/04* (2021.01)  
(Continued)

(52) U.S. Cl.  
CPC .................. *G02B 3/14* (2013.01); *G02B 7/04* (2013.01); *G03B 17/12* (2013.01); *H04N 23/55* (2023.01); *H05K 1/141* (2013.01)

(58) Field of Classification Search  
None  
See application file for complete search history.

(56) References Cited

U.S. PATENT DOCUMENTS

| | | | |
|---|---|---|---|
| 9,699,370 B2 | 7/2017 | Wang et al. | |
| 2006/0044640 A1* | 3/2006 | Kato | G02B 26/005 348/E5.045 |

(Continued)

FOREIGN PATENT DOCUMENTS

| | | |
|---|---|---|
| CN | 105807537 A | 7/2016 |
| EP | 1 906 213 A1 | 4/2008 |

(Continued)

OTHER PUBLICATIONS

Office Action dated Feb. 24, 2022 in Korean Application No. 10-2018-0010622.

(Continued)

*Primary Examiner* — Robert E. Tallman  
(74) *Attorney, Agent, or Firm* — Saliwanchik, Lloyd & Eisenschenk

(57) ABSTRACT

A camera module includes a liquid lens unit, a lens holder in which the liquid lens unit is disposed, a main board configured to supply a driving signal to drive the liquid lens unit, and a base disposed between the liquid lens unit and the main board, the base being configured to transmit the driving signal output from the main board to the liquid lens unit, wherein the base includes a body in which the lens holder is disposed, a first pillar and a second pillar protruding upwards from the body, and a first connection part and a second connection part electrically connecting the liquid lens unit to the main board.

15 Claims, 29 Drawing Sheets

(51) Int. Cl.
*G03B 17/12* (2021.01)
*H04N 23/55* (2023.01)
*H05K 1/14* (2006.01)

(56) References Cited

U.S. PATENT DOCUMENTS

| | | | |
|---|---|---|---|
| 2007/0147816 A1* | 6/2007 | Humpston | G02B 3/14 |
| | | | 396/72 |
| 2008/0037973 A1* | 2/2008 | Jung | G03B 13/32 |
| | | | 396/89 |
| 2008/0267603 A1 | 10/2008 | Jung et al. | |
| 2011/0158634 A1 | 6/2011 | Craen et al. | |
| 2013/0003010 A1 | 1/2013 | Yu | |

FOREIGN PATENT DOCUMENTS

| | | |
|---|---|---|
| JP | 2007-292845 A | 11/2007 |
| JP | 2013-15837 A | 1/2013 |
| JP | 5568599 B2 | 8/2014 |
| JP | 2014-228764 A | 12/2014 |
| KR | 10-2008-0014274 A | 2/2008 |
| KR | 10-0843473 B1 | 7/2008 |
| KR | 10-2011-0048879 A | 5/2011 |
| WO | 2015/133759 A1 | 9/2015 |

OTHER PUBLICATIONS

International Search Report dated May 1, 2019 in International Application No. PCT/KR2019/000936.
Supplementary European Search Report dated Sep. 13, 2021 in European Application No. 19743974.8.
Office Action dated Aug. 17, 2021 in Chinese Application No. 201980010505.7.

* cited by examiner (a)

(b)

CAMERA MODULE

CROSS-REFERENCE TO RELATED APPLICATIONS

This application is the U.S. national stage application of International Patent Application No. PCT/KR2019/000936, filed Jan. 23, 2019, which claims the benefit under 35 U.S.C. § 119 of Korean Patent Application No. 10-2018-0010622, filed Jan. 29, 2018, the disclosures of each of which are incorporated herein by reference in their entirety.

TECHNICAL FIELD

Embodiments relate to a camera module.

BACKGROUND ART

People who use portable devices demand optical devices that have high resolution, are small, and have various photographing functions. For example, these various photographing functions may be at least one of an optical zoom-in/zoom-out function, an auto-focusing (AF) function, or a hand-tremor compensation or optical image stabilizer (OIS) function.

In a conventional art, in order to implement the above-described various photographing functions, a method of combining a plurality of lenses and directly moving the combined lenses is used. In the case in which the number of lenses is increased, however, the size of an optical device may increase.

The auto-focusing and hand-tremor compensation functions are performed by moving or tilting a plurality of lenses, which are fixed to a lens holder and are aligned along an optical axis, in an optical-axis direction or a direction perpendicular to the optical axis. To this end, a separate lens-moving apparatus is used to move a lens assembly composed of a plurality of lenses. However, the lens-moving apparatus has high power consumption, and an additional cover glass needs to be provided separately from a camera module in order to protect the lens-moving apparatus, thus causing a problem in that the overall size of the conventional camera module increases. In order to solve this, studies have been conducted on a liquid lens unit, which performs auto-focusing and hand-tremor compensation functions by electrically adjusting the curvature of an interface between two types of liquids.

DISCLOSURE

Technical Problem

Embodiments may provide a camera module that ensures easy and secure electrical connection between a liquid lens unit and a main board, thus having improved reliability.

The objects to be accomplished by the embodiments are not limited to the above-mentioned objects, and other objects not mentioned herein will be clearly understood by those skilled in the art from the following description.

Technical Solution

A camera module according to an embodiment may include a liquid lens unit, a lens holder in which the liquid lens unit is disposed, a main board configured to supply a driving signal to drive the liquid lens unit, and a base disposed between the liquid lens unit and the main board and configured to transmit the driving signal output from the main board to the liquid lens unit. The base may include a body in which the lens holder is disposed, a first pillar and a second pillar protruding upwards from the body, and a first connection part and a second connection part electrically connecting the liquid lens unit to the main board.

A camera module according to another embodiment may include a liquid lens unit, a lens holder in which the liquid lens unit is disposed, a main board configured to supply a driving signal to drive the liquid lens unit, and a base disposed between the liquid lens unit and the main board and configured to transmit the driving signal output from the main board to the liquid lens unit. The base may include a body in which the lens holder is disposed, a pillar protruding upwards from the body, and a connection part disposed on one surface of the pillar.

A camera module according to still another embodiment may include a liquid lens unit, a lens holder in which the liquid lens unit is disposed, a main board configured to supply a driving signal to drive the liquid lens unit, a base disposed between the liquid lens unit and the main board and configured to transmit the driving signal output from the main board to the liquid lens unit, and a first connection substrate disposed between the liquid lens unit and the base. The base may include a body in which the lens holder is disposed and a first pillar protruding upwards from the body and including a stepped portion formed at an upper side thereof, and a portion of the first connection substrate may be disposed on the stepped portion of the first pillar.

For example, the first connection part may be disposed on one surface of the first pillar, and the second connection part may be disposed on one surface of the second pillar.

For example, the camera module may further include a second connection substrate disposed between the liquid lens unit and the base. The base may further include a second pillar protruding upwards from the body and including a stepped portion formed at an upper side thereof, and a portion of the second connection substrate may be disposed on the stepped portion of the second pillar.

For example, the stepped portion of the first pillar may include a first connection part formed on a surface thereof, the stepped portion of the second pillar may include a second connection part formed on a surface thereof, the first connection substrate may be electrically connected to the first connection part, and the second connection substrate may be electrically connected to the second connection part.

For example, the height of the stepped portion of the first pillar may be different from the height of the stepped portion of the second pillar. For example, the height of the stepped portion of the first pillar may be greater than the height of the stepped portion of the second pillar. For example, each of the first pillar and the second pillar may have a stepped surface, and the depth of the stepped surface of the first pillar and the depth of the stepped surface of the second pillar may be different from each other.

For example, the connection part may include a first connection part and a second connection part configured to electrically connect the liquid lens unit to the main board. The pillar may include a first pillar and a second pillar protruding upwards from the body. A portion of the first connection part may be formed on the first pillar, and a portion of the second connection part may be disposed on the second pillar.

For example, the liquid lens unit may include a liquid lens having first and second electrodes, a first connection substrate disposed on the liquid lens and electrically connected to the first electrode, and a second connection substrate disposed under the liquid lens and electrically connected to the second electrode. The main board may include first and second electrode pads configured to supply the driving signal. The first connection part may connect the first connection substrate to the first electrode pad, and the second connection part may connect the second connection substrate to the second electrode pad.

For example, the first and second connection parts may be disposed on a surface of the base so as to be spaced apart from each other.

For example, the camera module may further include a cover disposed so as to surround the liquid lens unit and the base, and the cover may include a first recess formed therein to expose a portion of at least one of the first or second connection part to the outside.

For example, the camera module may further include first and second lens units disposed so as to overlap the liquid lens unit in an optical-axis direction. The lens holder may accommodate the first and second lens units and the liquid lens unit disposed between the first lens unit and the second lens unit. The base may include first and second sidewalls facing each other in a first direction intersecting the optical-axis direction and third and fourth sidewalls facing each other in a second direction intersecting both the optical-axis direction and the first direction.

For example, the lens holder may include first and second openings disposed so as to face each other in the first direction. The liquid lens unit may be inserted into the first opening and the second opening in the lens holder, and the first and second connection parts may be respectively disposed on the third and fourth sidewalls.

For example, the third sidewall may include a first edge portion, which is in contact with the first sidewall, and a second edge portion, which is in contact with the second sidewall. The fourth sidewall may include a first edge portion, which is in contact with the first sidewall, and a second edge portion, which is in contact with the second sidewall. The first connection part may be disposed on the first edge portion of the third sidewall, and the second connection part may be disposed on the first edge portion of the fourth sidewall.

For example, the liquid lens unit may further include a spacer accommodating at least a portion of the liquid lens.

For example, the spacer may include an upper spacer disposed on the liquid lens and a lower spacer disposed under the liquid lens. The first connection substrate may be coupled to the upper spacer and the liquid lens, and the second connection substrate may be coupled to the lower spacer and the liquid lens.

For example, the first connection substrate may be integrally formed with the upper spacer, the second connection substrate may be integrally formed with the lower spacer, and the upper spacer and the lower spacer may be coupled to each other.

For example, the first connection substrate may be disposed on the top surface of the spacer and the top surface of the liquid lens, and the second connection substrate may be disposed on the bottom surface of the spacer and the bottom surface of the liquid lens.

Advantageous Effects

A camera module according to embodiments has the following effects.

In the case in which first and second flexible printed circuit boards, which transmit a driving voltage from a main board to a liquid lens, are bent to be directly connected to the main board, tolerance at the contact portions between the first and second flexible printed circuit boards and the main board increases due to bending of the first and second flexible printed circuit boards. However, in the embodiment, first and second connection parts of a base electrically connect first and second connection substrate, which are of a plate type, to a main board. In this case, the first and second connection substrates do not need to be bent, and thus tolerance at the contact portions between the first and second connection substrates and the base or tolerance at the contact portion between the base and the main board is smaller than that in the comparative example. As such, since the accuracy of tolerance is improved, electrical connection between the first and second connection substrates and the main board may be reliably realized.

In addition, even when the size of the main board is small, electrical contact between the first and second connection substrates and the main board is realized reliably, and thus the size of the main board (or the camera module) according to embodiments may be reduced.

In addition, even when the size of the first and second connection substrates according to embodiments is small, the first and second connection substrates are inhibited from being disconnected or separated from other components, and thus the reliability thereof is improved.

In addition, for example, since the first and second connection substrates do not need to be bent, design constraints of the first and second connection substrates according to embodiments are relaxed, and thus the freedom of design of the first and second connection substrates may be increased.

In addition, since the first and second connection substrates according to embodiments are provided with intermediate terminals, the supply of driving voltage to the liquid lens through the first and second connection substrates is easily realized during active alignment, whereby the active alignment process may be easily and accurately performed, and thus the reliability of the camera module may be improved.

In addition, when a first cover according to embodiments is coupled to a lens holder and a base, misalignment of optical axes may be inhibited.

In addition, according to embodiments, it is possible to compensate for a height difference between the liquid lens unit and the base, which may occur due to assembly tolerance or design tolerance.

However, the effects achievable through the embodiments are not limited to the above-mentioned effects, and other effects not mentioned herein will be clearly understood by those skilled in the art from the following description.

BEST MODE

Figure 1:
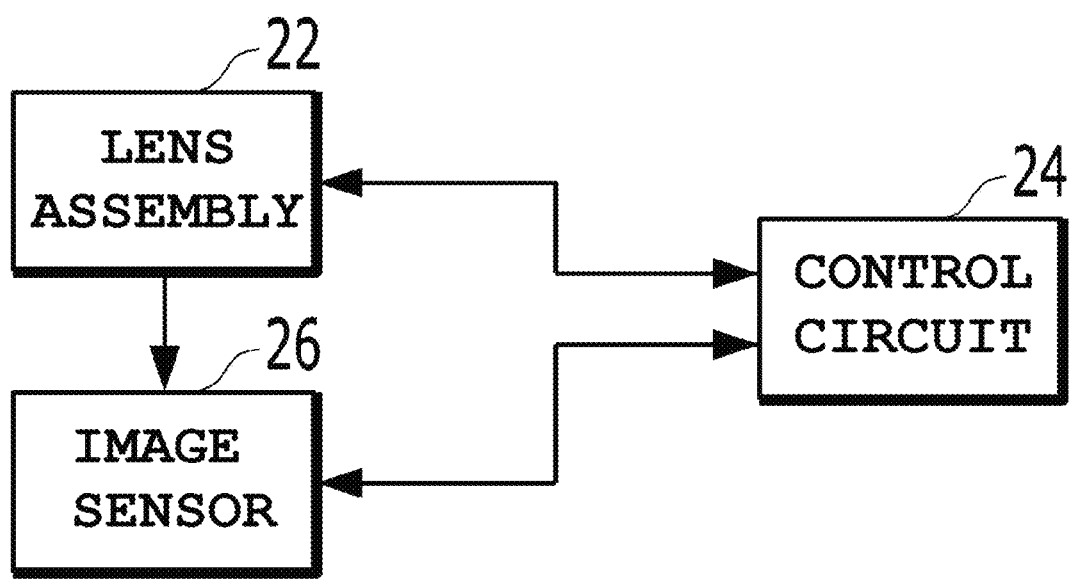
FIG. 1 illustrates a schematic block diagram of a camera module according to an embodiment.

Hereinafter, exemplary embodiments will be described in detail with reference to the accompanying drawings. While the disclosure is subject to various modifications and alternative forms, specific embodiments thereof are shown by way of example in the drawings. However, the disclosure should not be construed as being limited to the embodiments set forth herein, but on the contrary, the disclosure is to cover all modifications, equivalents, and alternatives falling within the spirit and scope of the embodiments.

It may be understood that, although the terms "first", "second", etc. may be used herein to describe various elements, these elements are not to be limited by these terms. These terms are generally only used to distinguish one element from another. In addition, terms particularly defined in consideration of the construction and operation of the embodiments are used only to describe the embodiments, but do not define the scope of the embodiments.

In the following description of the embodiments, it will be understood that, when each element is referred to as being "on" or "under" another element, it can be directly on or under the other element, or can be indirectly formed such that one or more intervening elements are also present. In addition, when an element is referred to as being "on" or "under", "under the element" as well as "on the element" may be included based on the element.

In addition, relational terms, such as "on/upper part/above" and "under/lower part/below", are used only to distinguish between one subject or element and another subject or element, without necessarily requiring or involving any physical or logical relationship or sequence between such subjects or elements.

The terms used in the present specification are used for explaining a specific exemplary embodiment, not to limit the present disclosure. Singular expressions include plural expressions unless clearly specified otherwise in context. In the specification, the terms "comprising" or "including" shall be understood to designate the presence of features, numbers, steps, operations, elements, parts, or combinations thereof, but not to preclude the presence or addition of one or more other features, numbers, steps, operations, elements, parts, or combinations thereof.

Unless otherwise defined, all terms including technical and scientific terms used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, various exemplary embodiments described herein may be combined with each other, unless specifically mentioned otherwise.

In addition, with regard to an omission in the description of any one of various exemplary embodiments, the description of other embodiments may be applied thereto, unless specifically mentioned otherwise.

Hereinafter, camera modules 100A and 100B according to embodiments will be described using the Cartesian coordinate system, but the embodiment is not limited thereto. In addition, in the Cartesian coordinate system, an x-axis, a y-axis, and a z-axis are perpendicular to each other, but the embodiment is not limited thereto. That is, the x-axis, the y-axis, and the z-axis may intersect each other obliquely, rather than being perpendicular to each other.

Hereinafter, a camera module 100A according to an embodiment will be described with reference to FIG. 1.

FIG. 1 illustrates a schematic block diagram of the camera module 100 according to an embodiment.

Referring to FIG. 1, the camera module 100 may include a lens assembly 22, a control circuit 24, and an image sensor 26.

First, the lens assembly 22 may include a plurality of lens units and a lens holder in which the plurality of lens units is accommodated. As will be described later, the plurality of lens units may include a liquid lens, and may further include a first lens unit or a second lens unit. Alternatively, the plurality of lens units may include a liquid lens unit and first and second lens units.

The control circuit 24 serves to supply a driving voltage (or an operation voltage) to the liquid lens unit.

The control circuit 24 and the image sensor 26 described above may be disposed on a single printed circuit board (PCB), but this is merely given by way of example, and the embodiment is not limited thereto.

When the camera module 100 according to the embodiment is applied to an optical device (or an optical instrument), the configuration of the control circuit 24 may be designed in different ways according to the specifications required in the optical device. In particular, the control circuit 24 may be implemented as a single chip so as to reduce the magnitude of the driving voltage applied to the lens assembly 22. Thereby, the size of an optical device, which is mounted in a portable device, may be further reduced.

The image sensor 26 may function to convert the light that has passed through the lens assembly 22 into image data. To this end, the control circuit 24 may control the image sensor 26.

Figure 2:
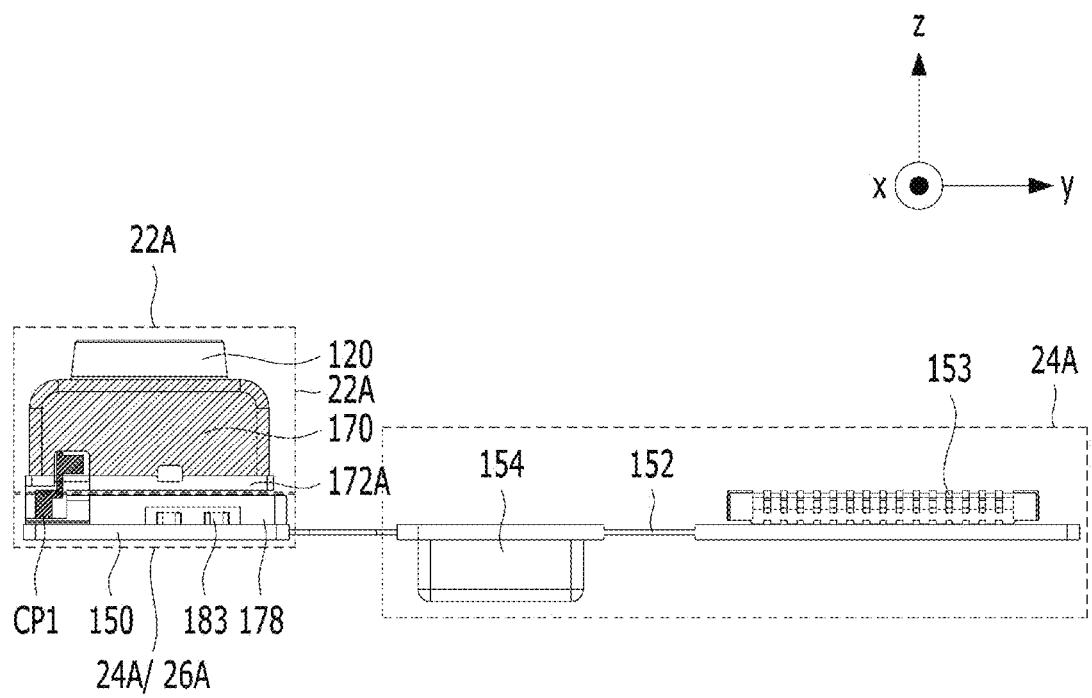
FIG. 2 illustrates a coupled cross-sectional view of an embodiment of the camera module shown in FIG. 1.
Figure 3:
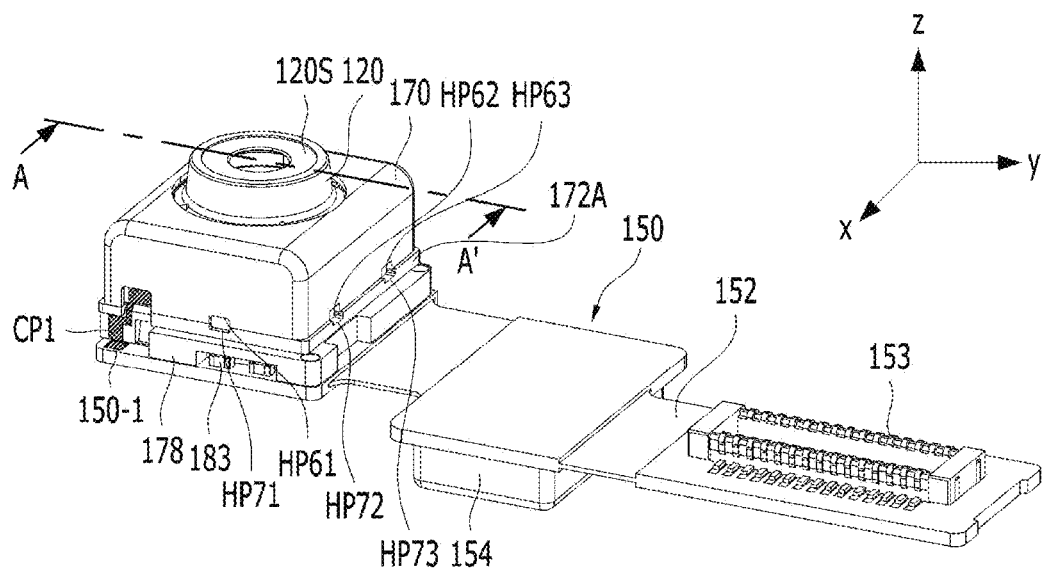
FIG. 3 illustrates a coupled perspective view of the camera module shown in FIG. 2.
Figure 4:
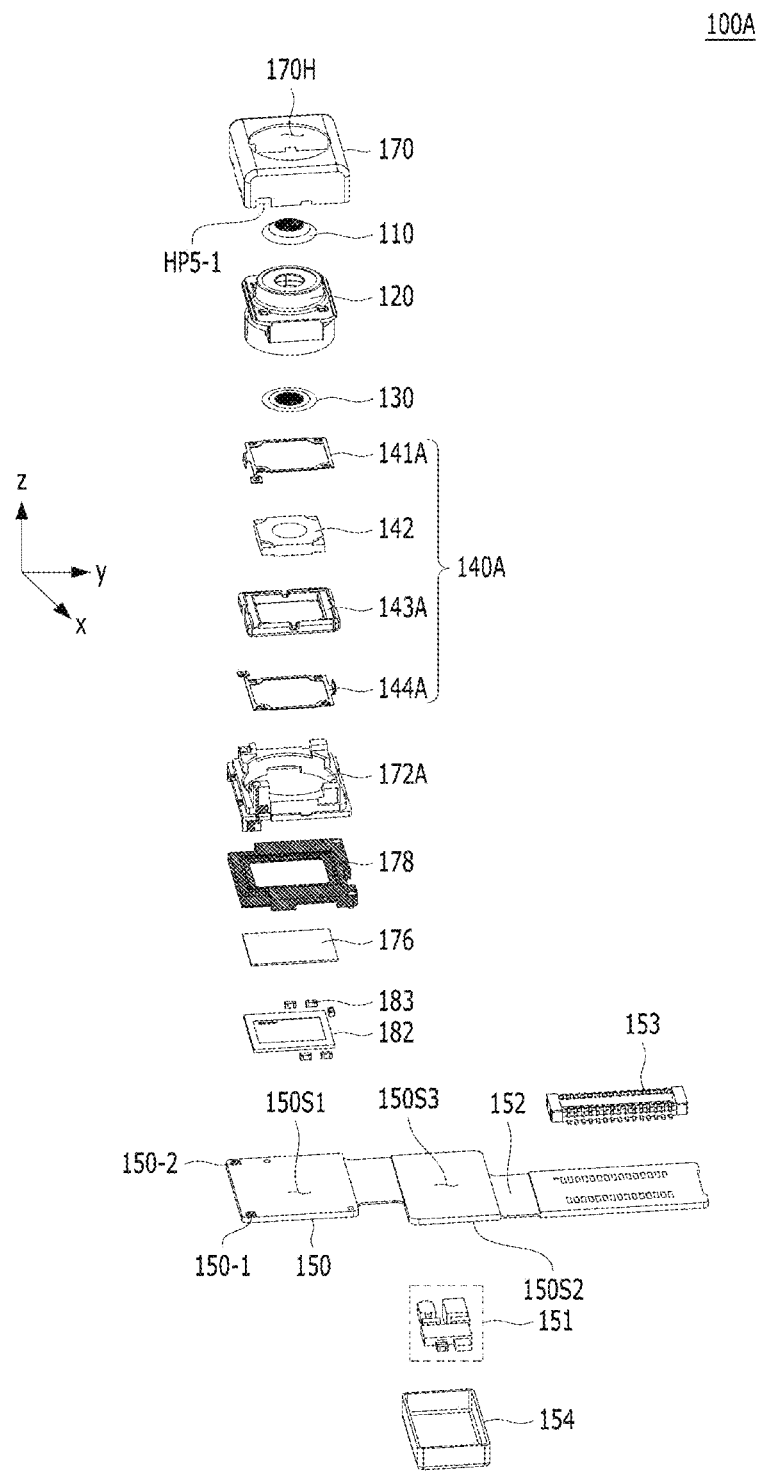
FIG. 4 illustrates an exploded perspective view of the camera module shown in FIG. 2.
Figure 5:
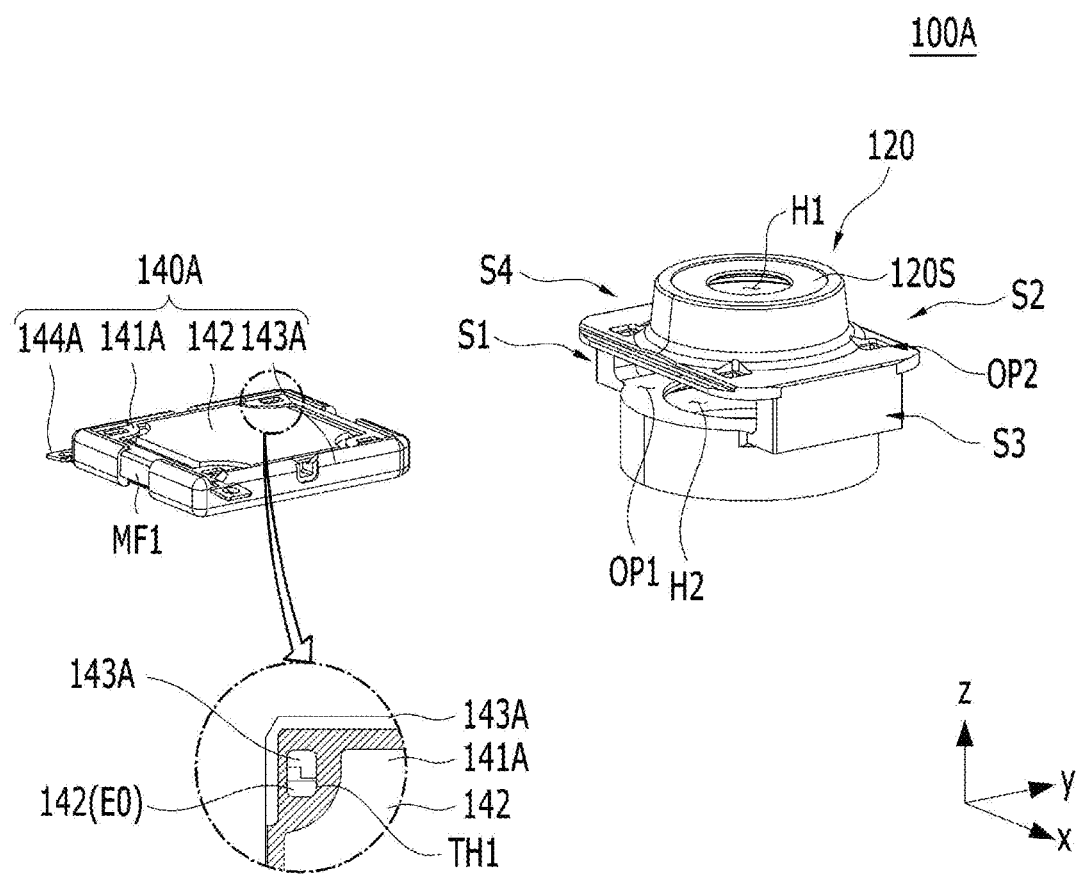
FIG. 5 illustrates an exploded perspective view of the lens holder and the liquid lens unit shown in FIG. 4.
Figure 6:
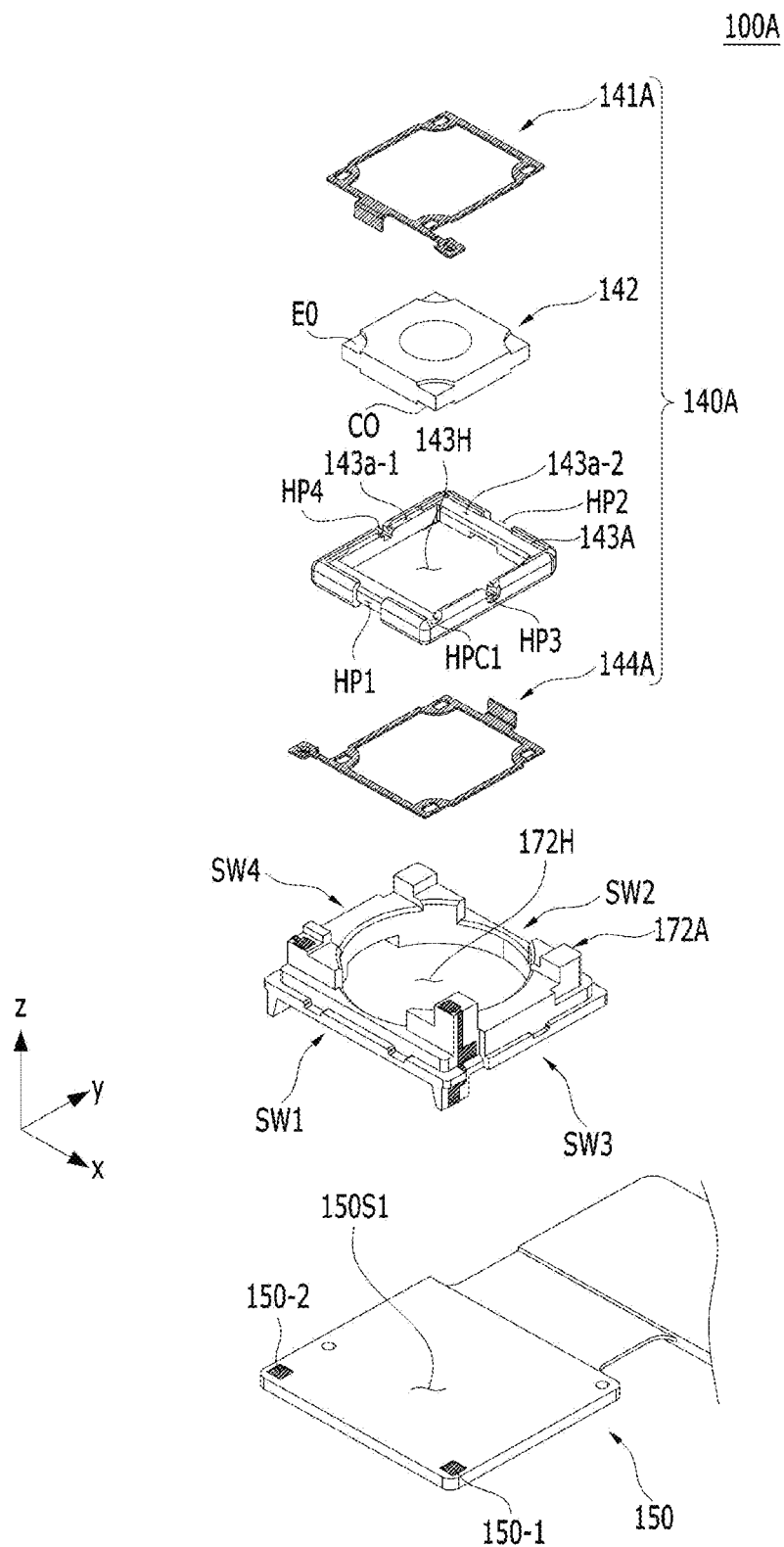
FIG. 6 illustrates an exploded perspective view of the liquid lens unit, the base, and the main board shown in FIG. 4.
Figure 7:
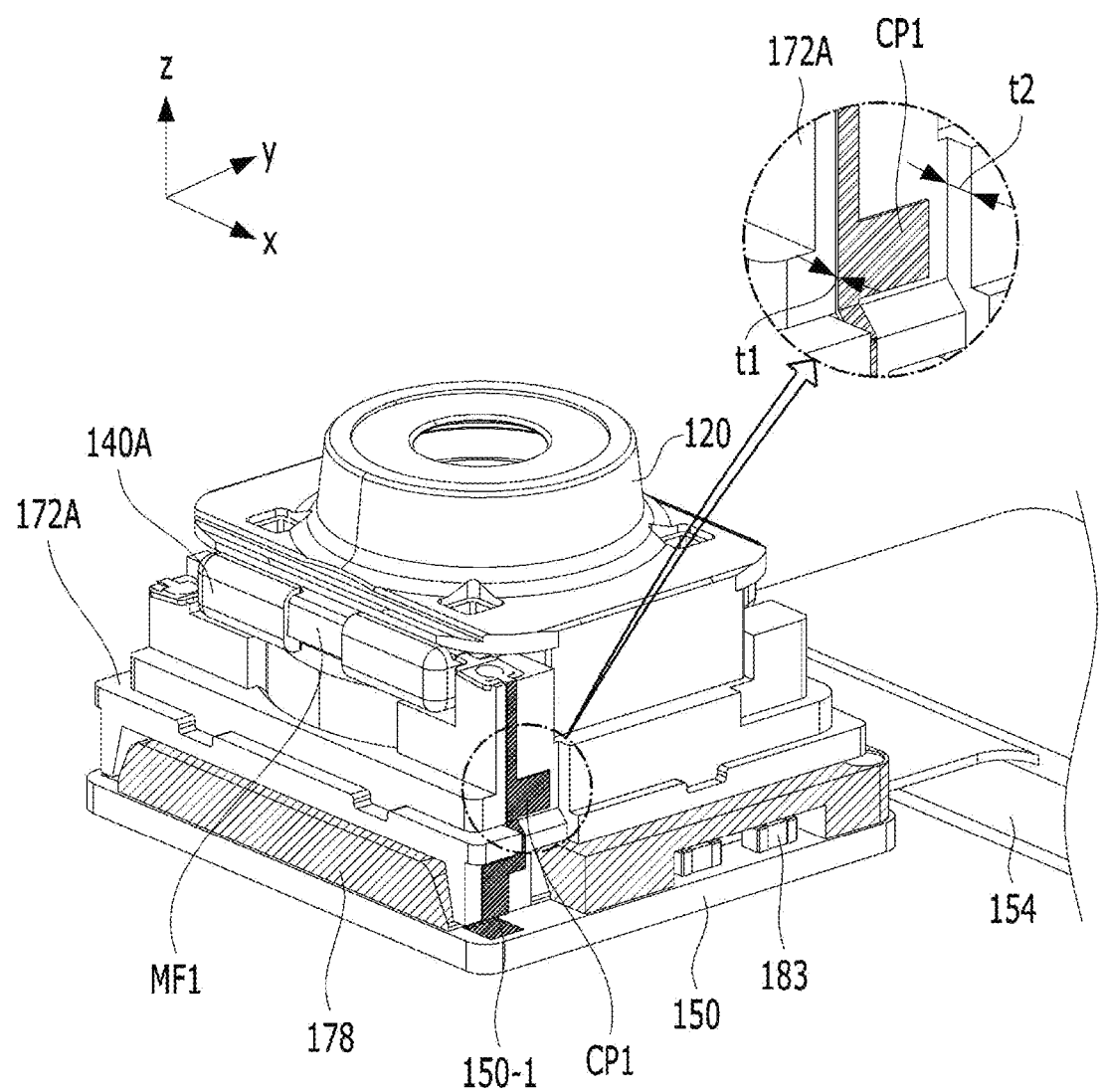
FIG. 7 illustrates a coupled perspective view of the lens holder, the liquid lens unit, the base, the sensor holder, the main board, and the second cover shown in FIG. 4.
Figure 8:
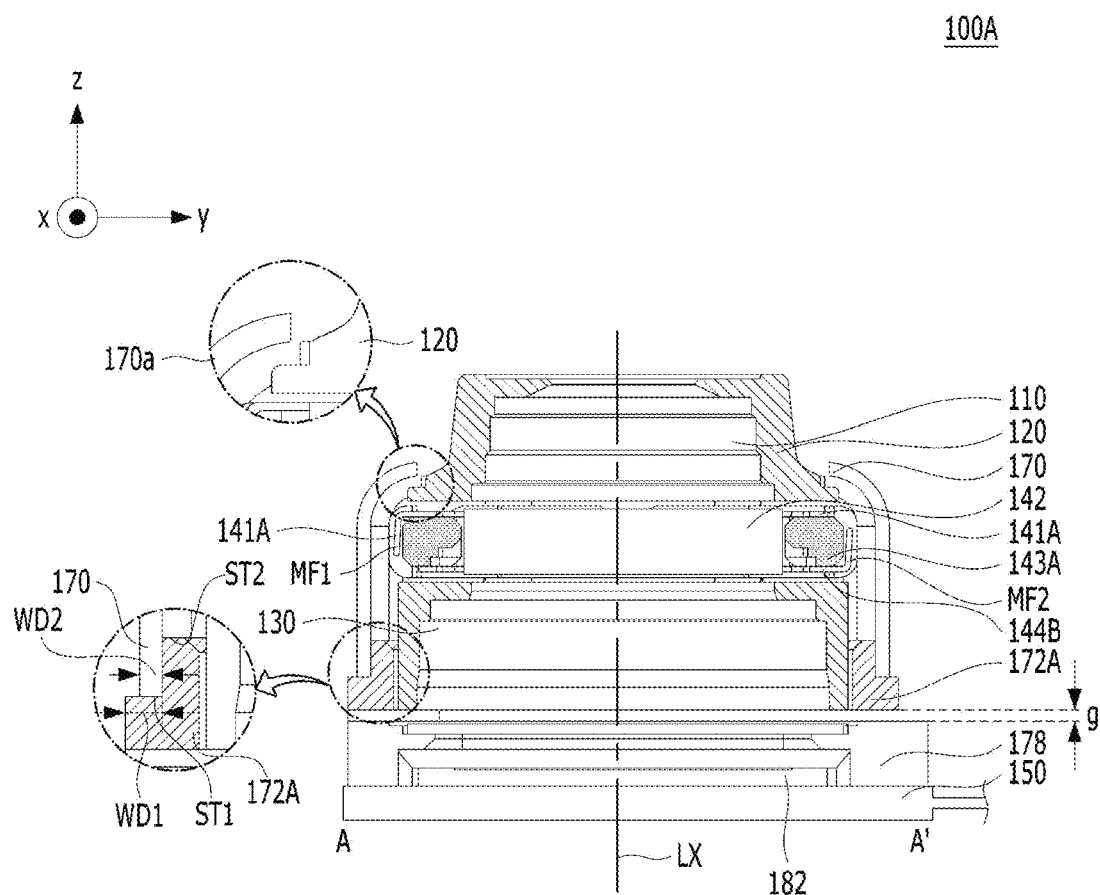
FIG. 8 illustrates a cross-sectional view of an embodiment taken along line A-A' in the camera module shown in FIG. 3.

FIG. 2 illustrates a coupled cross-sectional view of an embodiment 100A of the camera module 100 shown in FIG. 1, FIG. 3 illustrates a coupled perspective view of the camera module 100A shown in FIG. 2, FIG. 4 illustrates an exploded perspective view of the camera module 100A shown in FIG. 2, FIG. 5 illustrates an exploded perspective view of the lens holder 120 and the liquid lens unit 140A shown in FIG. 4, FIG. 6 illustrates an exploded perspective view of the liquid lens unit 140A, the base 172A, and the main board 150 shown in FIG. 4, FIG. 7 illustrates a coupled perspective view of the lens holder 120, the liquid lens unit 140A, the base 172A, the sensor holder 178, the main board 150, and the second cover 154 shown in FIG. 4, and FIG. 8 illustrates a cross-sectional view of an embodiment taken along line A-A' in the camera module 100A shown in FIG. 3.

Referring to FIGS. 2 to 8, the camera module 100A may include a lens assembly, a main board 150, a base 172A, and an image sensor 182. In addition, the camera module 100A may further include a first cover 170 and a sensor holder 178. In addition, the camera module 100A may further include a second cover 154 and a filter 176. In addition, the camera module 100A may further include a first circuit element 183.

At least one of the components 110 to 183 of the camera module 100A shown in FIGS. 2 to 8 may be omitted. Alternatively, at least one component different from the components 110 to 183 shown in FIGS. 2 to 8 may be further included in the camera module 100A.

Referring to FIGS. 2 to 8, the lens assembly may include at least one of a liquid lens unit 140A, a lens holder 120, a first lens unit 110, or a second lens unit 130, and may correspond to the lens assembly 22 shown in FIG. 1. The lens assembly may be disposed on the main board 150.

In the lens assembly, the first lens unit 110 and the second lens unit 130 may be referred to as a 'first solid lens unit' and a 'second solid lens unit', respectively, in order to be distinguished from the liquid lens unit 140A. However, the lens assembly may not include the first and second lens units 110 and 130.

The first lens unit 110 may be disposed at the upper side of the lens assembly, and may be a region on which light is incident from outside the lens assembly. That is, the first lens unit 110 may be disposed above the liquid lens unit 140A within the lens holder 120. The first lens unit 110 may be implemented as a single lens, or may be implemented as two or more lenses. In this case, two or more lenses may be aligned along a center axis to form an optical system.

Here, the center axis may be an optical axis LX of the optical system, which is formed by at least one of the first lens unit 110, the liquid lens unit 140A, or the second lens unit 130 included in the camera module 100A, or may be an axis parallel to the optical axis LX. The optical axis LX may correspond to the center axis of the image sensor 182. That is, the first lens unit 110, the liquid lens unit 140A, the second lens unit 130, and the image sensor 182 may be aligned with each other along the optical axis LX, and may be disposed so as to overlap each other through active alignment (AA).

Here, active alignment may mean an operation of aligning the optical axes of the first lens unit 110, the second lens unit 130, and the liquid lens unit 140A with each other and adjusting an axial relationship or distance relationship between the image sensor 182 and the lens units 110, 130 and 140A in order to acquire an improved image.

In an embodiment, active alignment may be performed by an operation in which the image sensor 182 generates and analyzes image data when receiving light introduced from a specific object via at least one of the first lens unit 110, the second lens unit 130, or the liquid lens unit 140A. For example, active alignment may be performed in the following sequence.

For convenience of description, it is assumed that, before active alignment is performed, the first lens unit 110 and the second lens unit 130 are mounted to the lens holder 120, and the image sensor 182 and the sensor holder 178 are mounted on the main board 150.

In one example, the lens holder 120 and the base 172A are coupled to each other. Thereafter, a master glass is placed in the lens holder 120 instead of the liquid lens unit 140A. Thereafter, the relative positions of the lens holder 120 and the image sensor 182 are adjusted while the base 172A is held by a gripper, whereby active alignment is primarily performed so as to align the optical axes of the first lens unit 110, the second lens unit 130 and the image sensor 182 with each other. Thereafter, the base 172A and the sensor holder 178 are coupled to each other. In the case in which the sensor holder 178 is omitted, the base 172A and the main board 150 are coupled to each other. Thereafter, the master glass is removed, and the liquid lens unit 140A is placed in the lens holder 120. Thereafter, the relative positions of the first lens unit 110, the second lens unit 130 and the liquid lens 142 are adjusted by supplying a driving voltage to the liquid lens 142 of the liquid lens unit 140A while a spacer 143A of the liquid lens unit 140A (or the lens holder 120) is held by the gripper, whereby active alignment is secondarily performed so as to align the optical axes of the first lens unit 110, the second lens unit 130, the liquid lens 142 and the image sensor 182 with each other. Thereafter, the first and second lens units 110 and 130 and the liquid lens unit 140A are coupled to each other.

In another example, the liquid lens unit 140A is inserted into the lens holder through a first hole and a second hole, which are formed in the lens holder 120 so as to face each other. Thereafter, a driving voltage is supplied to the liquid lens 142 of the liquid lens unit 140A through a connection part formed on the outer surface of the lens holder while the spacer 143A of the liquid lens unit 140A (or the lens holder 120) is held by the gripper, whereby active alignment is primarily performed so as to align the optical axes of the first lens unit 110, the second lens unit 130 and the liquid lens 142 with each other. Thereafter, the first and second lens units 110 and 130 and the liquid lens unit 140A are coupled to each other. Thereafter, the connection substrate of the liquid lens unit and the connection part of the lens holder are electrically connected to each other. The lens holder 120 and the base 172A are coupled to each other. Thereafter, the base 172A (or the first cover 170 or the sensor holder 178) is moved to various positions in the state of being held by the gripper, whereby active alignment is secondarily performed so as to align the center axis of the image sensor 182 and the optical axis of the lens holder 120 with each other. Thereafter, the base 172A and the sensor holder 178 are coupled to each other. In the case in which the sensor holder 178 is omitted, the base 172A and the main board 150 are coupled to each other.

Although the first lens unit 110 is illustrated in FIG. 4 as being implemented as a single lens, the first lens unit 110 may include a plurality of lenses. In addition, an exposure lens may be disposed at the upper side of the first lens unit 110. Here, the exposure lens may be the outermost lens among the lenses included in the first lens unit 110. That is, the lens located at the uppermost side of the first lens unit 110 may protrude upwards, and therefore, may function as the exposure lens. The exposure lens faces the risk of damage to the surface thereof since it protrudes outwards from the lens holder 120. When the surface of the exposure lens is damaged, the quality of an image captured by the camera module 100A may be deteriorated. Therefore, in order to inhibit or suppress damage to the surface of the exposure lens, a cover glass may be disposed, or a coating layer may be formed on the top of the exposure lens. Alternatively, in order to inhibit damage to the surface of the exposure lens, the exposure lens may be formed of a wear-resistant material having higher rigidity than the lenses of the other lens units.

In addition, the outer diameter of each of the lenses included in the first lens unit 110 may gradually increase in a direction approaching the bottom (e.g. in the −z-axis direction), but the embodiment is not limited thereto.

Referring to FIG. 5, the lens holder 120 may include first and second holes H1 and H2 and first to fourth side portions (or side surfaces) S1, S2, S3 and S4.

The first and second holes H1 and H2 may be formed respectively in the upper portion and the lower portion of the lens holder 120 to open the upper portion and the lower portion of the lens holder 120, respectively. Here, the first hole H1 and the second hole H2 may be through-holes. The first lens unit 110 may be accommodated in, mounted in, seated in, in contact with, fixed to, provisionally fixed to, supported by, coupled to, or disposed in the first hole H1, which is formed in the lens holder 120, and the second lens unit 130 may be accommodated in, mounted in, seated in, in contact with, fixed to, provisionally fixed to, supported by, coupled to, or disposed in the second hole H2, which is formed in the lens holder 120.

In addition, in the case in which the top surface of the lens holder 120 is formed to be stepped, the portion applied on a lower stepped surface 120S of the lens holder 120 may be protected from contact with the outside.

In addition, the first and second side portions S1 and S2 of the lens holder 120 may be disposed so as to face each other in a direction (e.g. the y-axis direction) perpendicular to the direction of the optical axis LX, and the third and fourth side portions S3 and S4 may be disposed so as to face each other in a direction (e.g. the x-axis direction) perpendicular to the direction of the optical axis LX. In addition, the first side portion S1 may include a first opening OP1, and the second side portion S2 may include a second opening OP2 having a shape that is the same as or similar to that of the first opening OP1. Thus, the first opening OP1 disposed in the first side portion S1 and the second opening OP2 disposed in the second side portion S2 may be disposed so as to face each other in a first direction (e.g. the y-axis direction) perpendicular to the direction of the optical axis LX.

The inner space of the lens holder 120, in which the liquid lens unit 140 is disposed, may be open due to the first and second openings OP1 and OP2. In this case, the liquid lens unit 140A may be inserted through at least one of the first opening OP1 or the second opening OP2 so as to be mounted in, seated in, in contact with, fixed to, provisionally fixed to, supported by, coupled to, or disposed in the inner space of the lens holder 120. For example, the liquid lens unit 140A may be inserted into the inner space of the lens holder 120 through the first or second opening OP1 or OP2.

As such, in order to allow the liquid lens unit 140A to be inserted into the inner space of the lens holder 120 through the first or second opening OP1 or OP2, the size of the first or second opening OP1 or OP2 in the lens holder 120 may be greater than the thickness of the liquid lens unit 140A in the direction of the optical axis LX (e.g. the z-axis direction). Alternatively, in order to allow the liquid lens unit 140A to be inserted into the inner space of the holder 120 through the first or second opening OP1 or OP2, the size of the first or second opening OP1 or OP2 in the holder 120 may be greater than the cross-sectional area of the liquid lens unit 140A when viewed from the y-axis direction.

The second lens unit 130 may be disposed below the liquid lens unit 140A within the lens holder 120. The second lens unit 130 may be spaced apart from the first lens unit 110 in the optical-axis direction (e.g. the z-axis direction).

The light incident on the first lens unit 110 from outside the camera module 100A may pass through the liquid lens unit 140A and may be incident on the second lens unit 130. The second lens unit 130 may be implemented as a single lens, or may be implemented as two or more lenses, which are aligned along the center axis to form an optical system.

Unlike the liquid lens unit 140A, each of the first lens unit 110 and the second lens unit 130 may be a solid lens formed of glass or plastic, but the embodiment is not limited as to the specific material of each of the first lens unit 110 and the second lens unit 130.

A portion of the liquid lens unit 140A may be mounted in, seated in, in contact with, fixed to, provisionally fixed to, supported by, coupled to, or disposed in the inner space between the first hole H1 and the second hole H2 in the lens holder 120 in the direction of the optical axis LX or in a direction (e.g. the z-axis direction) parallel to the direction of the optical axis LX. That is, a portion of the liquid lens unit 140A may be disposed between the first lens unit 110 and the second lens unit 130. However, the embodiment is not limited thereto. For example, according to another embodiment, the first lens unit 110 or the second lens unit 130 may be omitted, the liquid lens unit 140A may be disposed above the first lens unit 110 within the lens holder 120, or the liquid lens unit 140A may be disposed below the second lens unit 130 within the lens holder 120.

In addition, the opposite portion of the liquid lens unit 140A may be disposed in the first and second openings OP1 and OP2 in the lens holder 120. In addition, the liquid lens unit 140A may include parts protruding to the outside of at least one of the first side portion S1 or the second side portion S2 of the lens holder 120 from the first and second openings OP1 and OP2.

The liquid lens unit 140A may include a liquid lens (or a liquid lens body) 142. In addition, the liquid lens unit 140A may further include at least one substrate. Here, the at least one substrate may include at least one of a first connection substrate (or an individual electrode connection substrate) 141A or a second connection substrate (or a common electrode connection substrate) 144A. The liquid lens unit 140A may further include a spacer 143A. At least one of the first connection substrate 141A, the second connection substrate 144A, or the spacer 143A may not be included in the liquid lens unit 140A, and may be omitted.

The first connection substrate 141A and the second connection substrate 144A serve to supply a driving voltage to the liquid lens 142. As will be described later, the liquid lens 142 includes first and second electrodes, to which the driving voltage is applied. In this case, the first electrode may be electrically connected to the first connection substrate 141A, and the second electrode may be electrically connected to the second connection substrate 144A.

The first connection substrate 141A may transmit a driving voltage (hereinafter referred to as an 'individual voltage') to the liquid lens 142, and the second connection substrate 144A may transmit a driving voltage (hereinafter referred to as a 'common voltage') to the liquid lens 142. The common voltage may include DC voltage or AC voltage. When the common voltage is applied in the form of a pulse, the width or duty cycle of the pulse may be constant. The individual voltage supplied through the first connection substrate 141A may be applied to a plurality of electrode sectors of the first electrode, which are exposed from the respective corners of the liquid lens 142.

According to the embodiment, the first connection substrate 141A electrically connects a sector EO of a first electrode included in the liquid lens 142 to a first connection part CP1 of the base 172A. To this end, the first connection substrate 141A may be disposed on the top surface of the spacer 143A and the top surface of the liquid lens 142. The first connection substrate 141A may be electrically connected to the sector EO of the first electrode, and may be electrically connected to the main board 150 via the first connection part CP1 of the base 172A.

For example, the first connection substrate 141A may be implemented as a flexible printed circuit board (FPCB), but the embodiment is not limited thereto. According to another embodiment, the first connection substrate 141A may be a plate, and the plate may be made of metal.

Figure 9A:
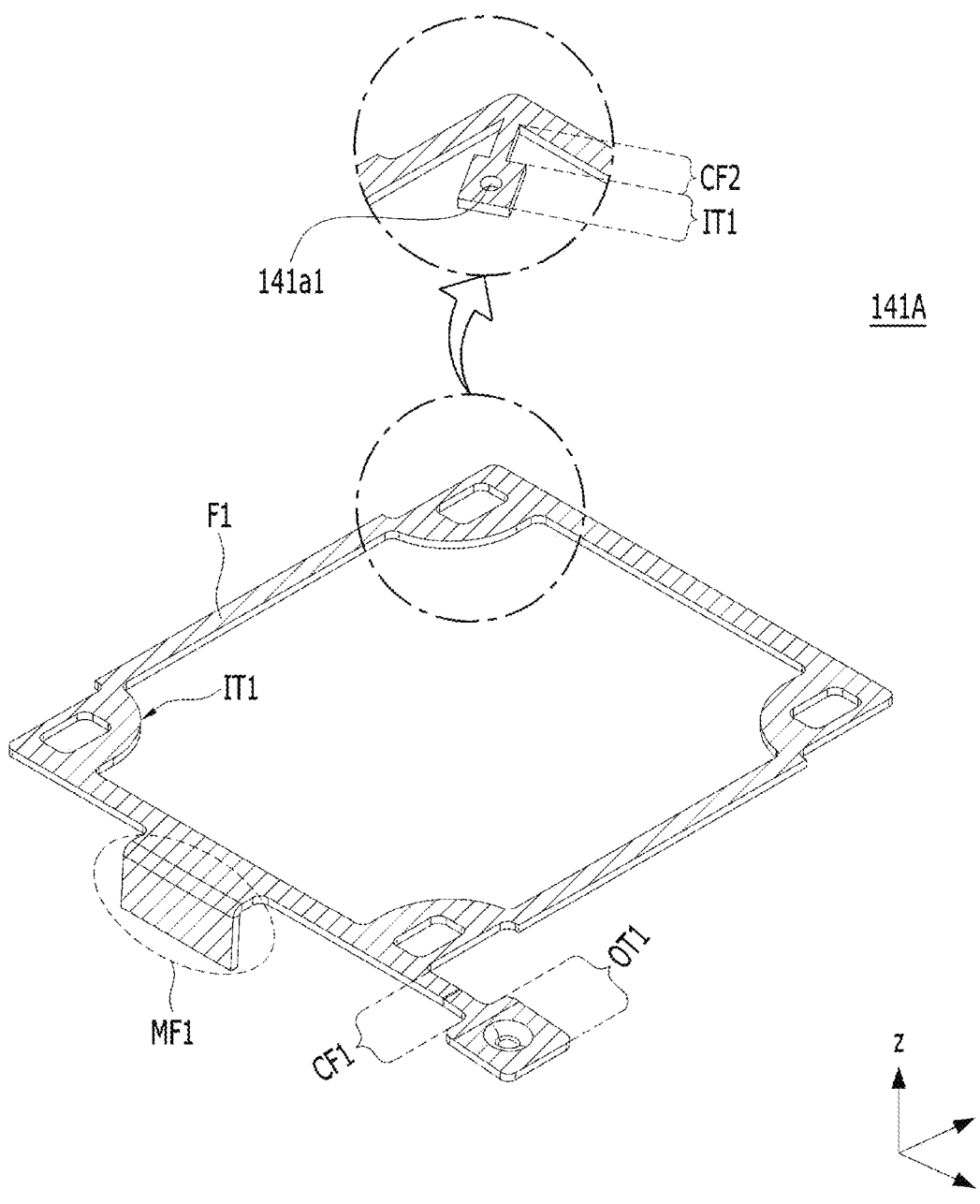
FIGS. 9A to 9C illustrate a perspective view, a plan view, and a cross-sectional view, respectively, of a first connection substrate according to an embodiment.
Figure 9B:
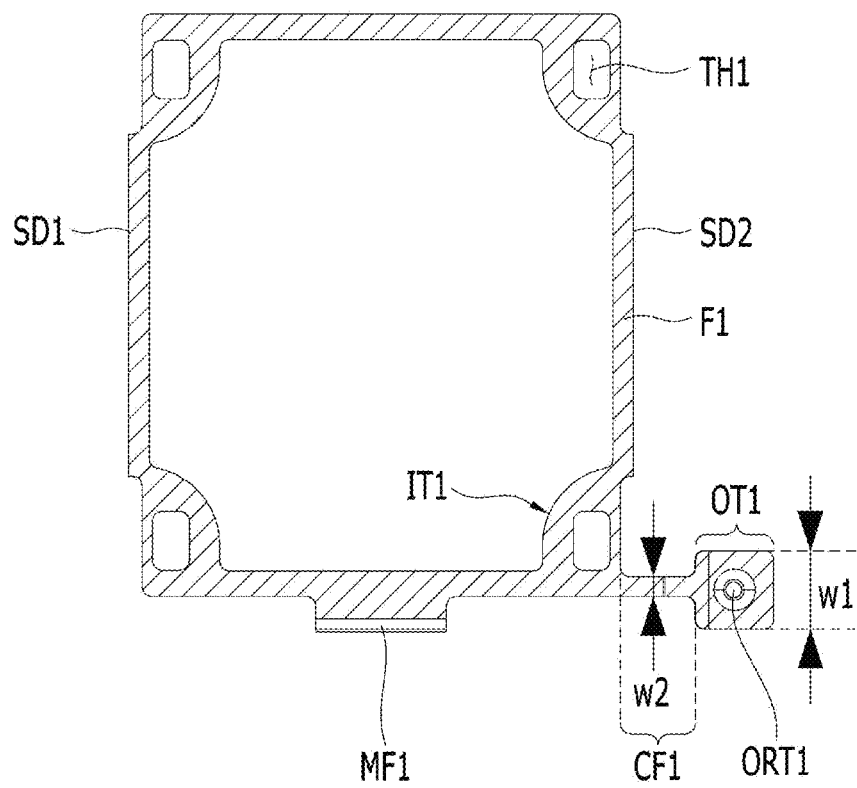
Figure 9C:
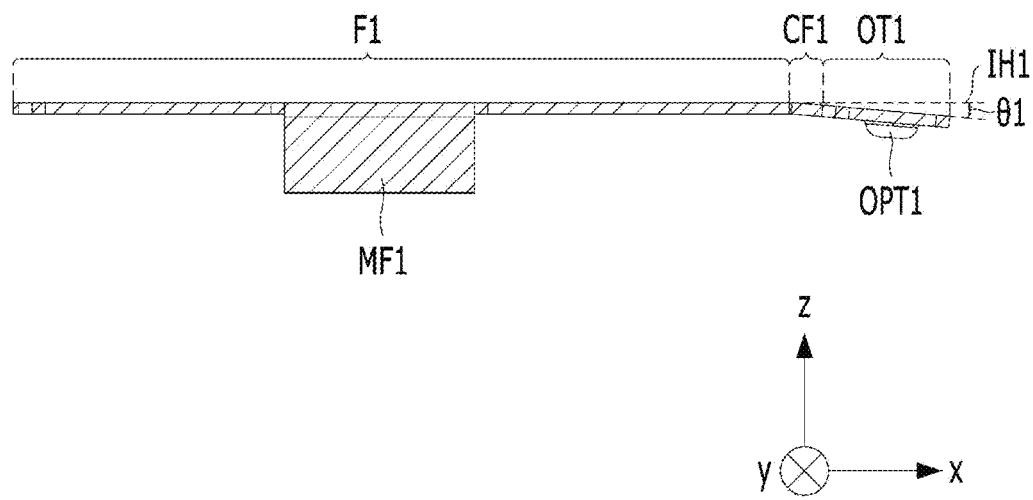

FIGS. 9A to 9C illustrate a perspective view, a plan view, and a cross-sectional view, respectively, of a first connection substrate 141A according to an embodiment. The configuration depicted within the circular dotted line in FIG. 9A illustrates another embodiment of the first connection substrate 141A.

Referring to FIGS. 9A to 9C, the first connection substrate 141A may include a first frame F1, a first inner terminal IT1, a first outer terminal OT1, and a first connection frame CF1.

The first frame F1 is a portion that is attached or coupled to the spacer 143A. To this end, the spacer 143A may include 1-1$^{st}$ seating grooves 143a-1, which are formed at positions corresponding to outer sides SD1 and SD2 of the first frame F1 that protrude further outwards in the x-axis direction than the edge of the first frame F1, among the outer sides of the first frame F1. In addition, the spacer 143A may further include 1-2$^{nd}$ seating grooves 143a-2, which are formed at positions corresponding to two opposite outer sides of the first frame F1 that face each other in the y-axis direction, among the outer sides of the first frame F1. Thus, the two opposite outer sides of the first frame F1 that face each other in the y-axis direction may be seated in the 1-2$^{nd}$ seating grooves 143a-2.

The first inner terminal IT1 is a portion that is electrically connected to the sector EO of the first electrode included in the liquid lens 142. As shown in FIG. 6, the sectors EO of the first electrodes of the liquid lens 142 are disposed at the four edges (or corners) of the upper side of the liquid lens 142. Thus, the first inner terminals IT1 may be disposed at the inner edges (or corners) of the first frame F1 so as to face the plurality of sectors EO to thus be connected to the plurality of sectors EO.

Each of the plurality of first inner terminals IT1 may include therein a first through-hole TH1. The first inner terminal IT1 of the first connection substrate 141A may be electrically connected to the sector EO of the first electrode of the liquid lens 142 through the first through-hole TH1. In FIG. 5, the planar shape of the first through-hole TH1 is illustrated within the circular dotted line in an enlarged manner. Referring to this, it can be seen that the first through-hole TH1 overlaps the sector EO of the first electrode of the liquid lens 142 and the spacer 143A in a vertical direction. Thus, when a conductive material, e.g. conductive epoxy, is charged in the first through-hole TH1, the first inner terminal IT1 and the sector EO of the first electrode may be in contact with, coupled to, and electrically connected to each other.

The first outer terminal OT1 is a portion that is connected to the first connection part CP1 of the base 172A, which will be described later. Referring to FIG. 9C, the first outer terminal OT1 may include a first outer protruding portion OPT1 protruding in a direction oriented toward the first connection part CP1 of the base 172A.

The first outer protruding portion OPT1 has a shape protruding from the bottom surface of the first outer terminal OT1. As shown in FIG. 9B, the top surface of the first outer terminal OT1 may have a concave shape ORT1. For example, when the top surface of the first outer terminal OT1 is pressed through press processing, the first outer protruding portion OPT1 and the concave shape ORT1 may be formed at the same time.

The first outer protruding portion OPT1 is a portion that is electrically connected to the first connection part CP1 of the base 172A. Thus, when the first outer terminal OT1 includes the first outer protruding portion OPT1, the first outer terminal OT1 may be stably electrically connected to the first connection part CP1 of the base 172A.

In addition, the first outer terminal OT1 may be formed so as to be bent at an incline of a first predetermined angle θ1 in a direction oriented toward the first connection part CP1 from an imaginary first horizontal plane IH1 extending from the top surface of the first frame F1. As such, when the first outer terminal OT1 is formed to be inclined toward the first connection part CP1, the first outer terminal OT1 may be more stably electrically connected to the first connection part CP1 of the base 172A.

The first connection frame CF1 extends outwards from the outer side of the first frame F1, and serves to electrically connect the first frame F1 and the first outer terminal OT1 to each other. The first width w1 of the first outer terminal OT1 may be greater than the second width w2 of the first connection frame CF1. The reason for this is that, when the first width w1 of the first outer terminal OT1 increases, the contact area between the first outer terminal OT1 and the first connection part CP1 increases, thus enabling more stable electrical connection of the first outer terminal OT1 to the first connection part CP1.

If the first connection frame CF1 is not elastic, the first connection frame CF1 may be damaged when the bottom surface of the first outer terminal OT1 (or the first outer protruding portion OPT1) is brought into contact with the first connection part CP1. In order to inhibit this, the first connection frame CF1 may be formed to be elastic.

Further, in the case in which the second width w2 of the first connection frame CF1 is less than the first width w1 of the first outer terminal OT1, the first connection frame CF1 may be made elastic when the first outer terminal OT1 is brought into contact with the first connection part CP1.

Referring to FIGS. 9A to 9C, the first inner terminal IT1 is illustrated as being directly connected to the first frame F1. However, the embodiment is not limited thereto.

A first connection substrate 141A according to another embodiment will now be described with reference to the illustration made within the circular dotted line in FIG. 9A.

The first connection substrate 141A according to another embodiment may further include a second connection frame CF2. The second connection frame CF2 extends inwards from the inner side of the first frame F1, and serves to electrically connect the first inner terminal IT1 and the first frame F1 to each other.

The width of the first inner terminal IT1 may be greater than the width of the second connection frame CF2. The reason for this is that, when the width of the first inner terminal IT1 increases, the contact area between the first inner terminal IT1 and the sector EO of the first electrode increases, thus enabling more stable electrical connection of the first inner terminal IT1 to the first electrode.

In addition, the first inner terminal IT1 is a portion that is connected to the first electrode of the liquid lens 142. Referring to the illustration made within the circular dotted line in FIG. 9A, the same as or similar to the shape of the first outer terminal OT1, the first inner terminal IT1 may include a first inner protruding portion 141a1 protruding from the bottom surface of the first inner terminal IT1 in a direction oriented toward the sector EO of the first electrode of the liquid lens 142.

The top surface of the first inner terminal IT1 shown in FIG. 9A may have a concave shape 141a1. For example, when the top surface of the first inner terminal IT1 is pressed through press processing, the first inner protruding portion and the concave shape ORT1 may be formed at the same time.

The first inner protruding portion 141a1 is a portion that is electrically connected to the sector EO of the first electrode of the liquid lens 142. Thus, when the first inner terminal IT1 includes the first inner protruding portion 141a1, the first inner terminal IT1 may be stably electrically connected to the first electrode of the liquid lens 142.

In addition, the same as or similar to the shape of the first outer terminal OT1, the first inner terminal IT1 may be formed at an incline of a predetermined angle in a direction oriented toward the segment EO of the first electrode from the imaginary first horizontal plane IH1. As such, when the first inner terminal IT1 is formed to be inclined toward the sector EO of the first electrode, the first inner terminal IT1 may be more stably electrically connected to the first electrode of the liquid lens 142.

In addition, since the first inner protruding portion 141a1 is electrically connected to the sector EO of the first electrode, the first through-hole TH1 in the first inner terminal IT1 may be omitted.

Alternatively, the first inner terminal IT1 may not include the first inner protruding portion 141a1, but may include only a through-hole having the same shape as the first through-hole TH1.

Alternatively, the first inner terminal IT1 may include both the first inner protruding portion 141a1 and the through-hole. That is, the through-hole may be formed in the first inner protruding portion 141a1. When a conductive material, e.g. conductive epoxy, is charged in this through-hole, the first inner terminal IT1 and the sector EO of the first electrode may be in contact with, coupled to, and electrically connected to each other more securely.

In addition, if the second connection frame CF2 is not elastic, the second connection frame CF2 may be damaged when the bottom surface of the first inner terminal IT1 (or the first inner protruding portion 141a) is brought into contact with the sector EO of the first electrode. In order to inhibit this, the second connection frame CF2 may be formed to be elastic.

In addition, in the case in which the width of the second connection frame CF2 is less than the width of the first inner terminal IT1, the second connection frame CF2 may be made elastic when the first inner terminal IT1 is brought into contact with the sector EO of the first electrode.

In addition, the first connection substrate 141A may further include a first intermediate terminal MF1. The first intermediate terminal MF1 may be formed to be bent downwards (e.g. the −z-axis direction) from the first frame F1. Alternatively, the first intermediate terminal MF1 may be formed to protrude from the outer side of the first frame F1 and then to be bent downwards (e.g. the −z-axis direction). For example, the first intermediate terminal MF1 may protrude from the side portion of the first frame F1. However, the embodiment is not limited thereto. The first intermediate terminal MF1 may be exposed to the outside through a first recess HP1 in the spacer 143A, which will be described later.

Meanwhile, the second connection substrate 144A electrically connects the sector CO of the second electrode included in the liquid lens 142 to a second connection part CP2 of the base 172A. To this end, the second connection substrate 144A may be disposed on the bottom surface of the spacer 143A and on the bottom surface of the liquid lens 142. The second connection substrate 144A is directly connected to the sector CO of the second electrode. However, as will be described later, the second connection substrate 144A may be connected to the main board 150 via the second connection part CP2 of the base 172A.

For example, the second connection substrate 144 may be implemented as an FPCB or a single metal substrate (a conductive metal plate). In another embodiment, the second connection substrate 144A may be a plate, and the plate may be made of metal.

Figure 10A:
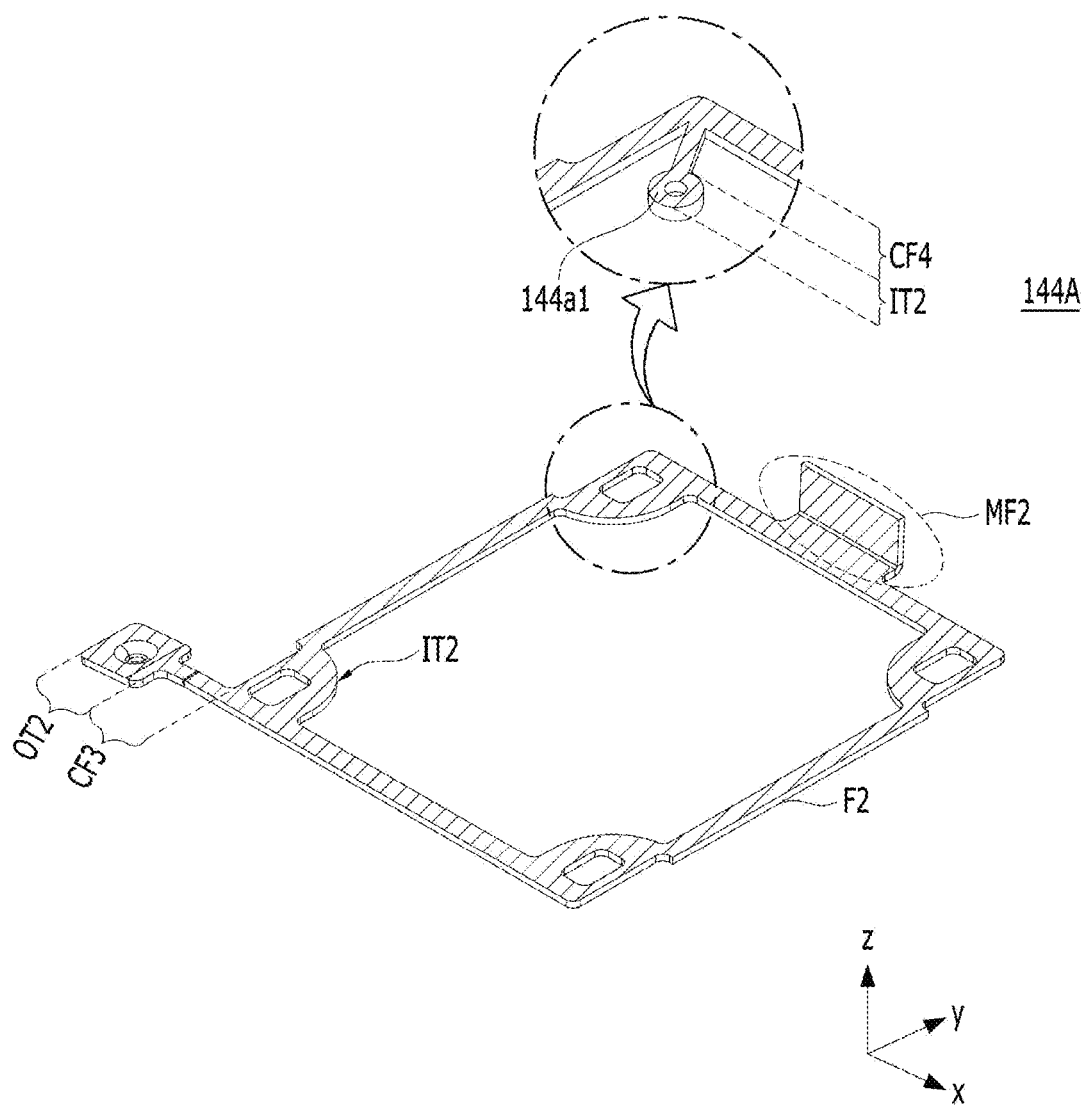
FIGS. 10A to 10C illustrate a perspective view, a plan view, and a cross-sectional view, respectively, of a second connection substrate according to an embodiment.
Figure 10B:
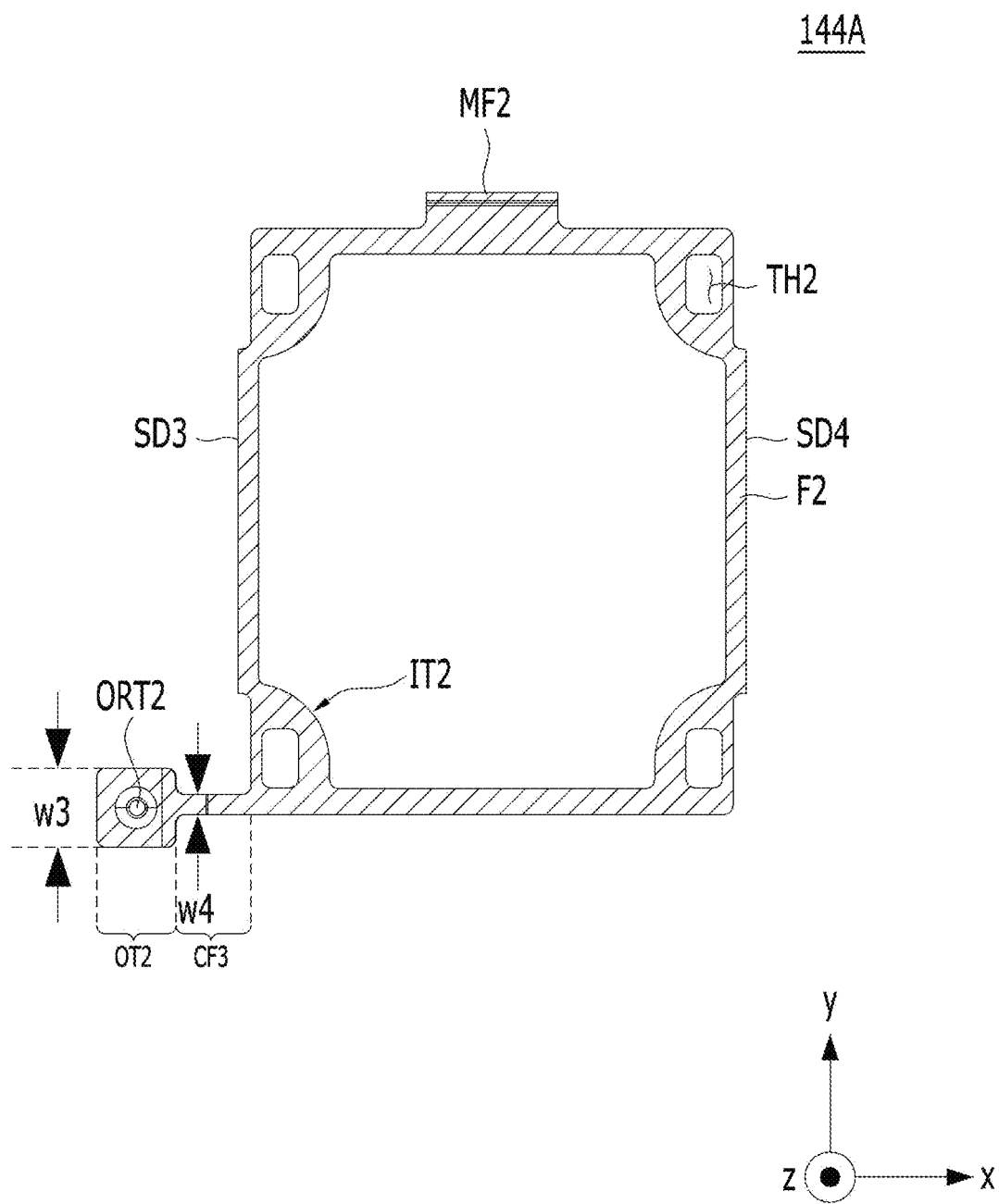
Figure 10C:
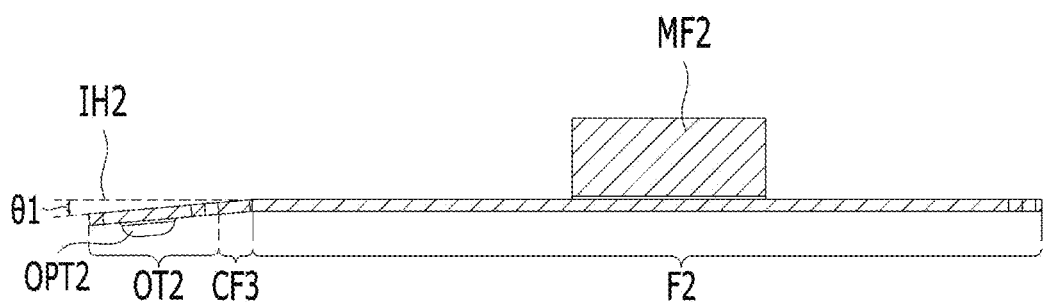

FIGS. 10A to 10C illustrate a perspective view, a plan view, and a cross-sectional view, respectively, of a second connection substrate 144A according to another embodiment. The configuration depicted within the circular dotted line in FIG. 10A illustrates another embodiment.

Referring to FIGS. 10A to 10C, the second connection substrate 144A may include a second frame F2, a second inner terminal IT2, a second outer terminal OT2, and a third connection frame CF3.

The second frame F2 is a portion that is attached or coupled to the spacer 143A. To this end, the spacer 143A may include second seating grooves (not shown), which are formed at positions corresponding to outer sides SD3 and SD4 of the second frame F2 that protrude further outwards in the x-axis direction than the edge of the second frame F2, among the outer sides of the second frame F2. First seating grooves 143a-1 and 143a-2 may be formed in the top surface of the inner side of the spacer 143A, and the second seating grooves may be formed in the bottom surface of the inner side of the spacer 143A opposite the first seating grooves 143a-1 and 143a-2 so as to have the same shape as the first seating grooves 143a-1 and 143a-2.

The second inner terminal IT2 is a portion that is electrically connected to the sector CO of the second electrode of the liquid lens 142. In the case in which the sectors CO of the second electrodes of the liquid lens 142 are disposed at the four corners of the lower side of the liquid lens 142, the second inner terminals IT2 may be disposed at the inner corners of the second frame F2 so as to face the sectors CO of the second electrode and thus to be connected to the sectors CO of the second electrode.

Each of the plurality of second inner terminals IT2 may include therein a second through-hole TH2. The second inner terminal IT2 of the second connection substrate 144A may be electrically connected to the sector CO of the second electrode of the liquid lens 142 through the second through-hole TH2. For example, when conductive epoxy is charged in the second through-hole TH2, the second inner terminal IT2 and the sector CO of the second electrode may be in contact with, coupled to, and electrically connected to each other.

The second outer terminal OT2 is a portion that is connected to the second connection part CP2 of the base 172A, which will be described later. Referring to FIG. 10C, the second outer terminal OT2 may include a second outer protruding portion OPT2 protruding in a direction oriented toward the second connection part CP2 of the base 172A.

The second outer protruding portion OPT2 has a shape protruding from the bottom surface of the second outer terminal OT2. As shown in FIG. 10B, the top surface of the second outer terminal OT2 may have a concave shape ORT2. For example, when the top surface of the second outer terminal OT2 is pressed through press processing, the second outer protruding portion OPT2 and the concave shape ORT2 may be formed at the same time.

The second outer protruding portion OPT2 is a portion that is electrically connected to the second connection part CP2 of the base 172A. Thus, when the second outer terminal OT2 includes the second outer protruding portion OPT2, the second outer terminal OT2 may be stably electrically connected to the second connection part CP2 of the base 172A.

In addition, the second outer terminal OT2 may be formed so as to be bent at an incline of a second predetermined angle θ2 in a direction oriented toward the second connection part CP2 from an imaginary second horizontal plane IH2 extending from the top surface of the second frame F2. As such, when the second outer terminal OT2 is formed to be inclined toward the second connection part CP2, the second outer terminal OT2 may be more stably electrically connected to the second connection part CP2 of the base 172A.

The third connection frame CF3 extends outwards from the outer side of the second frame F2, and serves to electrically connect the second frame F2 and the second outer terminal OT2 to each other. The third width w3 of the second outer terminal OT2 may be greater than the fourth width w4 of the third connection frame CF3. The reason for this is that, when the third width w3 of the second outer terminal OT2 increases, the contact area between the second outer terminal OT2 and the second connection part CP2 increases, thus enabling more stable electrical connection of the second outer terminal OT2 to the second connection part CP2.

If the third connection frame CF3 is not elastic, the third connection frame CF3 may be damaged when the bottom surface of the second outer terminal OT2 (or the second outer protruding portion OPT2) is brought into contact with the second connection part CP2. In order to inhibit this, the third connection frame CF3 may be formed to be elastic.

Further, in the case in which the fourth width w4 of the third connection frame CF3 is less than the third width w3 of the second outer terminal OT2, the third connection frame CF3 may be made elastic when the second outer terminal OT2 is brought into contact with the second connection part CP2.

Referring to FIGS. 10A to 10C, the second inner terminal IT2 is illustrated as being directly connected to the second frame F2. However, the embodiment is not limited thereto.

A second connection substrate 144A according to another embodiment will now be described with reference to the illustration within the circular dotted line in FIG. 10A.

The second connection substrate 144A according to another embodiment may further include a fourth connection frame CF4. The fourth connection frame CF4 extends inwards from the inner side of the second frame F2, and serves to electrically connect the second inner terminal IT2 and the second frame F2 to each other.

In addition, the width of the second inner terminal IT2 may be greater than the width of the fourth connection frame CF4. The reason for this is that, when the width of the second inner terminal IT2 increases, the contact area between the second inner terminal IT2 and the sector CO of the second electrode increases, thus enabling more stable electrical connection of the second inner terminal IT2 to the second electrode.

In addition, the second inner terminal IT2 is a portion that is connected to the second electrode of the liquid lens 142. The second inner terminal IT2 may include a second inner protruding portion (not shown) protruding from the top surface of the second inner terminal IT2 in an upward direction (the +z-axis direction) oriented toward the sector CO of the second electrode of the liquid lens 142. In this case, the bottom surface of the second inner terminal IT2 may have a concave shape. For example, when the bottom surface of the second inner terminal IT2 is pressed through press processing, the second inner protruding portion and the concave shape may be formed at the same time.

The second inner protruding portion is a portion that is electrically connected to the sector EO of the second electrode of the liquid lens 142. Thus, when the second inner terminal IT2 includes the second inner protruding portion, the second inner terminal IT2 may be stably electrically connected to the second electrode of the liquid lens 142.

In addition, the second inner terminal IT2 may be formed at an incline of a predetermined angle in a direction oriented toward the sector CO of the second electrode from an imaginary horizontal plane (not shown) extending from the second frame F2. In this case, the second outer terminal OT2 may be inclined in a downward direction (e.g. the −z-axis direction), and the second inner terminal IT2 may be inclined in an upward direction (e.g. the +z-axis direction).

As such, when the second inner terminal IT2 is formed to be inclined toward the sector CO of the second electrode, the second inner terminal IT2 may be more stably electrically connected to the second electrode of the liquid lens 142.

In addition, since the second inner protruding portion is electrically connected to the sector CO of the second electrode, the second through-hole TH2 in the second inner terminal IT2 may be omitted.

Alternatively, the second inner terminal IT2 may not include the second inner protruding portion, but may include only a through-hole 144a1 having the same shape as the first through-hole TH1.

Alternatively, the second inner terminal IT2 may include both the second inner protruding portion and the through-hole 144a1. That is, the through-hole 141a1 may be formed in the second inner protruding portion. When a conductive material, e.g. conductive epoxy, is charged in this through-hole 141a1, the second inner terminal IT2 and the sector CO of the second electrode may be in contact with, coupled to, and electrically connected to each other more securely.

In addition, if the fourth connection frame CF4 is not elastic, the fourth connection frame CF4 may be damaged when the top surface of the second inner terminal IT2 (or the second inner protruding portion) is brought into contact with the sector CO of the second electrode. In order to inhibit this, the fourth connection frame CF4 may be formed to be elastic.

In the case in which the width of the fourth connection frame CF4 is less than the width of the second inner terminal IT2, the fourth connection frame CF4 may be made elastic when the second inner terminal IT2 is brought into contact with the sector CO of the second electrode.

In addition, in the case in which there is a difference in height between the liquid lens unit 140A and the base 172A due to assembly tolerance or design tolerance, this height difference may be compensated for by at least one of the first, second, third or fourth connection frame CF1, CF2, CF3 or CF4, which is elastic.

In addition, according to the embodiment, the first connection substrate 141A may further include the second connection frame CF2, or the second connection substrate 144A may further include the fourth connection frame CF4, depending on the processing sequence.

For example, in the case in which the second connection substrate 144A and the spacer 143A are coupled to each other, and thereafter, the first connection substrate 141A is coupled to the tops of the liquid lens 142 and the spacer 143A, the first connection substrate 141A may include the second connection frame CF2, and the fourth connection frame CF4 may be omitted. The reason for this is to compensate for a height difference, if any, between the top surface of the spacer 143A and the bottom surface of the first connection substrate 141A using the second connection frame CF2.

Alternatively, in the case in which the first connection substrate 141A and the spacer 143A are coupled to each other and thereafter the second connection substrate 144A is coupled to the bottoms of the liquid lens 142 and the spacer 143A, the second connection substrate 144A may include the fourth connection frame CF4. The reason for this is to compensate for a height difference, if any, between the bottom surface of the spacer 143A and the top surface of the second connection substrate 144A using the fourth connection frame CF4.

In addition, the second connection substrate 144A may further include a second intermediate terminal MF2. The second intermediate terminal MF2 may be formed to be bent upwards (e.g. the +z-axis direction) from the second frame F2. Alternatively, the second intermediate terminal MF1 may be formed to protrude from the outer side of the second frame F2 and then to be bent upwards (e.g. the +z-axis direction). For example, the second intermediate terminal MF2 may protrude from the side portion of the second frame F2. However, the embodiment is not limited thereto. The second intermediate terminal MF2 may be exposed to the outside through a second recess HP2 in the spacer 143A, which will be described later.

Although the above embodiment has been described as being configured such that the first intermediate terminal MF1 is bent downwards and the second intermediate terminal MF2 is bent upwards, the embodiment is not limited as to the specific direction in which the first and second intermediate terminals MF1 and MF2 are bent. That is, according to another embodiment, the first intermediate terminal MF1 may be bent upwards, and the second intermediate terminal MF2 may be bent downwards.

When active alignment is performed, a driving voltage may be supplied to the liquid lens 142 through the first and second intermediate terminals MF1 and MF2. To this end, the spacer 143A has therein first and second recesses HP1 and HP2, which respectively expose the first and second intermediate terminals MF1 and MF2. In this case, the first and second recesses HP1 and HP2 may be disposed in the direction (e.g. the y-axis direction) in which the liquid lens unit 140A is fitted into the lens holder 120. The reason for this is to facilitate the supply of the driving voltage to the liquid lens 142 and to allow the spacer 143A to be easily held by the gripper during the active alignment process.

Hereinafter, the liquid lens 142 will be described.

Figure 11:
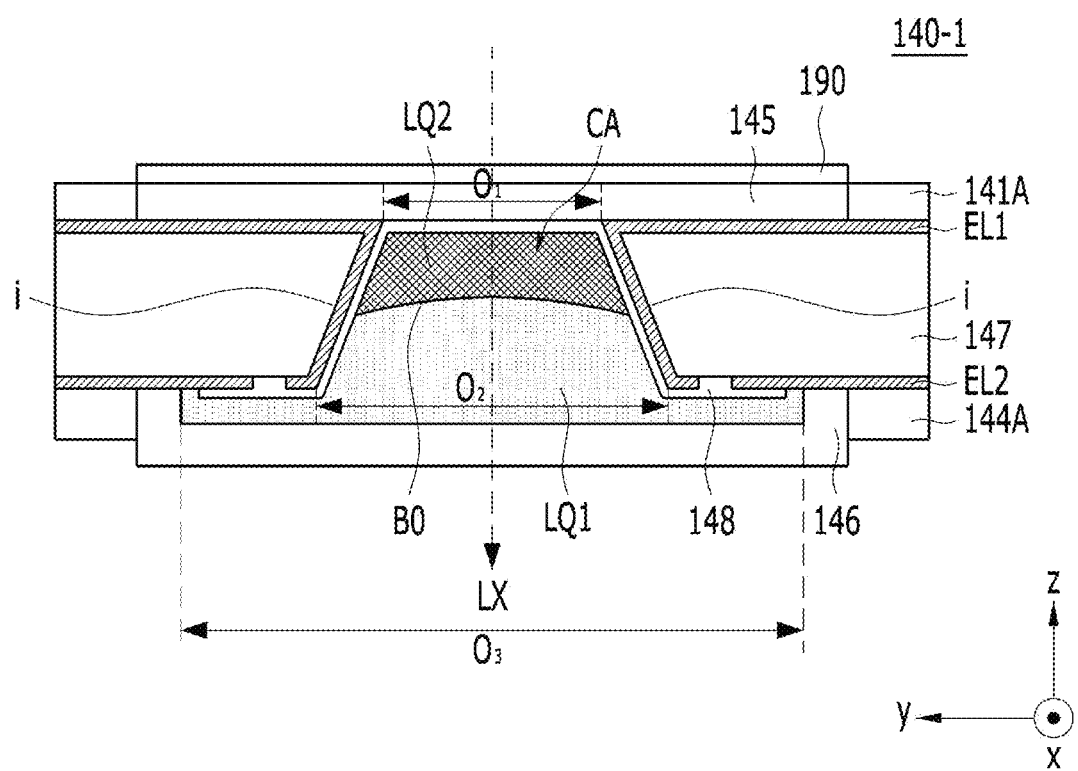
FIG. 11 illustrates a cross-sectional view of an embodiment of the liquid lens unit.

FIG. 11 illustrates a cross-sectional view of an embodiment 140-1 of the liquid lens unit 140A. For convenience of description, an illustration of the spacer 143A is omitted from FIG. 11. FIG. 11 is a mere example given to facilitate understanding of the liquid lens 142, and the embodiment is not limited as to the specific structure of the liquid lens 142.

The liquid lens 142 may include a cavity CA. As shown in FIG. 11, the open area of the cavity CA that is oriented in the direction in which light is introduced may be smaller than the open area of the cavity CA that is oriented in the opposite direction. Alternatively, the liquid lens 142 may be disposed such that the direction of inclination of the cavity CA is opposite that in the illustration. That is, unlike the illustration of FIG. 11, the open area of the cavity CA that is oriented in the direction in which light is introduced may be larger than the open area of the cavity CA that is oriented in the opposite direction. In addition, when the liquid lens 142 is disposed such that the direction of inclination of the cavity CA is opposite that in the illustration, the arrangement of all or some of the components included in the liquid lens 142 may be changed, or only the direction of inclination of the cavity CA may be changed, and the arrangement of remaining components may not be changed, depending on the direction of inclination of the liquid lens 142.

The liquid lens 142 may include a plurality of different types of liquids LQ1 and LQ2, first to third plates 147, 145 and 146, first and second electrodes EL1 and EL2, and an insulating layer 148. In addition, the liquid lens 142 may further include an optical layer 190.

The plurality of liquids LQ1 and LQ2 may be accommodated in the cavity CA, and may include a first liquid LQ1, which is conductive, and a second liquid (or an insulative liquid) LQ2, which is non-conductive. The first liquid LQ1 and the second liquid LQ2 may not mix with each other, and an interface BO may be formed at a contact portion between the first and second liquids LQ1 and LQ2. For example, the second liquid LQ2 may be disposed on the first liquid LQ1, but the embodiment is not limited thereto.

In addition, in the cross-sectional shape of the liquid lens 142, the edges of the first and second liquids LQ2 and LQ1 may be thinner than the center portions thereof.

The first liquid LQ1 may be formed of, for example, a mixture of ethylene glycol and sodium bromide (NaBr). The second liquid LQ2 may be oil, and for example, may be phenyl-based silicon oil.

Each of the first liquid LQ1 and the second liquid LQ2 may include at least one of an antioxidant or a sterilizer. The antioxidant may be a phenyl-based antioxidant or a phosphorus (P)-based antioxidant. In addition, the sterilizer may be any one of alcohol-based, aldehyde-based, and phenol-based sterilizers. When each of the first liquid LQ1 and the second liquid LQ2 includes the antioxidant and the sterilizer, it is possible to inhibit a change in the physical properties of the first and second liquids LQ1 and LQ2 due to oxidation of the first and second liquids LQ1 and LQ2 or propagation of microorganisms.

The inner surface of the first plate 147 may form a sidewall i of the cavity CA. The first plate 147 may include upper and lower openings having a predetermined inclined surface. That is, the cavity CA may be defined as a region surrounded by the inclined surface of the first plate 147, a third opening that is in contact with the second plate 145, and a fourth opening that is in contact with the third plate 146.

The diameter of the opening that is larger among the third and fourth openings may vary depending on the field of view (FOV) required for the liquid lens 142 or the role that the liquid lens 142 plays in the camera module 100A. According to the embodiment, the size (or the area or the width) of the fourth opening $O_2$ may be greater than the size (or the area or the width) of the third opening $O_1$. Here, the size of each of the third and fourth openings may be the cross-sectional area in the horizontal direction (e.g. the x-axis direction and the y-axis direction). For example, when each of the third and fourth openings has a circular cross-section, the size thereof may be a radius, and when each of the third and fourth openings has a square cross-section, the size thereof may be a diagonal length.

Each of the third and fourth openings may take the form of a hole having a circular cross-section, and the inclined surface thereof may have an inclination angle ranging from 55° to 65° or an inclination angle ranging from 50° to 70°, and may have an inclination angle of, for example, 60°. The interface BO formed by the two liquids may be moved along the inclined surface of the cavity CA by a driving voltage.

The first liquid LQ1 and the second liquid LQ2 are charged, accommodated, or disposed in the cavity CA in the first plate 147. In addition, the cavity CA is a portion through which the light that has passed through the first lens unit 110 passes. The first plate 147 may be formed of a transparent material, or may include impurities so that light does not easily pass therethrough.

Respective electrodes may be disposed on one surface and another surface of the first plate 147. In the case in which the liquid lens 142 performs a focusing function, one first electrode may be provided. In this case, one first electrode EL1 (or an upper electrode) may be disposed on the top surface of the first plate 147, and one second electrode EL2 (or a lower electrode) may be disposed on the bottom surface of the first plate 147. That is, the liquid lens 142 may include a total of two electrodes. The first electrode EL1 may be spaced apart from the second electrode EL2, and may be disposed on surfaces (e.g. the top surface, the side surface, and the bottom surface) of the first plate 147. The second electrode EL2 may be disposed on at least a portion of another surface (e.g. the bottom surface) of the first plate 147, and may be in direct contact with the first liquid LQ1.

In addition, the first electrodes EL1 may be "n" electrodes (hereinafter referred to as 'individual electrodes'), and the second electrode EL2 may be a single electrode (hereinafter referred to as a 'common electrode'). Here, "n" may be a positive integer of 1 or greater. When "n" is 1, the interface of the liquid lens 142 may be adjusted according to the voltage between one first electrode EL1 and one second electrode EL2, and a focusing function may be performed. Alternatively, even when the number of first electrodes EL1 is a plural number, if the same voltage is applied to the plurality of first electrodes ELL the interface of the liquid lens 142 may be adjusted according to the voltages between the plurality of electrodes EL1 and one second electrode EL2, and a focusing function may be performed.

The sector EO of the first electrode EL1 may be the portion of the first electrode EL1 that is exposed, rather than being covered by the second plate 145, as shown in FIG. 11. In addition, the sector CO of the second electrode EL2 may be the portion of the second electrode EL2 that is exposed, rather than being covered by the third plate 146, as shown in FIG. 11. For example, referring to FIGS. 6 and 14, the number of sectors EO of the first electrode EL1 may be four, and the number of sectors CO of the second electrode EL2 may be four. For example, the sectors EO of the first electrode EL1 and the sectors CO of the second electrode EL2 may be respectively arranged sequentially in the clockwise direction (or the counterclockwise direction) about the optical axis.

The portion of the second electrode EL2 that is disposed on the other surface of the first plate 147 may be exposed to the first liquid LQ1, which is conductive.

Each of the first and second electrodes EL1 and EL2 may be formed of a conductive material, e.g. metal, and specifically, may include chrome (Cr). Chromium or chrome is a glossy silver rigid transition metal, which is fragile, does not readily discolor, and has a high melting point. In addition, since an alloy including chromium exhibits high corrosion resistance and rigidity, chromium may be used in the form of being alloyed with other metals. In particular, since chrome (Cr) is not easily corroded or discolored, chrome exhibits high resistance to the first liquid LQ1, which is conductive and is charged in the cavity CA.

In addition, the second plate 145 may be disposed on one surface of the first electrode ELL That is, the second plate 145 may be disposed on the first plate 147. Specifically, the second plate 145 may be disposed on the top surface of the first electrode EL1 and on the cavity CA.

The third plate 146 may be disposed on one surface of the second electrode EL2. That is, the third plate 146 may be disposed under the first plate 147. Specifically, the third plate 146 may be disposed on the bottom surface of the second electrode EL2 and under the cavity CA.

The second plate 145 and the third plate 146 may be disposed so as to face each other, with the first plate 147 interposed therebetween. In addition, at least one of the second plate 145 or the third plate 146 may be omitted.

At least one of the second or third plate 145 or 146 may have a rectangular planar shape. The third plate 146 may be in contact with the first plate 147 at the bonding area around the edge thereof, and may be adhered to the first plate 147.

Each of the second and third plates 145 and 146 may be a region through which light passes, and may be formed of a light-transmissive material. For example, each of the second and third plates 145 and 146 may be formed of glass, and may be formed of the same material for convenience of processing. In addition, the edge of each of the second and third plates 145 and 146 may have a rectangular shape, without being necessarily limited thereto.

The second plate 145 may be configured so as to allow the light introduced from the first lens unit 110 to travel into the cavity CA in the first plate 147.

The third plate 146 may be configured so as to allow the light that has passed through the cavity CA in the first plate 147 to travel to the second lens unit 130. The third plate 146 may be in direct contact with the first liquid LQ1.

According to the embodiment, the third plate 146 may have a diameter greater than the diameter of the opening that is larger among the third and fourth openings in the first plate 147. In addition, the third plate 146 may include a peripheral region that is spaced apart from the first plate 147.

In addition, the actual effective lens area of the liquid lens 142 may be smaller than the diameter (e.g. $O_2$) of the opening that is larger among the third and fourth openings in the first plate 147. For example, when a region within a small radius about the center of the liquid lens 142 is used as an actual light transmission path, the diameter (e.g. $O_3$) of the center area of the third plate 146 may be smaller than the diameter (e.g. $O_2$) of the opening that is larger among the third and fourth openings in the first plate 147.

The insulating layer 148 may be disposed so as to cover a portion of the bottom surface of the second plate 145 in the upper area of the cavity CA. That is, the insulating layer 148 may be disposed between the second liquid LQ2 and the second plate 145.

In addition, the insulating layer 148 may be disposed so as to cover the portion of the first electrode EL1 that forms the sidewall of the cavity CA. In addition, the insulating layer 148 may be disposed on the bottom surface of the first plate 147 so as to cover a portion of the first electrode EL1, the bottom surface of the first plate 147, and a portion of the second electrode EL2. Accordingly, contact between the first electrode EL1 and the first liquid LQ1 and contact between the first electrode EL1 and the second liquid LQ2 may be inhibited by the insulating layer 148.

The insulating layer 148 may be formed of, for example, a coating agent such as parylene C, and may further include a white dye. The white dye may increase the rate of reflection of light from the insulating layer 148, which forms the sidewall i of the cavity CA.

The insulating layer 148 may cover one (e.g. the first electrodes EL1) of the first and second electrodes EL1 and EL2, and may expose a portion of the other electrode (e.g. the second electrode EL2), so that electric energy is applied to the first liquid LQ1, which is conductive.

When a driving voltage is applied to the first and second electrodes EL1 and EL2 through the first connection substrate 141A and the second connection substrate 144A, the interface BO between the first liquid LQ1 and the second liquid LQ2 may be deformed, and thus at least one of the shape, such as a curvature, or the focal length of the liquid lens 142 may be changed (or adjusted). For example, the focal length of the liquid lens 142 may be adjusted as at least one of the flexure or the inclination of the interface BO formed in the liquid lens 142 is changed according to the driving voltage. When the deformation or the radius of curvature of the interface BO is controlled, the liquid lens 142, the lens assembly 110, 120, 130 or 140A including the liquid lens 142, the camera module 100A, and the optical device may perform an auto-focusing (AF) function and a hand-tremor compensation or optical image stabilizer (OIS) function. However, the embodiment relates to a camera module using the liquid lens 142 that performs a focusing function.

In addition, according to an embodiment, the liquid lens unit 140A may further include an optical layer 190. In this case, the camera module 100A shown in FIGS. 2 to 8 may not include the filter 176 or the sensor holder 178.

The optical layer 190 may be disposed on one surface of at least one of the second plate 145 or the third plate 146. That is, the optical layer 190 may be disposed on at least one of the upper side or the lower side of the second plate 145, may be disposed on at least one of the upper side or the lower side of the third plate 146, or may be disposed on at least one of the upper side or the lower side of each of the second and third plates 145 and 146. For example, the optical layer 190 may be disposed on the second plate 145, as shown in FIG. 11.

In addition, the optical layer 190 may be formed in a single layer, or may be formed in multiple layers.

The optical layer 190 may include at least one of an ultraviolet light blocking layer, an anti-reflection layer, or an infrared light blocking layer. The optical layer 190 may be disposed so as to overlap the image sensor 182 in the direction of the optical axis LX (i.e. the z-axis) or in a direction parallel to the optical-axis direction. At least one of the ultraviolet light blocking layer, the anti-reflection layer, or the infrared light blocking layer may be disposed as the optical layer 190 on at least one of the light-incident part or the light-emitting part of the camera module 100A according to the embodiment.

The ultraviolet light blocking layer may block ultraviolet light, particularly UV-A light. The ultraviolet light blocking layer may be disposed in the area in which light is introduced into the liquid lens 142, and may block ultraviolet light, particularly UV-A light, which may be transmitted from the first lens unit 110. UV-C light has a relatively short wavelength, and thus low penetration force, and therefore most UV-C light is blocked by the ozone layer. UV-B light is blocked by general glass, but UV-A light passes through general glass, and therefore a separate blocking layer may be particularly required. The ultraviolet light blocking layer may inhibit ultraviolet light from being incident on the liquid lens 142 from the outside, thereby inhibiting the composition of an adhesive layer in the liquid lens 142 or the first and second liquids LQ1 and LQ2 from being degraded by ultraviolet light, particularly UV-A light, and inhibiting deterioration in the light transmittance of the liquid lens 142.

The ultraviolet light blocking layer may include at least one of $TiO_2$, $SiO_2$, avobenzone, butylmethoxy dibenzoylmethane, oxybenzone, benzophenone-3, cinnamate, or Mexoryl. In addition, the ultraviolet light blocking layer may be disposed in a single-layered or multi-layered structure, and this may be equally applied to the following embodiments, which will be described later.

The anti-reflection layer may serve to inhibit the reflection of light from the second or third plate 145 or 146, may reduce deterioration in light transmittance due to Fresnel loss in the liquid lens 142, and may inhibit deterioration in the visibility of the liquid lens 142 at night.

In particular, although not shown, the anti-reflection layer may be disposed on the inclined surface and the bottom surface of the insulating layer 148, and may inhibit deterioration in the quality of light transmitted to the image sensor 182 due to the reflection of light.

The infrared light blocking (IR cut-off) layer may block infrared light.

The infrared light blocking layer may remove hot spots from an image by inhibiting infrared light from being introduced into the liquid lens 142 from the outside, and may inhibit deterioration in visibility at night by reducing the reflection of light from the surface of the liquid lens 142.

According to the embodiment, the optical layer 190 may take the form of a coating or film. For example, the anti-reflection layer of the optical layer 190 may be coated at a low temperature through, for example, a spray method.

According to another embodiment, the liquid lens unit 140A may not include the optical layer 190. In this case, the camera module 100A may include the filter 176 and the sensor holder 178, as shown in FIGS. 2 to 8.

The filter 176 may be disposed between the base 172A and the image sensor 182, and may filter light within a specific wavelength range, among the light that has passed through the first lens unit 110, the liquid lens unit 140A, and the second lens unit 130. The filter 176 may be an infrared (IR) light blocking filter, which blocks IR light, or an ultraviolet (UV) light blocking filter, which blocks UV light, but the embodiment is not limited thereto. The filter 176 may be disposed on the image sensor 182. The IR or UV light blocking filter 176 may be disposed inside the sensor holder 178. For example, the filter 176 may be disposed or mounted in an inner recess in the sensor holder 178 or on a stepped portion thereof.

The sensor holder 178 may be disposed under the base 172A, and may be attached to the main board 150. The sensor holder 178 may surround the image sensor 182 and may protect the image sensor 182 from foreign substances or external impacts. The sensor holder 178 may be disposed on the main board 150, and may be spaced apart from a second circuit element 151 so as not to overlap the second circuit element 151 in the optical-axis direction.

The lens holder 120, in which the base 172A, the second lens unit 130, the liquid lens unit 140A, and the first lens unit 110 are disposed, may be disposed on the sensor holder 178.

Meanwhile, the spacer 143A serves to accommodate at least a portion of the liquid lens 142. For example, as shown in FIG. 5, the spacer 143A may be disposed so as to surround the liquid lens 142 and may protect the liquid lens 142 from external impacts. To this end, the spacer 143A may have a shape allowing the liquid lens 142 to be mounted in, seated in, in contact with, fixed to, provisionally fixed to, supported by, coupled to, or disposed in the spacer. To this end, the spacer 143A may include a hollow region 143H in which the liquid lens 142 is accommodated, and a frame configured to surround the hollow region 143H formed in the center thereof. As such, the spacer 143A may have a centrally-hollowed square planar shape, but the embodiment is not limited thereto.

In addition, the spacer 143A may include the first seating grooves 143a-1 and 143a-2 and the second seating grooves described above. In addition, the spacer 143A may further include the first and second recesses HP1 and HP2 described above. A detailed description of the first seating grooves 143a-1 and 143a-2, the second seating grooves and the first and second recesses HP1 and HP2 has been made above. In addition, the spacer 143A may further include third and fourth recesses HP3 and HP4. Referring to FIG. 6, the third recess HP3 may expose one side of the liquid lens 142, and the fourth recess HP4 may be formed opposite the third recess HP3 in the second direction (e.g. the x-axis direction), and may expose the opposite side of the liquid lens 142. The spacer 143A and the liquid lens 142 may be coupled to each other by injecting an adhesive such as epoxy through the third and fourth recesses HP3 and HP4.

The spacer 143A may be disposed between the first connection substrate 141A and the second connection substrate 144A, and may be disposed so as to protrude from at least one of the first or second opening OP1 or OP2 in the lens holder 120. That is, at least a portion of the spacer 143A may be shaped so as to protrude, along with the first and second connection substrates 141A and 144A, from at least one of the first or second side portion S1 or S2 of the lens holder 120 in a direction (e.g. the y-axis direction) perpendicular to the optical axis LX. This is because the length of the spacer 143A in the y-axis direction is greater than the length of the lens holder 120 in the y-axis direction.

In addition, referring to FIG. 6, the spacer 143A may further include a first connection groove HPC1, which is formed at a position corresponding to the first connection frame CF1, and a second connection groove HPC2 (not shown), which is formed at a position corresponding to the third connection frame CF3. That is, the first connection frame CF1 may be disposed in the first connection groove HPC1. The third connection frame CF3 may be disposed in the second connection groove HPC2.

In the case in which the top surface of the liquid lens unit 140A shown in FIG. 5 has a stepped portion, it may be difficult to insert the liquid lens unit 140A into the lens holder 120. In order to inhibit this, in the optical-axis direction (e.g. the z-axis direction), the thickness of the first connection frame CF1 may be less than or equal to the depth of the first connection groove HPC1, and the thickness of the third connection frame CF3 may be less than or equal to the depth of the second connection groove HPC3.

In addition, the spacer 143A may be brought into contact with the gripper when the spacer 143A is inserted into the lens holder 120 and during active alignment.

In addition, at least a portion of the spacer 143A may be disposed in at least one of the first opening OP1 or the second opening OP2.

In addition, at least a portion of the liquid lens 142 may be disposed in at least one of the first opening OP1 or the second opening OP2. For example, the first plate 147 of the liquid lens 142, which is a component of the liquid lens 142, may be disposed in each of the first and second openings OP1 and OP2. In addition, only at least a portion of the spacer 143A may be disposed in each of the first and second openings OP1 and OP2, and the liquid lens 142 may not be disposed therein.

Meanwhile, the base 172A is disposed between the liquid lens unit 140A and the main board 150, and serves to transmit a driving signal (e.g. a driving voltage), output from the main board 150, to the liquid lens unit 140A.

The first connection substrate 141A may be disposed between the liquid lens unit 140A and the base 172A, and the second connection substrate 144A may be disposed between the liquid lens unit 140A and the base 172A.

Figure 12:
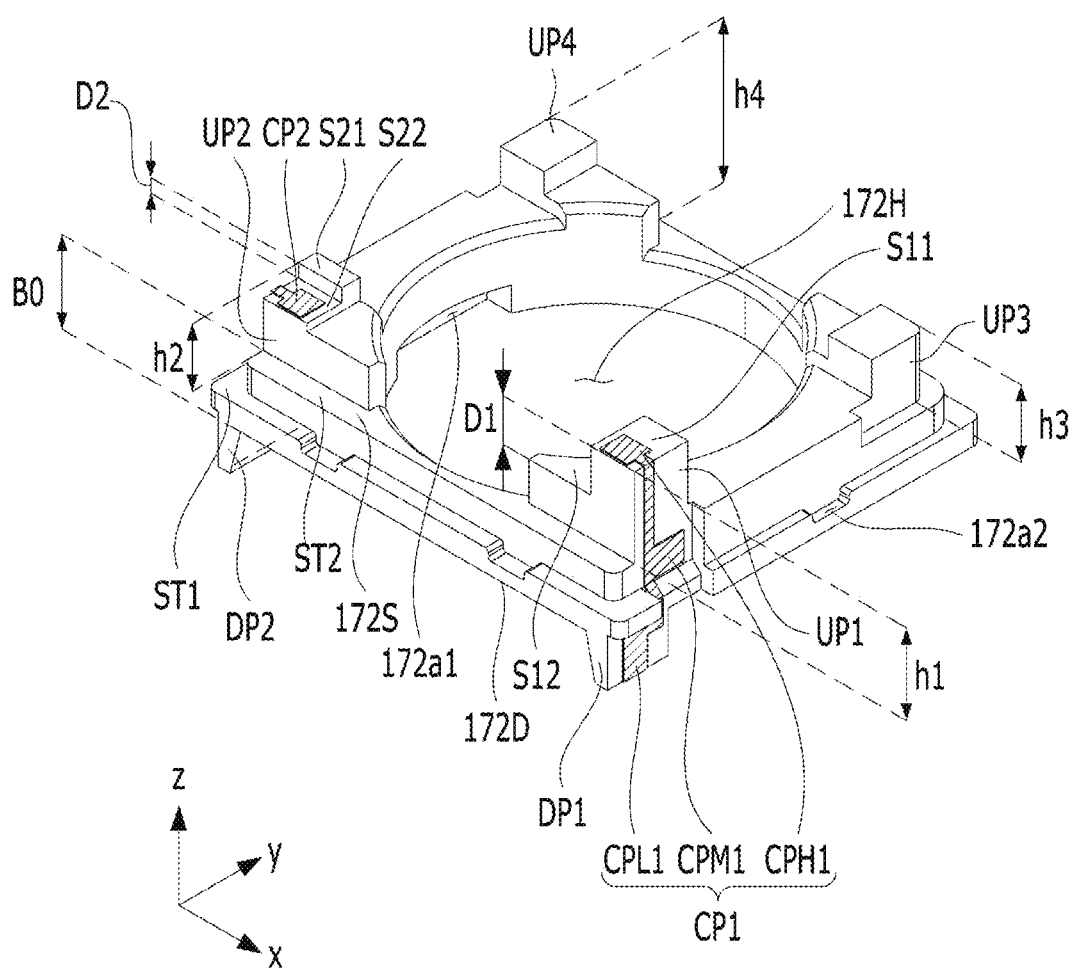
FIG. 12 illustrates a perspective view of the base of the camera module according to the embodiment described above.

FIG. 12 illustrates a perspective view of the base 172A of the camera module 100A according to the embodiment described above.

The base 172A may include a body BO, a plurality of pillars UP1 to UP4, DP and DP2, and connection parts CP1 and CP2.

The body BO of the base 172A may be disposed so as to surround the second hole H2 in the lens holder 120. That is, the lens holder 120 is disposed in the body BO. To this end, the body BO may include an accommodation hole 172H for accommodating the second hole H2. The inner diameter of the body BO (i.e. the diameter of the accommodation hole 172H) may be greater than or equal to the outer diameter of the second hole H2. Here, although the shape of each of the accommodation hole 172H in the base 172A and the second hole H2 is illustrated as being a circular shape, the embodiment is not limited thereto. The shape thereof may be changed to any of various other shapes. The accommodation hole 172H may be formed near the center of the base 172A at a position corresponding to the position of the image sensor 182 disposed in the camera module 100A.

The base 172A may be mounted on the main board 150 so as to be spaced apart from the second circuit element 151. That is, the lens holder 120 may be disposed on the main board 150 so as to be spaced apart from the second circuit element 151.

The pillars may include an upper pillar and a lower pillar.

The upper pillar may protrude from the top surface 172S of the body BO upwards (e.g. the +z-axis direction) in a direction parallel to the optical-axis direction, and the lower pillar may protrude from the bottom surface 172D of the body BO downwards (e.g. the −z-axis direction) in a direction parallel to the optical-axis direction. Each of the upper pillar and the lower pillar may be provided in a plural number.

For example, the upper pillars may include four pillars, namely first to fourth pillars UP1 to UP4. However, the embodiment is not limited thereto. According to another embodiment, the number of upper pillars may be less than or greater than 4. In addition, the lower pillars may include two pillars, namely first and second pillars DP1 and DP2. However, the embodiment is not limited thereto. According to another embodiment, the number of lower pillars may be less than or greater than 2.

The connection part serves to electrically connect the first and second connection substrates 141A and 144A, which are connected to the liquid lens unit 140A, to the main board 150 in order to electrically connect the liquid lens unit 140A to the main board 150. For example, the connection part may include first and second connection parts CP1 and CP2, which are disposed on the surface of the base 172A so as to be spaced apart from each other. However, the embodiment is not limited thereto. That is, according to another embodiment, the connection part may include only the first connection part CP1, or may include only the second connection part CP2.

The connection part may be disposed over one surface of the upper pillar, a portion of the body BO, and one surface of the lower pillar. For example, the first connection part CP1 may be disposed over one surface of the first upper pillar UP1 among the plurality of upper pillars, one surface of the body BO, and one surface of the first lower pillar DP1 among the plurality of lower pillars. The second connection part CP2 may be disposed over one surface of the second upper pillar UP2 among the plurality of upper pillars, the opposite surface of the body BO, and one surface of the second lower pillar DP2 among the plurality of lower pillars.

The first connection part CP1 may include a first lower connection portion CPL1, a first intermediate connection portion CPM1, and a first upper connection portion CPH1. The first upper connection portion CPH1 may be disposed on the top surface S1 of one (e.g. the first upper pillar UP1) of the plurality of upper pillars to be electrically connected to a part of the first connection substrate 141A (i.e. the first outer terminal OT1). The first intermediate connection portion CPM1 may be disposed over the side surface of the first upper pillar UP1 and the side surface of the body BO. The first lower connection portion CPL1 may be disposed on one surface of the first lower pillar DP1.

Similar to this, the second connection part CP2 may include a second lower connection portion CPL2, a second intermediate connection portion CPM2, and a second upper connection portion CPH2. The second upper connection portion CPH2 may be disposed on the top surface S22 of another one (e.g. the second upper pillar UP2) of the plurality of upper pillars to be electrically connected to a part of the second connection substrate 144A (i.e. the second outer terminal OT2). The second intermediate connection portion CPM2 may be disposed over the side surface of the second upper pillar UP2 and the side surface of the body BO. The second lower connection portion CPL2 may be disposed on one surface of the second lower pillar DP2.

The heights of the first to fourth upper pillars UP1 to UP4 may be different from each other, or may be the same as each other. That is, the first to fourth heights h1 to h4 of the first to fourth upper pillars UP1 to UP4 may be the same as each other, or may be different from each other.

For example, the first height h1 of the first upper pillar UP1, at which the first connection part CP1 is disposed, may be greater than the second height h2 of the second upper pillar UP2, at which the second connection part CP2 is disposed. This is because, based on the top surface 172S of the body BO, the first outer terminal OT1 of the first connection substrate 141A, which is connected to the first connection part CP1, is located higher than the second outer terminal OT2 of the second connection substrate 144A, which is connected to the second connection part CP2.

A stepped portion may be formed at the upper portion of each of the plurality of upper pillars UP1 to UP4. The stepped portion may have a staircase shape, but the embodiment is not limited thereto.

For example, the stepped portion of the first upper pillar UP1 is a portion at which a part of the first connection substrate 141A (e.g. the first outer terminal OT1) is disposed, and may include a first upper stepped surface S11 and a first lower stepped surface S12, which is lower than the first upper stepped surface S11. The first upper stepped surface S11 may be higher than the first lower stepped surface S12 by a predetermined height (hereinafter referred to as a 'first depth') D1. The first connection substrate 141A may be disposed on the first upper stepped surface S11 or the first lower stepped surface S12. For example, as shown in the drawings, the first connection substrate 141A may be disposed on the first upper stepped surface S11.

In addition, the stepped portion of the second upper pillar UP2 is a portion at which a part of the second connection substrate 144A (e.g. the second outer terminal OT2) is disposed, and may include a second upper stepped surface S21 and a second lower stepped surface S22, which is lower than the second upper stepped surface S21. The second upper stepped surface S21 may be higher than the second lower stepped surface S22 by a predetermined height (hereinafter referred to as a 'second depth') D2. The second connection substrate 144A may be disposed on the second upper stepped surface S21 or the second lower stepped surface S22. For example, as shown in the drawings, the second connection substrate 144A may be disposed on the second lower stepped surface S22.

Similar to the first and second upper pillars UP1 and UP2, a stepped portion may be formed at the upper portion of each of the third and fourth upper pillars UP3 and UP4.

The depths of the stepped portions of the plurality of upper pillars may be different from each other. For example, the height difference of the stepped portion of the first upper pillar UP1, i.e. the first depth D1, may be greater than the height difference of the stepped portion of the second upper pillar UP2, i.e. the second depth D2.

In addition, the heights of the stepped portions (e.g. the upper stepped surfaces or the lower stepped surfaces) of the plurality of upper pillars may be different from each other. That is, the heights of the upper stepped surfaces of the plurality of upper pillars may be different from each other, and the heights of the lower stepped surfaces of the plurality of upper pillars may be different from each other. For example, in the case in which the first upper stepped surface S11 of the first upper pillar UP1 is higher than the second upper stepped surface S21 of the second upper pillar UP2, a part of the second connection substrate 144A (i.e. the second outer terminal OT2) may be disposed on the second upper stepped surface S21, rather than on the second lower stepped surface S22.

Some of the plurality of upper pillars (e.g. UP4) serve to inhibit the lens holder 120 from being unnecessarily rotated in the clockwise direction or the counterclockwise direction.

In addition, referring to FIG. 6, the base 172A may include first and second sidewalls SW1 and SW2, which face each other in the first direction (e.g. the y-axis direction) intersecting the direction of the optical axis LX (e.g. the z-axis direction), and third and fourth sidewalls SW3 and SW4, which face each other in the second direction (e.g. the x-axis direction) intersecting both the optical-axis direction (e.g. the z-axis direction) and the first direction (e.g. the y-axis direction).

In this case, the first and second connection parts CP1 and CP2 may be respectively disposed on the third and fourth sidewalls SW3 and SW4. The third sidewall SW3 may include a first edge portion, which is in contact with the first sidewall SW1, and a second edge portion, which is in contact with the second sidewall SW2. In addition, the fourth sidewall SW4 may include a first edge portion, which is in contact with the first sidewall SW1, and a second edge portion, which is in contact with the second sidewall SW2. In this case, the first connection part CP1 may be disposed on the first edge portion of the third sidewall SW3, and the second connection part CP2 may be disposed on the first edge portion of the fourth sidewall SW4. As such, when each of first and second connection parts CP2 is disposed on the first edge portion of a respective sidewall, that is, when the first and second outer protruding portions OT1 and OT2 of the first and second connection substrates 141A and 144A of the liquid lens unit 140A are disposed at only one side of the liquid lens unit 140A, the efficiency of utilization of space in the camera lens 100A may be improved, whereby the size of the camera lens 100A may be further reduced.

In addition, referring to FIG. 12, the base 172A may further include therein a first injection hole 172a1. Here, the first injection hole 172a1 may take the form of a through-hole or a blind hole (or a recess). The first injection hole 172a1 may be formed in the lower portion of the body BO, or may be formed under the body BO. The base 172A may be coupled to the lens holder 120 by injecting an adhesive such as epoxy through the first injection hole 172a1.

In addition, the base 172A may further include therein a second injection hole 172a2. Here, the second injection hole 172a2 may take the form of a through-hole or a blind hole (or a recess). The second injection hole 172a2 may be formed in the portion of the body BO that is in contact with the bottom surface of the first cover 170. The base 172A may be coupled to the first cover 170 by injecting an adhesive such as epoxy through the second injection hole 172a2. The second injection hole 172a2 may be formed in each of the first to fourth sidewalls SW1 to SW4 of the body BO. However, the embodiment is not limited as to the specific number of second injection holes 172a2.

In addition, the body BO of the base 172A may have a stepped portion. The stepped portion of the body BO has a third lower stepped surface ST1 and a third upper stepped surface ST2, which is higher than the third lower stepped surface ST1. Referring to FIG. 8, the width WD1 of the third lower stepped surface ST1 may be greater than the width WD2 of the bottom surface of the first cover 170. The reason for this is that, even when the adhesive injected through the second injection hole 172a2 overflows and is discharged outside the first cover 170, the discharged adhesive stays on the first lower stepped surface ST1. In addition, due to the stepped portion of the body BO, the first cover 170 may inhibit unnecessary movement of the base 172A. As such, since unnecessary movement of the base 172A is inhibited by the first cover 170, the contact portions between the first and second connection substrates 141A and 144A and the first and second connection parts CP1 and CP2 are inhibited from being distorted, thereby ensuring electrical contact stability.

In addition, referring to FIG. 7, the thickness t1 of the portion of the first connection part CP1 (or the second connection part CP2) that is exposed by the first recess HP1 in the first cover 170, may be less than the thickness t2 of the side portion of the base 172A, which is located adjacent to the first or second connection part CP1 or CP2 exposed between the first upper pillar UP1 and the third upper pillar UP3. Thus, the first or second connection part CP1 or CP2, which is exposed to the outside through the fifth recess HP5 in the first cover 170, may be spaced apart from the inner surface of the first cover 170. The reason for this is that, when the material of the first cover 170 is metal, the first connection part CP1 (or the second connection part CP2) is spaced apart from the first cover 170 by a predetermined distance. For example, the thickness t1 may be 20 μm to 40 μm, and the thickness t2 may be 0.1 mm or more, for example, 0.15 mm. However, the embodiment is not limited thereto.

As shown in the drawings, each of the first and second connection parts CP1 and CP2 may be a surface electrode or a surface electrode pattern formed on the surface of the base 172A. However, the embodiment is not limited as to the specific shapes of the first and second connection parts CP1 and CP2.

As described above, the base 172A may be designed in a molded interconnect device (MID) type so that the first and second connection parts CP1 and CP2 for electrically connecting the first and second connection substrates 141A and 144A to the main board 150 are disposed on the surface thereof.

Meanwhile, the main board 150 may be disposed under the base 172A, and may include a second circuit element 151, a connection portion (or an FPCB) 152, and a connector 153. The image sensor 182 may be mounted on, seated on, tightly disposed on, fixed to, provisionally fixed to, supported by, or coupled to a flat surface 150S1 of the main board 150, which intersects the optical axis LX. Alternatively, according to another embodiment, a recess (not shown) for receiving the image sensor 182 may be formed in the flat surface 150S1. However, the embodiment is not limited as to the specific manner in which the image sensor 182 is disposed on the main board 150.

The second circuit element 151 of the main board 150 may constitute a control module, which controls the liquid lens unit 140A and the image sensor 182. Hereinafter, the control module will be described with reference to FIG. 13.

Figure 13:
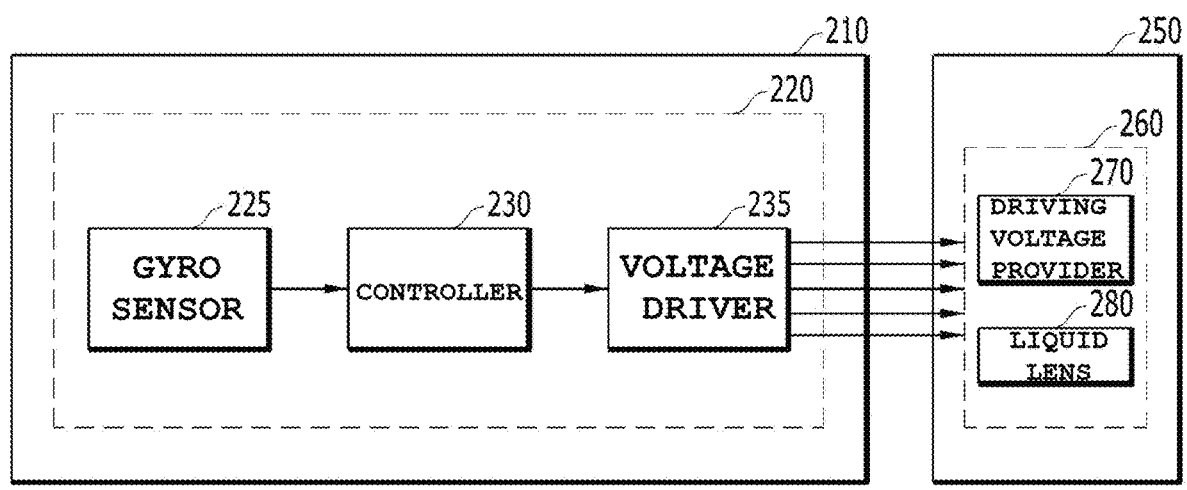
FIG. 13 is a schematic block diagram of the camera module.

FIG. 13 is a schematic block diagram of the camera module 200.

Referring to FIG. 13, the camera module 200 may include a control circuit 210 and a lens assembly 250. The control circuit 210 may correspond to the control circuit 24 or 24A shown in FIG. 1 or 2, and the lens assembly 250 may correspond to the lens assembly 22 or 22A shown in FIG. 1 or 2 or the lens assembly 110, 120, 130 and 140A shown in FIG. 4.

The control circuit 210 may include a control unit 220, and may control the operation of the liquid lens unit 140A including a liquid lens 280.

The control unit 220 may have a component for performing an AF function and an OIS function, and may control the liquid lens 280 included in the lens assembly 250 using a user request or a sensed result (e.g. a motion signal of a gyro sensor 225). The embodiment relates to a camera module that performs an AF function. Here, the liquid lens 280 may correspond to the above-described liquid lens 142.

The control unit 220 may include a gyro sensor 225, a controller 230, and a voltage driver 235.

The gyro sensor 225 may be an independent component that is not included in the control unit 220, or may be included in the control unit 220. The gyro sensor 225 may sense the angular velocity of movement in two directions, including a yaw-axis direction and a pitch-axis direction, in order to compensate for hand tremor in the vertical and horizontal directions of the optical device. The gyro sensor 225 may generate a motion signal corresponding to the sensed angular velocity, and may provide the motion signal to the controller 230.

The controller 230 may remove a high frequency noise component from the motion signal using a low-pass filter (LPF) so as to extract only a desired frequency band for implementation of the AF and OIS functions, may calculate the amount of hand tremor using the motion signal from which the noise has been removed, and may calculate a driving voltage corresponding to the shape that the liquid lens 280 of the liquid lens module 260 needs to have in order to compensate for the calculated amount of hand tremor.

The controller 230 may receive information for the AF function (i.e. information on the distance to an object) from an internal component (e.g. an image sensor 182) or an external component (e.g. a distance sensor or an application processor) of the optical device or the camera module 200, and may calculate the driving voltage corresponding to the desired shape of the liquid lens 280 based on a focal length, which is required to focus on the object, using the distance information.

The controller 230 may store a driving voltage table in which a driving voltage and a driving voltage code for making the voltage driver 235 generate the driving voltage are mapped, may acquire the driving voltage code corresponding to the calculated driving voltage by referring to the driving voltage table, and may output the acquired driving voltage code to the voltage driver 235.

The voltage driver 235 may generate, based on a driving voltage code in a digital form provided from the controller 230, a driving voltage in an analog form corresponding to the driving voltage code, and may provide the driving voltage to the lens assembly 250.

The voltage driver 235 may include a voltage booster, which increases a voltage level upon receiving a supply voltage (e.g. a voltage supplied from a separate power supply circuit), a voltage stabilizer for stabilizing the output of the voltage booster, and a switching unit for selectively supplying the output of the voltage booster to each terminal of the liquid lens 280.

Here, the switching unit may include a circuit component called an H bridge. A high voltage output from the voltage booster is applied as a power supply voltage of the switching unit. The switching unit may selectively supply the applied power supply voltage and a ground voltage to opposite ends of the liquid lens 280. Here, as described above, the liquid lens 280 may include one first electrode EL1, the first connection substrate 141A, one second electrode EL2, and the second connection substrate 144A for driving. Opposite ends of the liquid lens 280 may mean the electrode sector EO of the first electrode EL1 and the electrode sector CO of the second electrode EL2.

A pulse-type voltage having a predetermined width may be applied to each electrode sector of the liquid lens 280, and the driving voltage applied to the liquid lens 280 is the difference between the voltages applied to the first electrode EL1 and the second electrode EL2.

In addition, in order to allow the voltage driver 235 to control the driving voltage applied to the liquid lens 280 depending on a driving voltage code in a digital form provided from the controller 230, the voltage booster may control an increase in a voltage level, and the switching unit may control the phase of a pulse voltage applied to the common electrode and the individual electrode so as to generate a driving voltage in an analog form, which corresponds to the driving voltage code.

That is, the control unit 220 may control the voltage applied to each of the first electrode EL1 and the second electrode EL2.

The control circuit 210 may further include a connector (not shown), which performs a communication or interface function of the control circuit 210. For example, the connector may perform communication protocol conversion for communication between the control circuit 210, which uses an inter-integrated circuit (I2C) communication method, and the lens assembly 250, which uses a mobile industry processor interface (MIPI) communication method. In addition, the connector may receive power from an external source (e.g. a battery), and may supply power required for the operation of the control unit 220 and the lens assembly 250. In this case, the connector may correspond to the connector 153 shown in FIG. 4.

The lens assembly 250 may include the liquid lens module 260, and the liquid lens module 260 may include a driving voltage provider 270 and the liquid lens 280.

The driving voltage provider 270 may receive a driving voltage from the voltage driver 235, and may provide the driving voltage to the liquid lens 280. Here, the driving voltage may be an analog voltage applied between one individual electrode and one common electrode.

The driving voltage provider 270 may include a voltage adjustment circuit (not shown) or a noise removal circuit (not shown) for compensating for loss due to terminal connection between the control circuit 210 and the lens assembly 250, or may divert the voltage provided from the voltage driver 235 to the liquid lens 280.

The driving voltage provider 270 may be disposed on an FPCB (or a substrate), which constitutes at least a portion of the connection part 152, but the embodiment is not limited thereto. The connection part 152 may include the driving voltage provider 270. The liquid lens 280 may be deformed in the interface BO thereof between the first liquid LQ1 and the second liquid LQ2 depending on a driving voltage, thereby performing at least one of the AF function or the OIS function. In particular, according to the embodiment, the interface BO between the first liquid LQ1 and the second liquid LQ2 in the liquid lens 280 may be deformed by applying the driving voltage thereto so as to perform the AF function.

FIGS. 14(*a*) and (*b*) are views for explaining the liquid lens 142, the interface of which is adjusted depending on a driving voltage. Specifically, FIG. 14(*a*) illustrates a perspective view of the liquid lens 142 according to the embodiment, and FIG. 14(*b*) illustrates an equivalent circuit of the liquid lens 142. Here, the liquid lens 142 is the same as the liquid lens 142 shown in FIGS. 2 to 8, and thus is designated by the same reference numeral.

First, referring to FIG. 14(*a*), the liquid lens 142, the interface BO of which is adjusted in shape depending on a driving voltage, may receive the driving voltage through the electrode sectors EO of the first electrode EL1 and the electrode sectors CO of the second electrode EL2, which are disposed in four different directions to have the same angular distance therebetween. When the driving voltage is applied through the electrode sectors EO of the first electrode EL1 and the electrode sectors CO of the second electrode EL2, the shape of the interface BO between the first liquid LQ1 and the second liquid LQ2, which are disposed in the cavity CA, may be changed. The degree of deformation and the shape of the interface BO between the first liquid LQ1 and the second liquid LQ2 may be controlled by the controller 230 in order to implement the AF function.

Figure 14A:
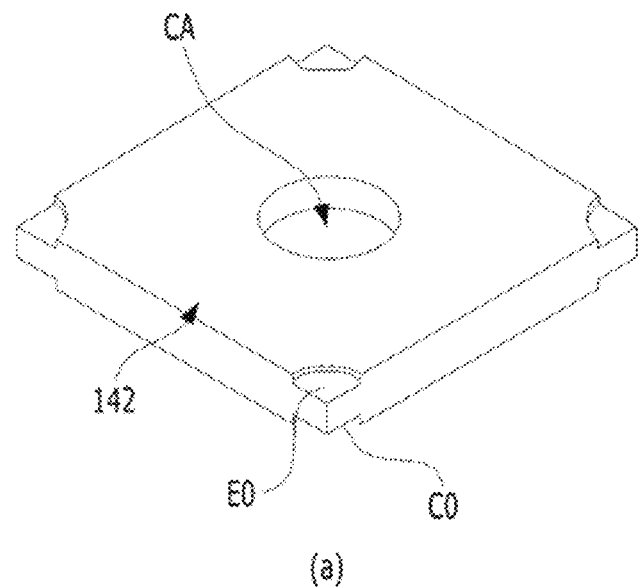
FIGS. 14(a) and (b) are views for explaining the liquid lens, the interface of which is adjusted depending on a driving voltage.
Figure 14B:
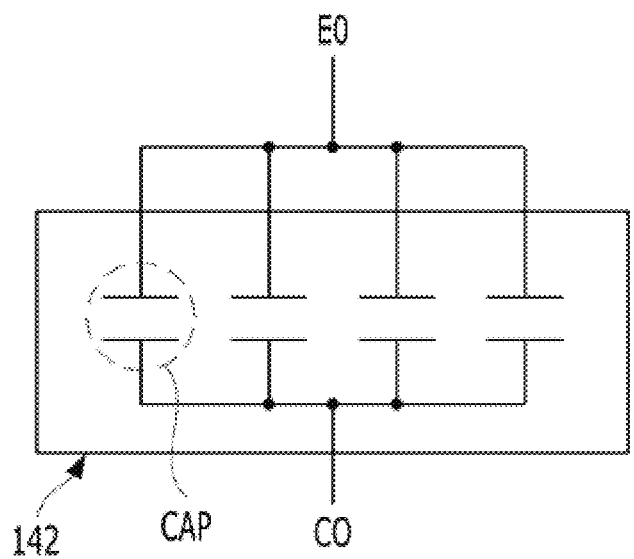

In addition, referring to FIG. 14(b), the liquid lens 142 may be explained as a plurality of capacitors CAP, in which one side of the liquid lens 142 receives a voltage from the electrode sectors EO of the first electrode EL1, and the other side of the liquid lens 142 is connected to the electrode sectors CO of the second electrode EL2 so as to receive a voltage therefrom.

In FIG. 14(a), the number of electrode sectors EO of one first electrode EL1 is illustrated as being four, but the embodiment is not limited thereto.

The second circuit element 151 may include at least one of a passive element or an active element, and may have any of various areas and heights. The second circuit element 151 may be provided in a plural number, and may have a height greater than the height of the main board 150 so as to protrude outwards. The plurality of second circuit elements 151 may be disposed so as not to overlap the lens holder 120 in a direction parallel to the optical axis LX. For example, the plurality of second circuit elements 151 may include a power inductor and a gyro sensor, but the embodiment is not limited as to the specific type of the second circuit elements 151. As shown in FIG. 4, the second circuit elements 151 are illustrated as being disposed on the flat surface 150S2. However, according to another embodiment, the second circuit elements 151 may be disposed on a flat surface 150S3, which is formed opposite the flat surface 150S2.

The main board 150 may include a lens holder area in which the lens holder 120 is disposed and an element area in which the plurality of second circuit elements 151 is disposed.

The main board 150 may be implemented as a rigid flexible printed circuit board (RFPCB) including the FPCB, which is the connection portion 152. The FPCB 152 may be subjected to bending depending on the requirement of the space in which the camera module 100A is mounted.

In addition, referring to FIGS. 3, 4, 6 and 7, the main board 150 may include first and second electrode pads 150-1 and 150-2 for supplying driving signals. The first connection part CP1 of the base 172A electrically connects the first connection substrate 141A to the first electrode pad 150-1, and the second connection part CP2 electrically connects the second connection substrate 144A to the second electrode pad 150-2. Thus, the driving signals supplied through the first and second electrode pads 150-1 and 150-2 may be provided to the liquid lens unit 140A through the first and second connection parts CP1 and CP2 and the first and second connection substrates 141A and 144A.

Meanwhile, the first cover 170 may be disposed so as to surround the lens holder 120, the liquid lens unit 140A, and the base 172A, and may protect these components 120, 140A and 172A from external impacts. In particular, due to the first cover 170, a plurality of lenses, which forms an optical system, may be protected from external impacts.

Referring to FIG. 8, in the case in which the stepped portion 170a of the first cover 170 is formed to have a curvature, the portion of the lens holder 120 that faces the stepped portion 170a of the first cover 170 may be formed so as to be stepped in order to inhibit the inner surface of the stepped portion 170a of the first cover 170 from coming into contact with the lens holder 120.

In addition, the first cover 170 may include an upper opening 170H formed in the top surface thereof so that the first lens unit 110 disposed in the lens holder 120 is exposed to external light.

In addition, the upper opening 170H may be a hole, or a window formed of a light-transmissive material may be disposed in the hole, thereby inhibiting foreign substances, such as dust or moisture, from entering the camera module 100A.

Referring to FIGS. 2 and 3, the first cover 170 may include therein a fifth recess HP5 for exposing a portion of at least one of the first or second connection part CP1 or CP2. The fifth recess HP5 may include a 5-$1^{st}$ recess HP5-1 and a 5-$2^{nd}$ recess HP5-2 (not shown). The 5-$1^{st}$ recess HP5-1 is disposed at one side of the first cover 170 to expose the first connection part CP1 to the outside. The 5-$2^{nd}$ recess HP5-2 is disposed at the opposite side of the first cover 170, which is opposite the one side of the first cover 170, in which the 5-$1^{st}$ recess HP5-1 is formed, to expose the second connection part CP2 to the outside. The 5-$2^{nd}$ recess HP5-2 may be disposed opposite the 5-$1^{st}$ recess HP5-1 in the x-axis direction.

In addition, referring to FIG. 3, the first cover 170 may include at least one sixth recess HP61 to HP63 formed in the lower portion thereof, and the base 172A may further include at least one seventh recess HP71 to HP73 formed in the upper portion thereof so as to be opposite the sixth recess HP61 to HP63. In this case, as will be described later, when the first cover 170 is mounted on, seated on, tightly disposed on, fixed to, provisionally fixed to, supported by, coupled to, or disposed on the base 172A, the sixth recess HP61 to HP63 and the seventh recess HP71 to HP73 may be brought into contact with each other and may face each other.

A concave portion having a predetermined area may be formed through contact or engagement between the sixth recess HP61 to HP63 and the seventh recess HP71 to HP73. An adhesive having viscosity, such as epoxy, may be injected into and applied to the concave portion. That is, the adhesive applied to the concave portion fills the gap between the surfaces of the first cover 170 and the base 172A, which face each other, through the concave portion, thereby sealing the gap between the first cover 170 and the base 172A when the first cover 170 is mounted on, seated on, tightly disposed on, fixed to, provisionally fixed to, supported by, coupled to, or disposed on the base 172A. Accordingly, when the first cover 170 is mounted on, seated on, tightly disposed on, fixed to, provisionally fixed to, supported by, coupled to, or disposed on the base 172A, the side surface thereof may be sealed.

In addition, although it is illustrated in FIG. 3 that the number of each of the sixth recesses HP61 to HP63 and the seventh recesses HP71 to HP73 is three, the embodiment is not limited thereto. The number thereof may be greater than or less than 3.

In addition, in some cases, the sixth recesses HP61 to HP63 and the seventh recesses HP71 to HP73 may be omitted.

Meanwhile, the second cover 154 may be mounted to the bottom surface of the main board 150, and may protect the second circuit elements 151 disposed on the bottom surface of the main board 150 from external impacts. To this end, the second cover 154 may include therein a space for accommodating the second circuit elements 151 in consideration of the shape and position of the second circuit elements 151 disposed on the main board 150.

For example, some of the plurality of second circuit elements 151 may cause electromagnetic interference (EMI) or noise. In particular, among the plurality of second circuit elements 151, a power inductor may cause more EMI than other elements. In order to block EMI or noise, the second cover 154 may be disposed so as to cover the second circuit elements 151 disposed in the element area of the main board 150.

The image sensor 182 may perform a function of converting the light that has passed through the first lens unit 110, the liquid lens unit 140A, and the second lens unit 130 of the lens assembly 110, 120, 130 and 140A into image data. More specifically, the image sensor 182 may generate image data by converting light into analog signals via a pixel array including a plurality of pixels and synthesizing digital signals corresponding to the analog signals.

The connector 153 may electrically connect the main board 150 to a power supply or any other device (e.g. an application processor) outside the camera module 100A.

Figure 15A:
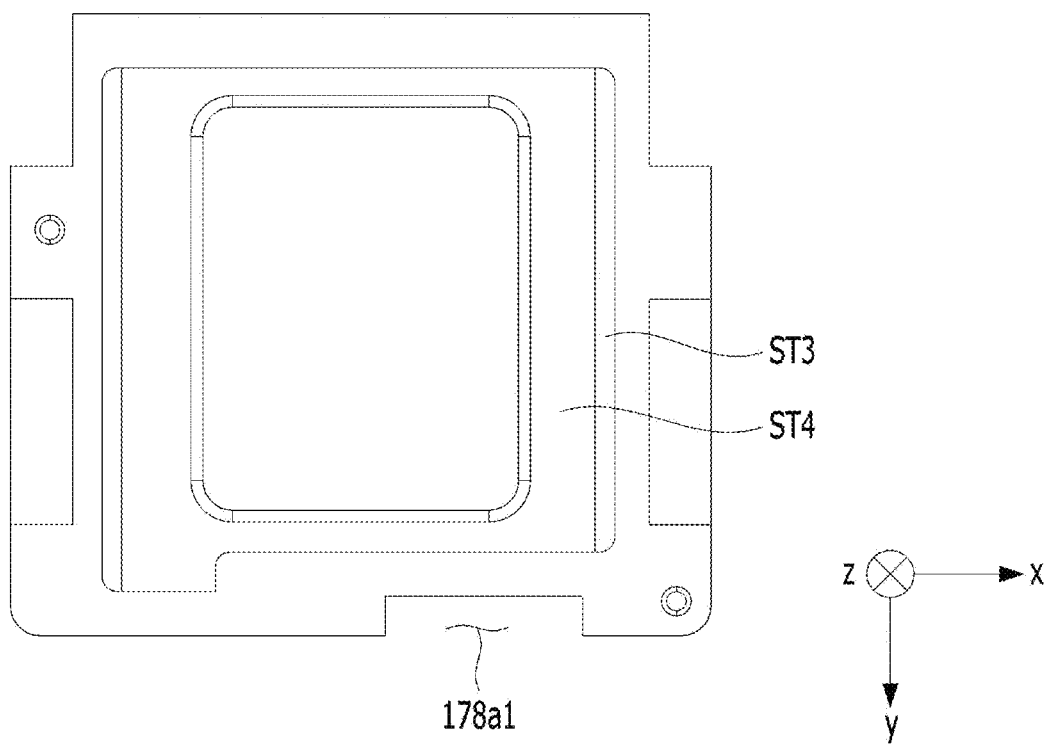
FIGS. 15A and 15B illustrate a bottom surface and a top perspective view, respectively, of the sensor holder of the camera module according to the embodiment.
Figure 15B:
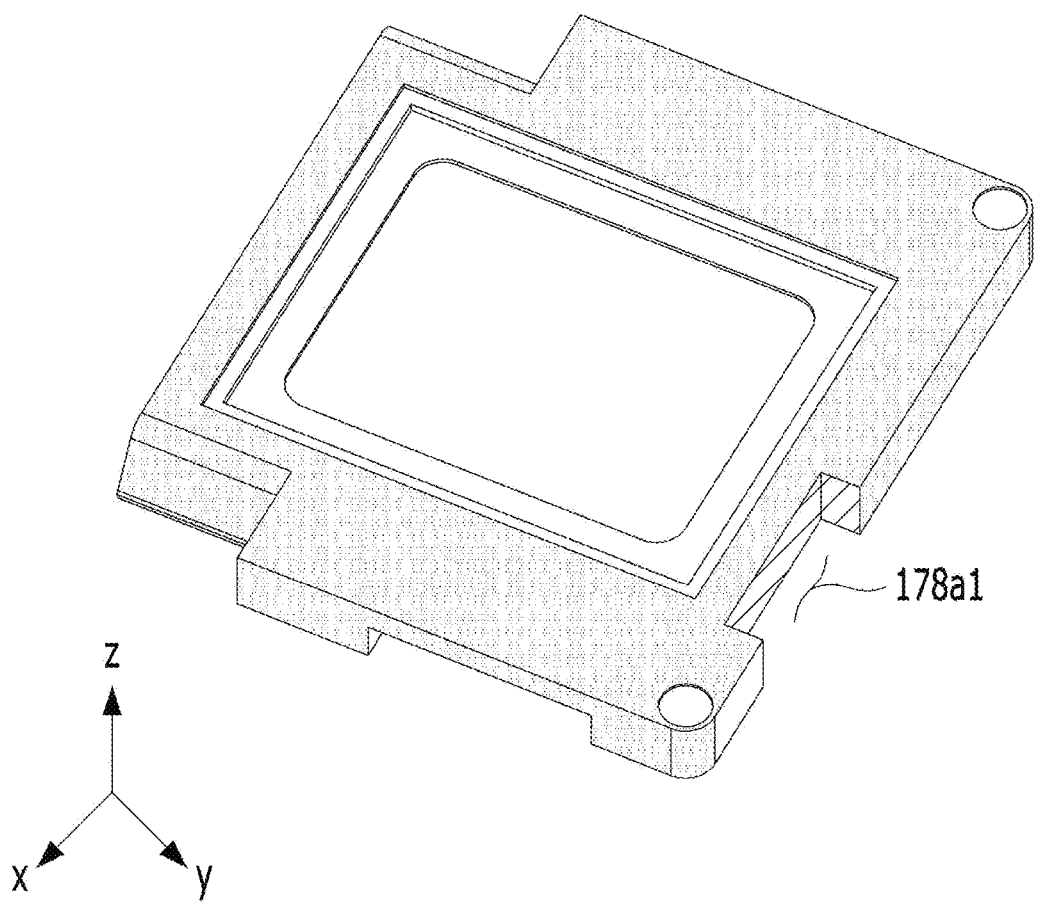

FIGS. 15A and 15B illustrate a bottom surface and a top perspective view, respectively, of the sensor holder 178 of the camera module 100A according to the embodiment.

Referring to FIGS. 15A and 15B, the sensor holder 178 may include an upper stepped portion, a lower stepped portion, and a third injection hole 178a1. Here, the third injection hole 178a1 may take the form of a through-hole or a blind hole (or a recess).

The third injection hole 178a1 may be formed in the side portion of the sensor holder 178, and may communicate with the lower stepped portion and the upper stepped portion of the sensor holder 178 shown in FIG. 15A.

The lower stepped portion of the sensor holder 178 has a fourth lower stepped surface ST3 and a fourth upper stepped surface ST4, which is formed deeper than the fourth lower stepped surface ST3. The reason for this is that, when the adhesive injected through the third injection hole 178a1 to engage the sensor holder 178 and the main board 150 overflows, the overflowing adhesive is accommodated in the lower stepped portion of the sensor holder 178.

In addition, similar to the lower stepped portion, the upper stepped portion of the sensor holder 178 has stepped surfaces having mutually different heights. The reason for this is that, when the adhesive injected through the third injection hole 178a1 to engage the base 172A and the sensor holder 178 overflows, the overflowing adhesive is accommodated in the upper stepped portion of the sensor holder 178.

In addition, the region of the upper side of the sensor holder 178 in which epoxy is disposed may be formed to be symmetrical in a direction perpendicular to the optical-axis direction. The width of the epoxy may be 0.35 mm to 0.6 mm, but the embodiment is not limited thereto.

Meanwhile, in the case in which the camera module 100A does not include the sensor holder 178, the base 172A may be directly coupled to the main board 150. In addition, in order to protect the image sensor 182 from the outside, the base 172A may be coupled to the main board 150 so as to surround the image sensor 182. In this case, the body BO shown in FIG. 12 may extend to an empty space between the lower pillars DP1 and DP2. Alternatively, the lower pillars DP1 and DP2 of the base 172A may be omitted, the first and second lower connection portions CPL1 and CPL2 may be omitted from the first and second connection parts CP1 and CP2, and the first and second intermediate connection portions CPM1 and CPM2 may be in direct electrical contact with the first and second electrode pads 150-1 and 150-2 of the main board 150, instead of the first and second lower connection portions CPL1 and CPL2.

Hereinafter, a method of manufacturing the camera module 100A according to the other embodiment described above will be described.

According to an embodiment, the first lens unit 110 and the second lens unit 130 are mounted, disposed, coupled, inserted, or formed in the lens holder 120. Thereafter, the liquid lens unit 140A is inserted into the lens holder 120 through the first or second opening OP1 or OP2 in the lens holder 120.

In addition, the image sensor 182 and the sensor holder 178 are coupled onto the main board 150.

Thereafter, in the state in which the spacer 143A of the liquid lens unit 140A (or the lens holder 120) is held by the gripper, a driving voltage is supplied to the liquid lens 142 of the liquid lens unit 140A through the first and second connection substrates 141A and 144A (or the first and second intermediate terminals MF1 and MF2 of the first and second connection substrates 141A and 144A) such that the relative positions of the first lens unit 110, the second lens unit 130 and the liquid lens 142 are adjusted, whereby active alignment is primarily performed so as to align the optical axes of the first lens unit 110, the second lens unit 130, and the liquid lens 142 with each other.

Thereafter, the liquid lens unit and the lens holder are coupled to each other.

Thereafter, the lens holder 120 and the base 172A are coupled to each other.

Thereafter, the first cover 170 may be placed to surround the lens holder 120 and the base 172A. Alternatively, the first cover 170 may be placed to cover the lens holder 120 and the base 172A after active alignment is completely terminated.

Thereafter, the lens holder 120 and the base 172A are coupled to each other, and the assembly covered by the first cover 170 is disposed on the image sensor 182.

Thereafter, in the state in which the base 172A (or the first cover 170 or the sensor holder 178) is held by the gripper, a driving voltage is supplied to the liquid lens 142 of the liquid lens unit 140A through the first and second connection parts CP1 and CP2, which are formed on the surface of the base and exposed through the fifth recess HP5, such that the relative positions of the image sensor 182 and the lens holder 120 are adjusted to various positions, whereby active alignment is secondarily performed so as to align the optical axes of the first lens unit 110, the liquid lens 142, and the second lens unit 130 with the center axis of the image sensor 182.

Thereafter, the base 172A and the sensor holder 178 are coupled to each other. For example, dual epoxy may be applied onto the sensor holder 178 to couple the base 172A and the sensor holder 178 to each other. The coupling may be realized by primarily performing UV curing and secondarily performing thermal curing, but the embodiment is not limited thereto.

According to another embodiment, the first lens unit 110 and the second lens unit 130 are mounted, disposed, coupled, inserted, or formed in the lens holder 120. In addition, the image sensor 182 is mounted on the main board 150, and the sensor holder 178 equipped with the filter 176 is coupled to the main board 150.

Thereafter, the lens holder 120 and the base 172A are coupled to each other.

Thereafter, the master glass is inserted into and disposed in the lens holder 120 through the first or second opening OP1 or OP2 in the lens holder 120, instead of the liquid lens unit 140A.

Thereafter, the base 172A is shifted to various positions in the state of being held by the gripper such that the relative positions of the lens holder 120 and the image sensor 182 are adjusted, whereby active alignment is primarily performed so as to align the optical axes of the first lens unit 110, the second lens unit 130, and the image sensor 182 with each other.

Thereafter, the base 172A and the sensor holder 178 are coupled to each other. If the sensor holder 178 is omitted, the base 172A may be coupled to the main board 150.

Thereafter, the master glass is removed, and the liquid lens unit 140A is inserted into and disposed in the lens holder 120 through the first or second opening OP1 or OP2 in the lens holder 120.

Thereafter, in the state in which the spacer 143A of the liquid lens unit 140A (or the lens holder 120) is held by the gripper, a driving voltage is supplied to the liquid lens 142 of the liquid lens unit 140A through the first and second intermediate terminals MF1 and MF2 of the first and second connection substrates 141A and 144A such that the relative positions of the first lens unit 110, the second lens unit 130 and the liquid lens 142 are adjusted, whereby active alignment is secondarily performed so as to align the optical axes of the first lens unit 110, the second lens unit 130, and the liquid lens 142 with each other.

Thereafter, the first and second lens units 110 and 130 and the liquid lens unit 140A are coupled to each other. Thereafter, the first cover 170 is placed to cover the first lens unit 110, the lens holder 120, the second lens unit 130, the liquid lens unit 140A, and the base 172A, thereby completing the manufacture of the camera module 100A.

As described above, after active alignment is completed using the first and second intermediate terminals MF1 and MF2, a soldering process may be performed in order to implement electrical connection between the first outer terminal OT1 of the first connection substrate 141A and the first upper connection portion CPH1 of the first connection part CP1. In addition, a soldering process may be performed in order to implement electrical connection between the second outer terminal OT2 of the second connection substrate 144A and the second upper connection portion CPH2 of the second connection part CP2.

Hereinafter, a camera module 100B according to another embodiment will be described with reference to FIGS. 16 to 19C.

The camera module 100B according to another embodiment is the same as the camera module 100A according to the embodiment described above, except for the liquid lens unit 140A. In addition, the configuration of a base 172B of the camera module 100B according to another embodiment may be slightly different from the configuration of the base 172A of the camera module 100A according to the embodiment described above, and the camera module 100B according to another embodiment may include the base 172A, instead of the base 172B. Thus, the configuration shown in FIGS. 2 to 5 may also be applied to the camera module 100B according to another embodiment. That is, the camera module 100B according to another embodiment, as shown in FIG. 2, may include a lens assembly, a control circuit 24A, and an image sensor 26A. The control circuit 24A and the image sensor 28A may be disposed on one substrate. Specifically, the camera module 100B may include a lens assembly, a main board 150, and a base 172B. In addition, the camera module 100B may further include a first cover 170 and a sensor holder 178. In addition, the camera module 100B may further include a second cover 154 and a filter 176. In addition, the camera module 100B may further include a first circuit element 183. Hereinafter, only the differences between the camera module 100B according to another embodiment and the camera module 100A according to the above embodiment will be described.

Figure 16:
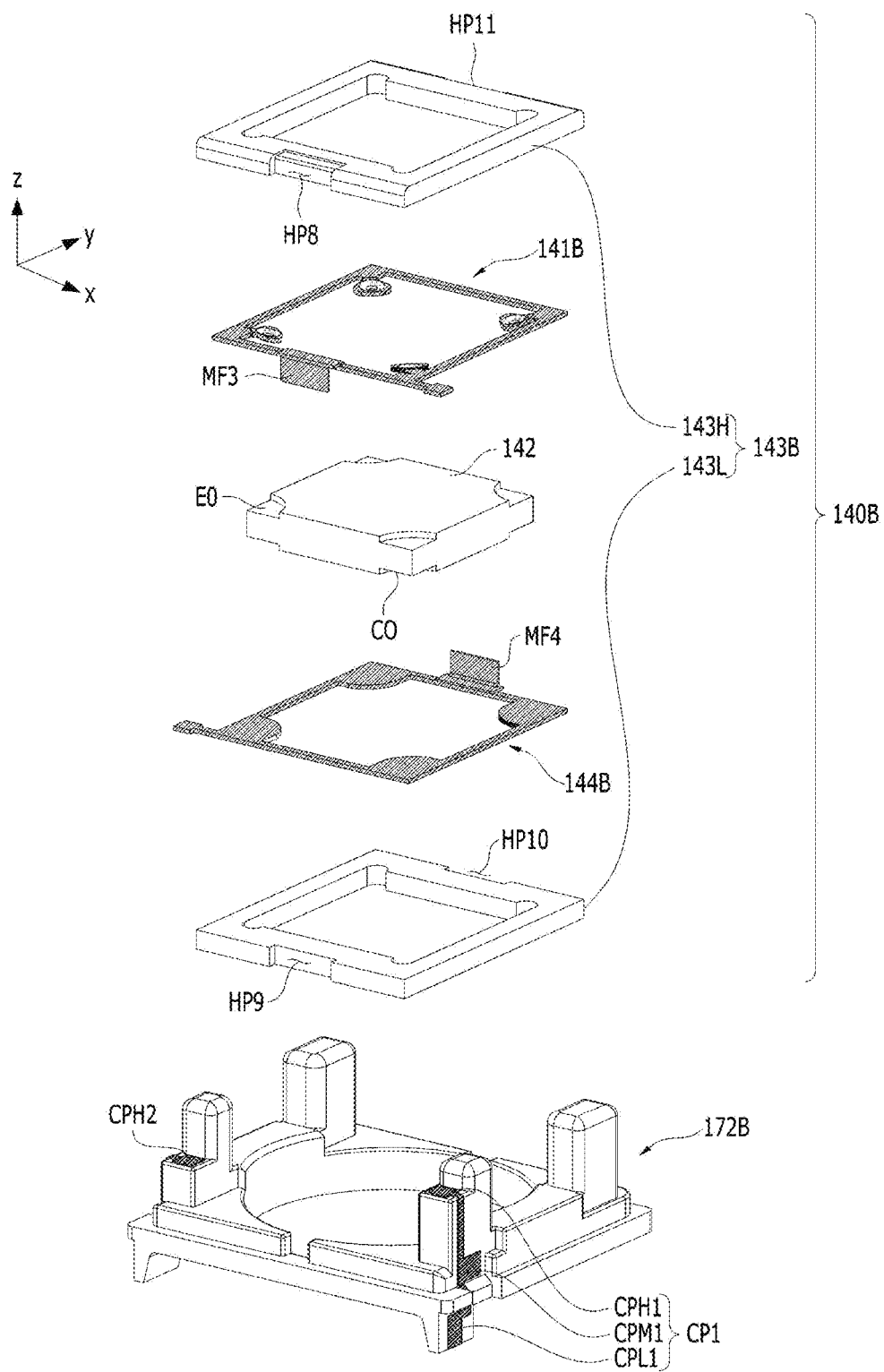
FIG. 16 illustrates an exploded perspective view of a liquid lens unit and a base of a camera module according to another embodiment.
Figure 17:
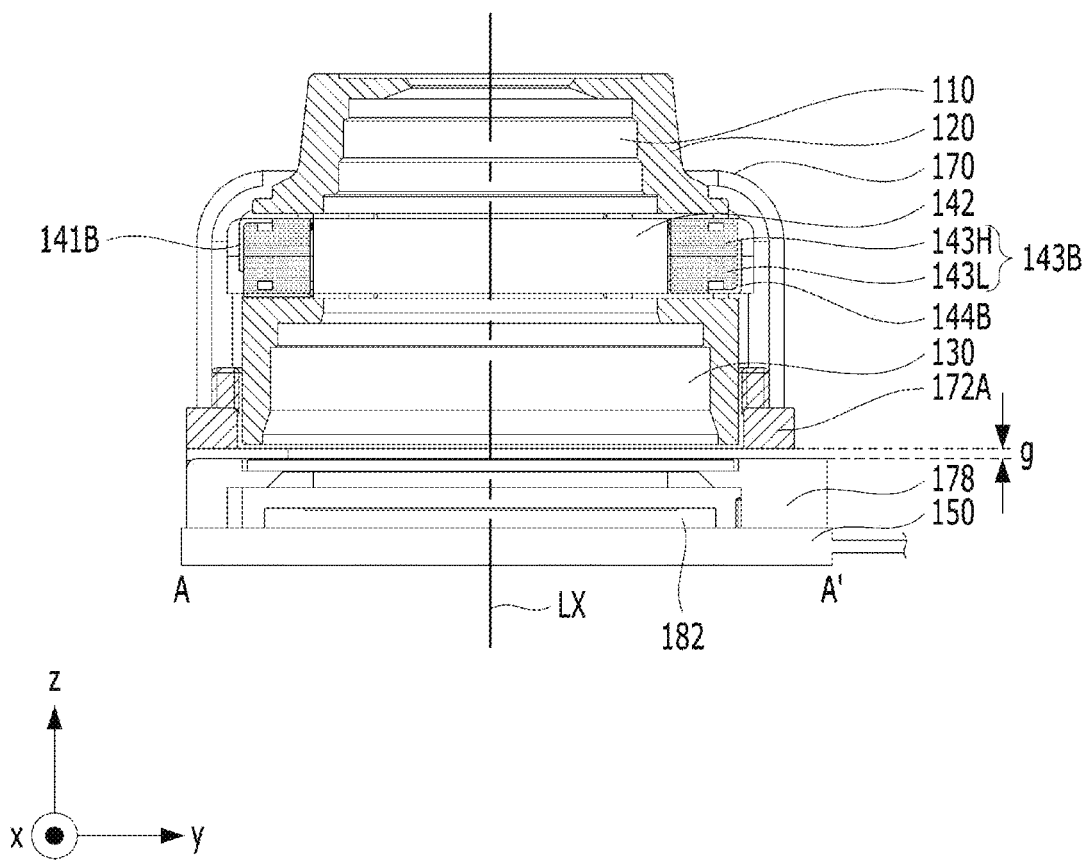
FIG. 17 illustrates a cross-sectional view of another embodiment taken along line A-A' in the camera module shown in FIG. 3.

FIG. 16 illustrates an exploded perspective view of the liquid lens unit 140B and the base 172B of the camera module 100B according to another embodiment, and FIG. 17 illustrates a cross-sectional view of another embodiment taken along line A-A' in the camera module 100B shown in FIG. 3.

Similar to the liquid lens unit 140A of the camera module 100A, the liquid lens unit 140B may include a first connection substrate 141B, a liquid lens 142, a spacer 143B, and a second connection substrate 144B.

The first connection substrate 141B, the liquid lens 142, the spacer 143B, and the second connection substrate 144B according to another embodiment respectively perform the same functions as the first connection substrate 141A, the liquid lens 142, the spacer 143A, and the second connection substrate 144A according to the above embodiment.

The spacer 143B may include an upper spacer 143H and a lower spacer 143L. The upper spacer 143H may be disposed on the liquid lens 142, and the lower spacer 143L may be disposed under the liquid lens 142.

In addition, the first connection substrate 141B electrically connects a sector EO of one first electrode included in the liquid lens 142 to a first connection part CP1 of the base 172B.

The first connection substrate 141B may be coupled to the upper spacer 143H and the liquid lens 142, and the second connection substrate 144B may be coupled to the lower spacer 143L and the liquid lens 142.

In addition, the first connection substrate 141B may be integrally formed with the upper spacer 143H, and the second connection substrate 144B may be integrally formed with the lower spacer 143L. That is, the camera module 100A according to the above embodiment is configured such that the first and second connection substrates 141A and 144A are attached to the spacer 143A, whereas the camera module 100B according to another embodiment may be configured such that the first and second connection substrates 141B and 144B are integrated with the spacer 143B. Each of the first and second connection substrate 141B and 144B may be implemented as a flexible printed circuit board (FPCB), but the embodiment is not limited thereto. According to another embodiment, the first connection substrate 141B may be a plate, and the plate may be made of metal.

Referring to FIG. 17, the upper spacer 143H and the lower spacer 143L may be coupled to each other.

FIGS. 18A to 18D illustrate a top perspective view, a bottom perspective view, a plan view, and a cross-sectional view, respectively, of the first connection substrate 141B according to another embodiment.

Referring to FIGS. 18A to 18D, the first connection substrate 141B may include a third frame F3, a third inner terminal IT13, a third outer terminal OT3, and a fifth connection frame CF5.

The third frame F3 is a portion that is disposed between the upper spacer 143H and the liquid lens 142. The third frame F3 may be integrally formed with the upper spacer 143H.

The third inner terminal IT3 is a portion that is electrically connected to the sector EO of one first electrode of the liquid lens 142. As shown in FIG. 16, when the sectors EO of the first electrode of the liquid lens 142 are disposed at the four corners of the upper side of the liquid lens 142, the third inner terminals IT3 may be disposed at the inner corners of the third frame F3 so as to be connected to the plurality of sectors EO.

Figure 18A:
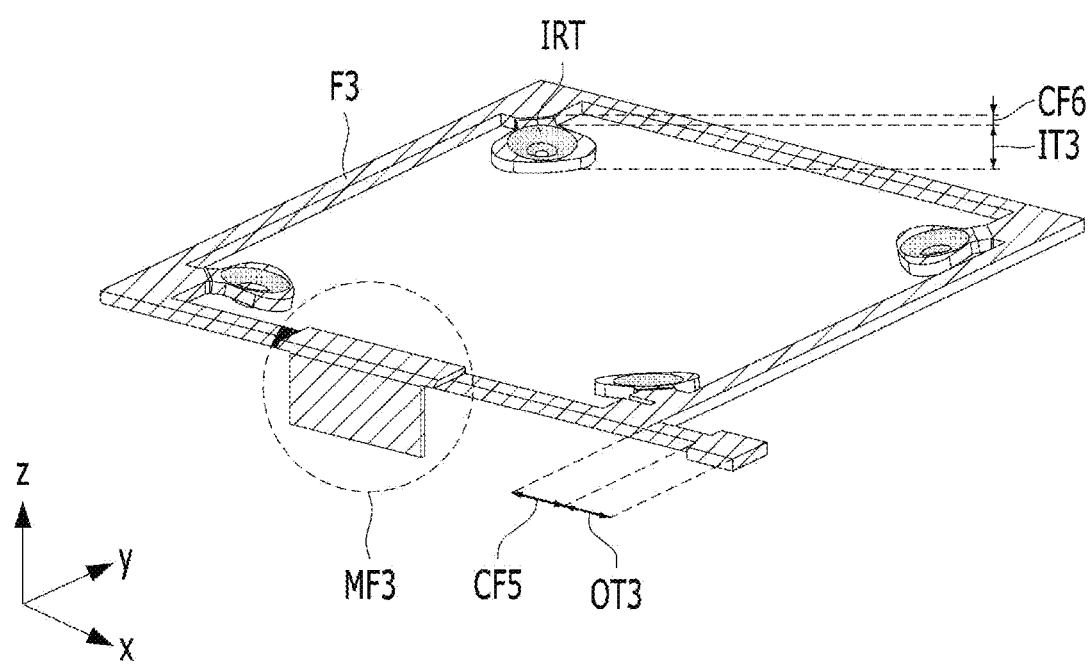
FIGS. 18A to 18D illustrate a top perspective view, a bottom perspective view, a plan view, and a cross-sectional view, respectively, of a first connection substrate according to another embodiment.
Figure 18B:
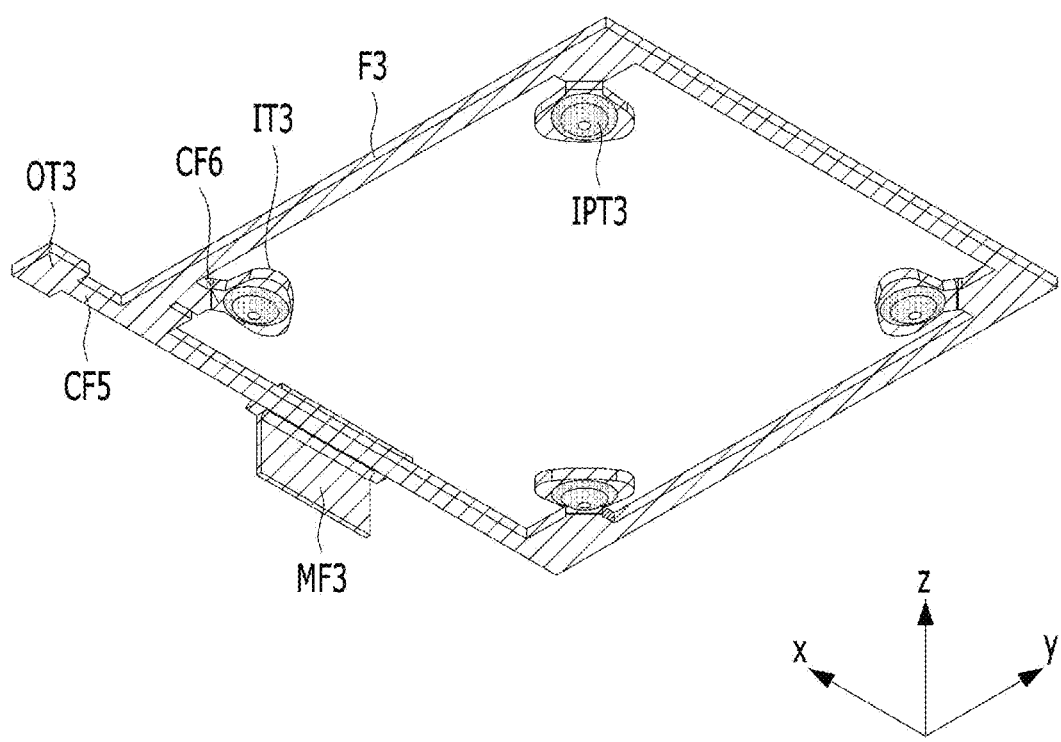
Figure 18C:
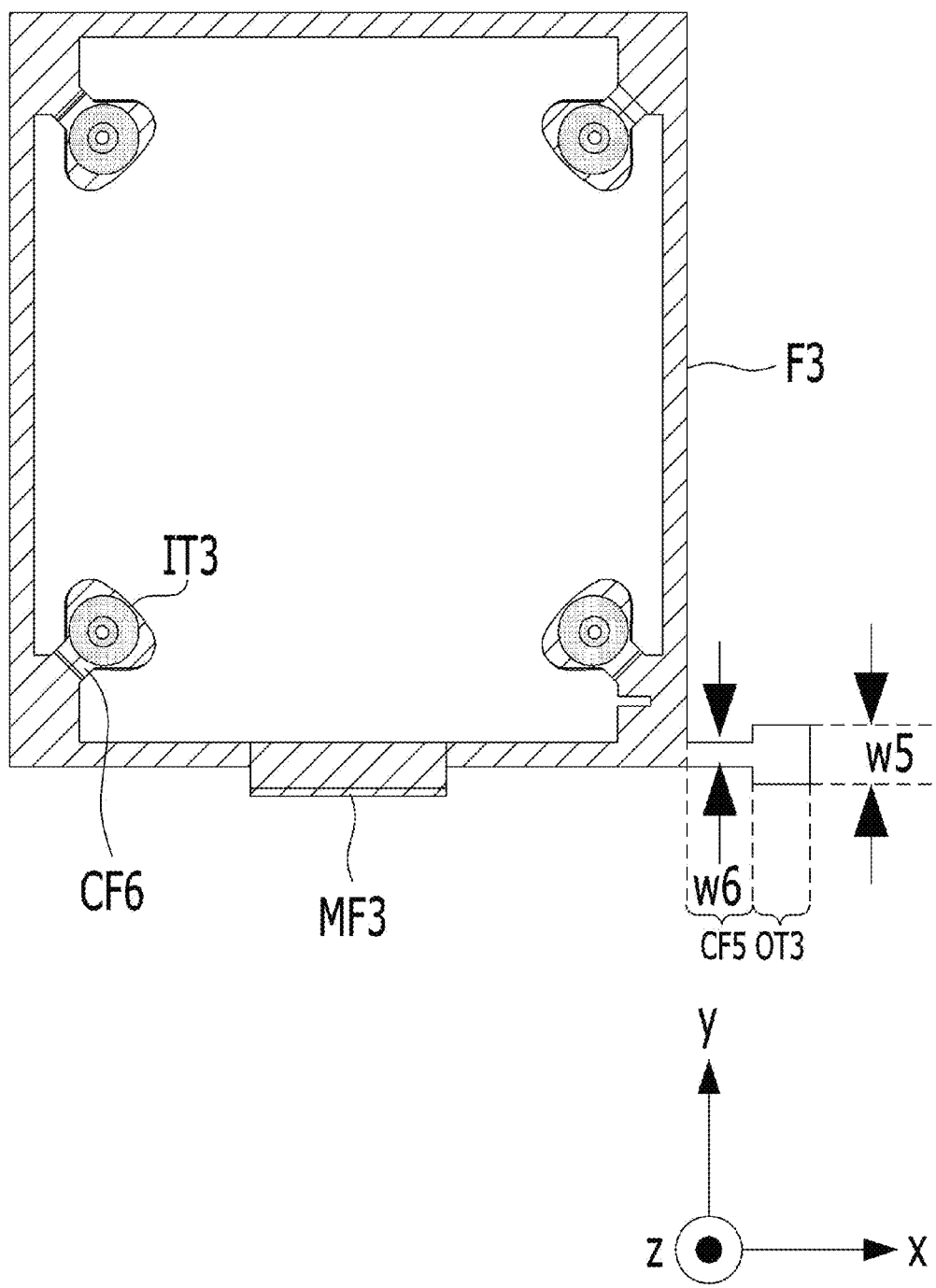
Figure 18D:
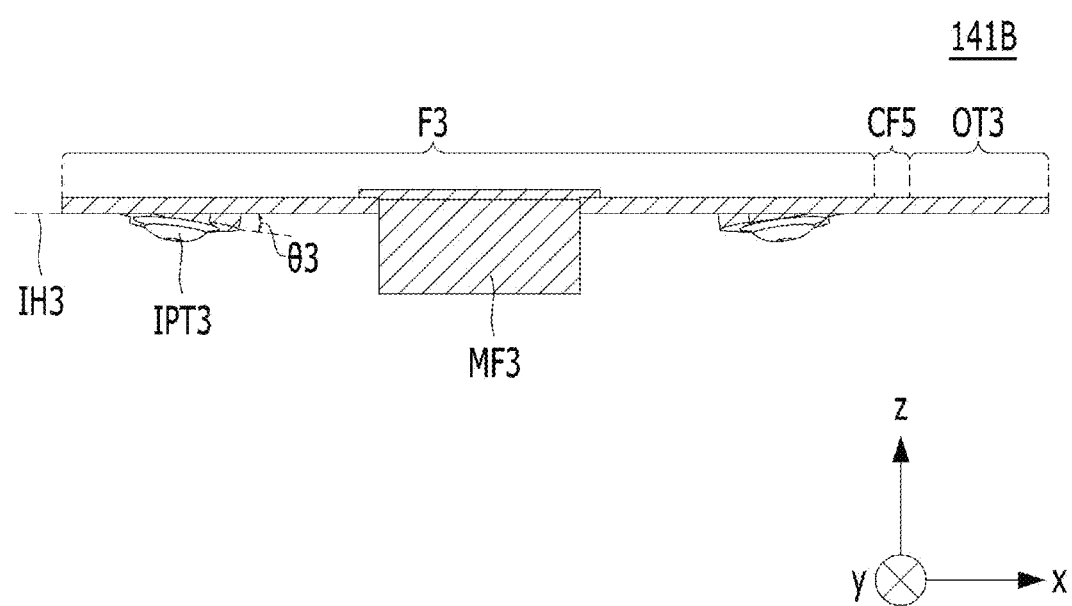

Referring to FIGS. 18B and 18D, each of the plurality of third inner terminals IT3 may include a third inner protruding portion IPT3 protruding in a direction oriented toward the sectors EO of the first electrode.

The third inner protruding portion IPT3 has a shape protruding from the bottom surface of the third inner terminal IT3. As shown in FIG. 18A, the top surface of the third inner terminal IT3 may have a concave shape IRT.

The third inner protruding portion IPT3 is a portion that is electrically connected to each sector EO of the first electrode. Thus, when the third inner terminal IT3 includes the third inner protruding portion IPT3, the third inner terminal IT3 may be stably electrically connected to each sector EO of the first electrode.

In addition, referring to FIG. 18D, the third inner terminal IT3 may be formed so as to be bent at an incline of a third predetermined angle θ3 in a direction oriented toward the liquid lens 142 from an imaginary third horizontal plane IH3 extending from the bottom surface of the third frame F3. As such, when the third inner terminal IT3 is formed to be inclined toward the liquid lens 142, the third inner terminal IT3 may be more stably electrically connected to the sector EO of the first electrode of the liquid lens 142.

The third outer terminal OT3 is a portion that is connected to the first connection part CP1 of the base 172B (i.e. the first upper connection portion CPH1). Although not shown, similar to the third inner terminal IT3, the third outer terminal OT3 may include a fourth inner protruding portion protruding in a direction oriented toward the first connection part CP1 of the base 172B. In this case, the fourth inner protruding portion may also have a concave shape, like the top surface of the third inner terminal IT3 shown in FIG. 18A. Alternatively, the third outer terminal OT3 may also be formed to be inclined, like the third inner terminal IT3.

The fifth connection frame CF5 extends outwards from the outer side of the third frame F3, and serves to electrically connect the third frame F3 and the third outer terminal OT3 to each other. The fifth width w5 of the third outer terminal OT3 may be greater than the sixth width w6 of the fifth connection frame CF5. The reason for this is that, when the fifth width w5 of the third outer terminal OT3 increases, the contact area between the third outer terminal OT3 and the first connection part CP1 increases, thus enabling more stable electrical connection of the third outer terminal OT3 to the first connection part CP1.

The sixth connection frame CF6 extends inwards from the inner side of the third frame F3, and serves to electrically connect the third frame F3 and the third inner terminal IT3 to each other.

If the sixth connection frame CF6 is not elastic, the sixth connection frame CF6 may be damaged when the bottom surface of the third inner terminal IT3 (or the third inner protruding portion IPT3) is brought into contact with the sector EO of the first electrode ELL In order to inhibit this, the sixth connection frame CF6 may be formed to be elastic. For the same reason, the fifth connection frame CF5 may also be formed to be elastic.

In addition, in the case in which the sixth width w6 of the fifth connection frame CF5 is less than the fifth width w5 of the third outer terminal OT3, the fifth connection frame CF5 may be made elastic when the third outer terminal OT1 is brought into contact with the first connection part CP1. In addition, in the case in which the width of the sixth connection frame CF6 is less than the width of the third inner terminal IT, the sixth connection frame CF6 may be made elastic when the third inner terminal IT3 is brought into contact with the sector EO of the first electrode.

In addition, the first connection substrate 141B may further include a third intermediate terminal MF3. The third intermediate terminal MF3 may be formed to be bent downwards (e.g. the −z-axis direction) from the third frame F3. For example, the third intermediate terminal MF3 may be formed to protrude from the outer side of the third frame F3 and then to be bent downwards (e.g. the −z-axis direction). The third intermediate terminal MF3 may protrude from the side portion of the third frame F3, but the embodiment is not limited thereto. The third intermediate terminal MF3 may be exposed to the outside through an eighth recess HP8 in the upper spacer 143H or a ninth recess HP9 in the lower spacer 143L.

Meanwhile, the second connection substrate 144B electrically connects the sector CO of the second electrode included in the liquid lens 142 to the second connection part CP2 of the base 172B. The second connection substrate 144A may be directly electrically connected to the sector CO included in the second electrode, and may be electrically connected to the main board 150 via the second connection part CP2 of the base 172B, which will be described later.

Figure 19A:
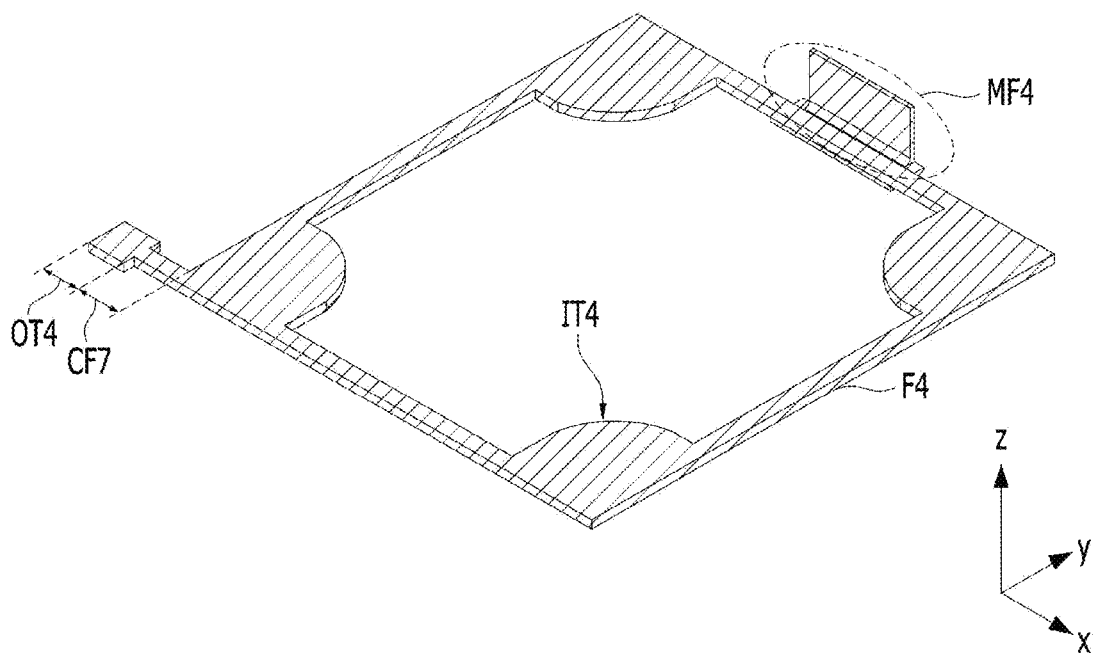
FIGS. 19A to 19C illustrate a perspective view, a plan view, and a cross-sectional view, respectively, of a second connection substrate according to another embodiment.
Figure 19B:
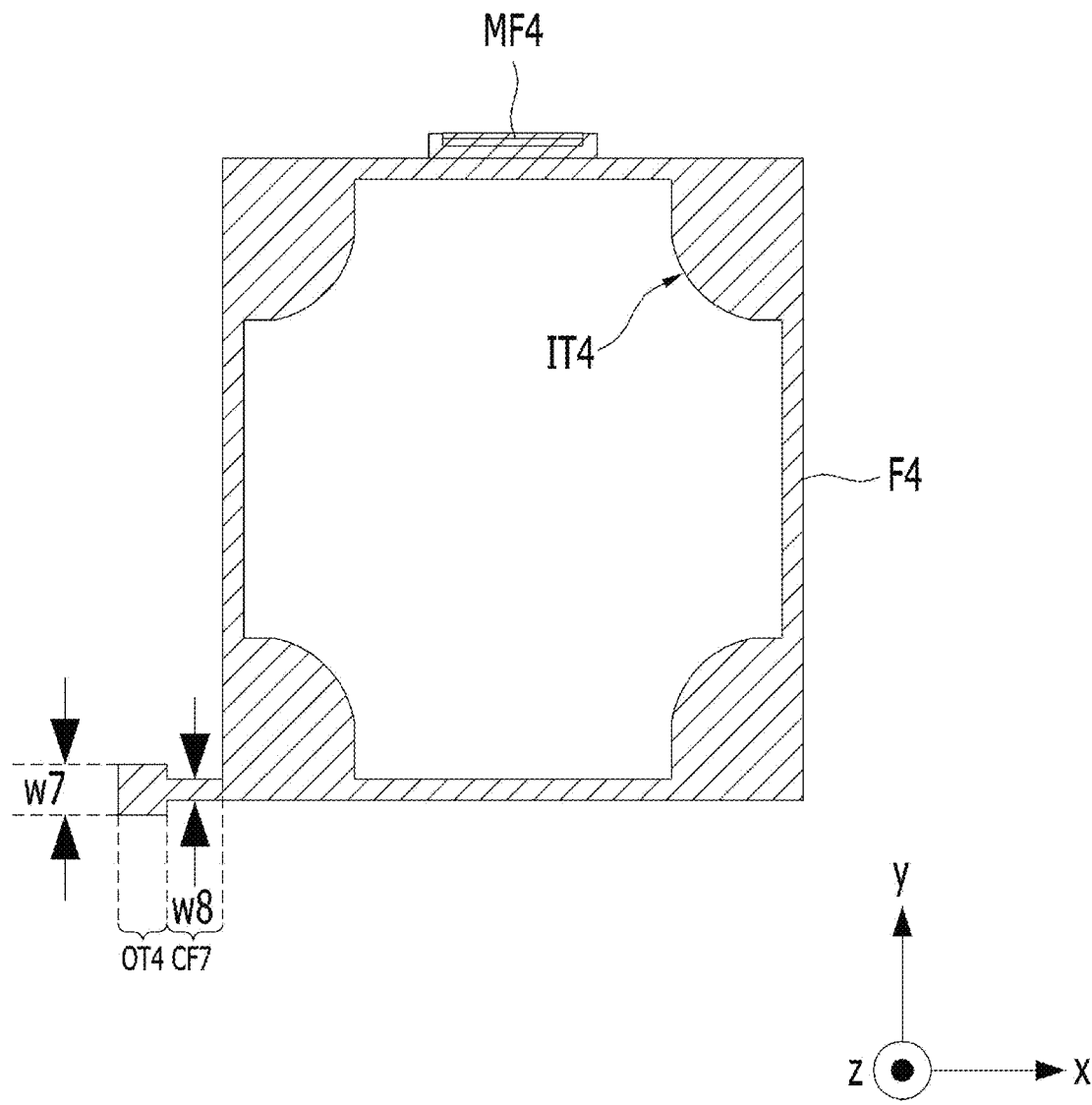
Figure 19C:
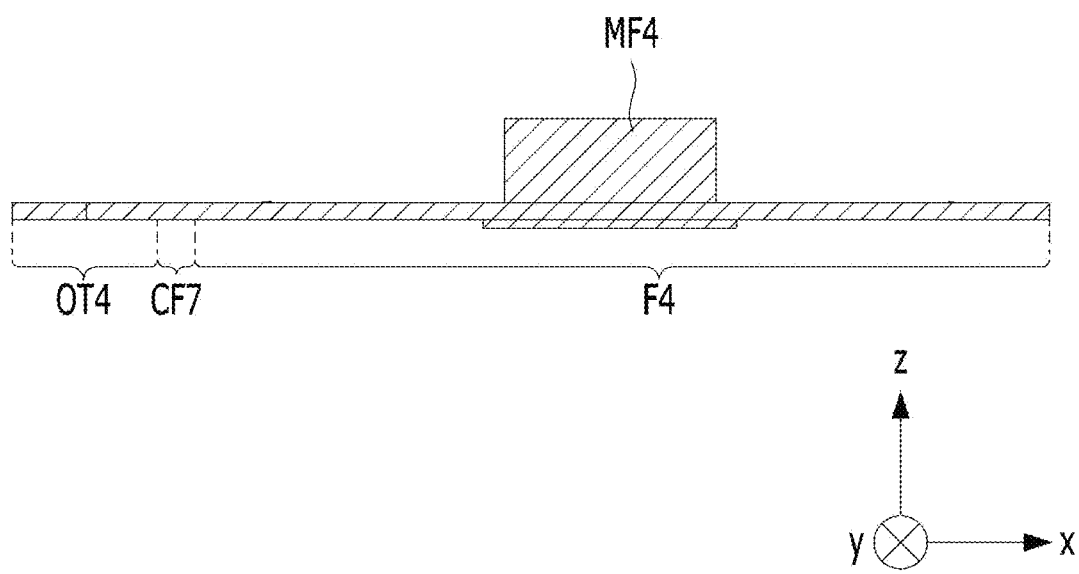

FIGS. 19A to 19C illustrate a perspective view, a plan view, and a cross-sectional view, respectively, of a second connection substrate 144B according to another embodiment.

Referring to FIGS. 19A to 19C, the second connection substrate 144B may include a fourth frame F4, a fourth inner terminal IT4, a fourth outer terminal OT4, and a seventh connection frame CF7.

The fourth frame F2 is a portion that is disposed between the lower spacer 143L and the liquid lens 142. The fourth frame F4 may be integrally formed with the lower spacer 143L.

The fourth inner terminal IT4 is a portion that is electrically connected to the sector CO of the second electrode of the liquid lens 142. When the sectors CO of the second electrode of the liquid lens 142 are disposed at the four corners of the lower side of the liquid lens 142, the fourth inner terminals IT4 may be disposed at the inner corners of the fourth frame F4 so as to be connected to the sectors of the second electrode.

The fourth outer terminal OT4 is a portion that is connected to the second connection part CP2 of the base 172B. Although not shown, the fourth outer terminal OT4 may include a third outer protruding portion OPT3 protruding in a direction oriented toward the second connection part CP2 of the base 172B. The third outer protruding portion OPT3 may protrude in the same shape as the first outer protruding portion OPT1 shown in FIG. 9C, but the embodiment is not limited thereto.

Although not shown, similar to the third inner terminal IT3, the fourth inner terminal IT4 may include a fourth inner protruding portion protruding in a direction oriented toward the sectors CO of the second electrode of the liquid lens 142.

The seventh connection frame CF7 extends outwards from the outer side of the fourth frame F4, and serves to electrically connect the fourth frame F4 and the fourth outer terminal OT4 to each other. The seventh width w7 of the fourth outer terminal OT4 may be greater than the eighth width w8 of the seventh connection frame CF7. The reason for this is that, when the seventh width w7 of the fourth outer terminal OT4 increases, the contact area between the fourth outer terminal OT4 and the second connection part CP2 increases, thus enabling more stable electrical connection of the fourth outer terminal OT4 to the second connection part CP2.

Referring to FIGS. 19A to 19C, the fourth inner terminal IT4 is illustrated as being directly connected to the fourth frame F4, but the embodiment is not limited thereto. According to another embodiment, the fourth inner terminal IT4 and the fourth frame F4 may be connected to each other via an eighth connection frame (not shown), like the second connection frame CF.

If the eighth connection frame is not elastic, the eighth connection frame CF8 may be damaged when the top surface of the fourth inner terminal OT4 is brought into contact with the sector of the second electrode. In order to inhibit this, the eighth connection frame CF8 may be formed to be elastic.

In addition, in the case in which the eighth width w8 of the seventh connection frame CF7 is less than the seventh width w7 of the fourth outer terminal OT4, the seventh connection frame CF7 may be made elastic when the fourth outer terminal OT4 is brought into contact with the second connection part CP2. In addition, in the case in which the eighth width w8 of the seventh connection frame CF7 is less than the seventh width w7 of the fourth outer terminal IT4, the seventh connection frame CF7 may be made elastic when the fourth outer terminal IT4 is brought into contact with the second connection part CP2.

In addition, the second connection substrate 144B may further include a fourth intermediate terminal MF4. The fourth intermediate terminal MF4 may be formed to be bent upwards (e.g. the +z-axis direction) from the fourth frame F4. Alternatively, the fourth intermediate terminal MF4 may be formed to protrude from the outer side of the fourth frame F4 and then to be bent upwards (e.g. the +z-axis direction). For example, the fourth intermediate terminal MF4 may protrude from the side portion of the fourth frame F4. However, the embodiment is not limited thereto.

The fourth intermediate terminal MF4 may be exposed to the outside through at least one of an eleventh recess HP11 in the upper spacer 143H or a tenth recess HP10 in the lower spacer 143L. In the embodiment described above, the third intermediate terminal MF3 has been described as being bent downwards, and the fourth intermediate terminal MF4 has been described as being bent upwards. However, the embodiment is not limited as to the specific direction in which the third and fourth intermediate terminals MF3 and MF4 are bent. That is, the third intermediate terminal MF3 may be bent upwards, and the fourth intermediate terminal MF4 may be bent downwards.

The third and fourth intermediate terminals MF3 and MF4 perform the same functions as the first and second intermediate terminals MF1 and MF2. That is, when active alignment is performed, the third and fourth intermediate terminals MF3 and MF4 serve to supply a driving voltage to the liquid lens 142. Thus, the upper and lower spacers 143H and 143L may respectively expose the third and fourth intermediate terminals MF3 and MF4 through the ninth to eleventh recesses HP9 to HP11. In this case, the ninth to eleventh recesses HP9 to HP11 may be disposed in a direction in which the liquid lens unit 140B is fitted into the lens holder 120.

The spacer 143A or 143B described above may be formed in a ring shape, and may be disposed so as to surround the side surface of the liquid lens 142. The spacer 143A or 143B may include uneven portions formed on the upper side and the lower side thereof in order to increase bonding force with the connection substrates 141A, 141B, 144A and 144B using an adhesive material. The connection substrates 141A, 141B, 144A and 144B may also include a ring shape so as to correspond to the shape of the spacer 143A or 143B.

In addition, with regard to the epoxy used to couple the components to each other in the description above, UV curing may be primarily performed and thermal curing may be secondarily performed, but the embodiment is not limited to any specific epoxy-curing method.

In addition, referring to FIGS. 8 and 17, the base 172A or 172B (or the lens holder 120) and the sensor holder 178 may be spaced apart from each other by a predetermined gap g in the optical-axis direction (e.g. the z-axis direction). This is a space required to perform active alignment, but the embodiment is not limited thereto.

In addition, in the camera module according to the embodiment, for example, the base may include first and second sidewalls, which face each other in a first direction intersecting the optical-axis direction, and third and fourth sidewalls, which face each other in a second direction intersecting both the optical-axis direction and the first direction. In this case, the spacer may include a third recess formed therein to expose one side of the liquid lens and a fourth recess formed therein opposite the third recess in the second direction to expose the opposite side of the liquid lens.

The first connection substrate may include a first frame coupled to the spacer and a first inner terminal connected to a first electrode of the liquid lens.

The first connection substrate may include a first outer terminal connected to a first connection part of the base.

The first connection substrate may further include a first connection frame, which extends outwards from the first frame to connect the first outer terminal to the first frame, and a second connection frame, which extends inwards from the first frame to connect the first inner terminal to the first frame.

The first connection frame and the second connection frame may be elastic.

The first inner terminal may include an inner protruding portion, which protrudes from one surface thereof in a direction oriented toward the first electrode of the liquid lens, and the first outer terminal may include an outer protruding portion, which protrudes from one surface thereof in a direction oriented toward the first connection part of the base. The opposite surface of the first inner terminal and the opposite surface of the first outer terminal may be formed concavely, the inner protruding portion of the first inner terminal may be formed on the bottom surface of the first inner terminal to be connected to the first electrode, and the outer protruding portion of the first outer terminal may be formed on the bottom surface of the first outer terminal to be connected to the first connection part.

The second connection substrate may include a second frame coupled to the spacer, a second inner terminal connected to a second electrode of the liquid lens, a second outer terminal connected to the second connection part of the base, a third connection frame extending outwards from the second frame to connect the second outer terminal to the second frame, and a fourth connection frame extending inwards from the second frame to connect the second inner terminal to the second frame.

The third connection frame and the fourth connection frame may be elastic.

The first connection substrate may include a first frame coupled to the spacer and a first through-hole formed in the inner corner of the first frame, and the first connection substrate may be connected to the first electrode of the liquid lens through the first through-hole.

The first connection substrate may further include a first outer terminal connected to the first connection part of the base and a second connection frame extending outwards from the first frame to connect the first outer terminal to the first frame, and the second connection frame may be elastic.

The first connection frame may have a smaller width than the first outer terminal, and the second connection frame may have a smaller width than the second inner terminal.

The base may include a body in which the lens holder is disposed, a plurality of upper pillars protruding from the top surface of the body in a direction parallel to the optical-axis direction, and a plurality of lower pillars protruding from the bottom surface of the body in a direction parallel to the optical-axis direction. The first connection part may be disposed over at least one of a first upper pillar among the plurality of upper pillars, a portion of the body, or a first lower pillar among the plurality of lower pillars, and the second connection part may be disposed over at least one of a second upper pillar among the plurality of upper pillars, another portion of the body, or a second lower pillar among the plurality of lower pillars. The height of the first upper pillar may be greater than the height of the second upper pillar.

Alternatively, the base may include a body in which the lens holder is disposed and a plurality of upper pillars protruding from the top surface of the body in a direction parallel to the optical-axis direction. The first connection part may be disposed over a first upper pillar among the plurality of upper pillars and a portion of the body, and the second connection part may be disposed over a second upper pillar among the plurality of upper pillars and another portion of the body. The height of the first upper pillar may be greater than the height of the second upper pillar.

The first connection substrate may include a first frame coupled to the spacer, a first outer terminal connected to the first connection part of the base, and a first connection frame extending outwards from the first frame to connect the first outer terminal to the first frame. The second connection substrate may include a second frame coupled to the spacer, a second outer terminal connected to the second connection part of the base, and a third connection frame extending outwards from the second frame to connect the second outer terminal to the second frame. The spacer may include a first connection groove formed at a position corresponding to the first connection frame and a second connection groove formed at a position corresponding to the third connection frame.

The first connection substrate may further include a first frame coupled to the spacer and a first intermediate terminal protruding from the outer side of the first frame and bent toward the main board, and the spacer may include a first recess formed therein to expose the first intermediate terminal to the outside.

The second connection substrate may further include a second intermediate terminal protruding from the outer side surface of the second frame and bent toward the liquid lens unit, and the spacer may include a second recess formed therein to expose the second intermediate terminal to the outside.

The first or second connection part, which is exposed to the outside through the fifth recess in the first cover, may be spaced apart from the inner surface of the first cover.

Meanwhile, the camera module 100A or 100B according to the embodiment and a camera module according to a comparative example will be described below.

The camera module according to the comparative example includes a liquid lens unit, a main board, and first and second flexible printed circuit boards. The liquid lens unit, the main board, the first flexible printed circuit board, and the second flexible printed circuit board of the camera module according to the comparative example perform the same functions as the liquid lens unit 140A or 140B, the main board 150, the first connection substrate 141A or 141B, and the second connection substrate 144A or 144B of the camera module 100A or 100B according to the embodiment.

In the camera module according to the comparative example, in order to electrically connect the liquid lens unit to the main board, each of the first and second flexible printed circuit boards connected to the liquid lens unit is bent to be electrically connected to the main board. This may lead to the following several problems.

When the size of the main board is small, the first and second flexible printed circuit boards, when bent, may not be accurately brought into contact with the main board, thus causing a defect of poor electrical connection between the first and second flexible printed circuit boards and the main board.

In addition, the connection between the liquid lens unit and the first and second flexible printed circuit boards may also become defective. In particular, when the size of the first and second flexible printed circuit boards is small, the first and second flexible printed circuit boards are likely to be disconnected or separated from the liquid lens unit, and thus the reliability thereof may be deteriorated.

In addition, since the first and second flexible printed circuit boards need to be bent, when the first and second flexible printed circuit boards are designed, the bending thereof needs to be included as a design consideration, which increases design constraints.

On the other hand, in the camera module 100A or 100B according to the embodiment, the first connection substrate 141A or 141B and the second connection substrate 144A or 144B, which are of a plate type, are respectively electrically connected to the first and second connection parts CP1 and CP2 disposed on the surface of the base 172A or 172B, which is of an MID type, and the first and second connection parts CP1 and CP2 of the base 172A or 172B are electrically connected to the pads 150-1 and 150-2 on the main board 150. As such, since the first and second connection substrates 141A, 141B, 144A and 144B are electrically connected to the main board 150 using the first and second connection parts CP1 and CP2 formed on the surface of the base 172A or 172B, it is not required to bend the first and second connection substrates 141A, 141B, 144A and 144B. Thus, it is possible to solve the aforementioned problems, which may be caused when the first and second connection substrates 141A, 141B, 144A and 144B are bent to electrically connect the main board 150 to the liquid lens unit 140A or 140B. A detailed description thereof will be made below.

In the comparative example, the first and second flexible printed circuit boards (FPCBs), which transmit a driving voltage from the main board to the liquid lens, are bent to be directly connected to the main board. In this case, tolerance at the contact portions between the first and second flexible printed circuit boards and the main board increases due to bending of the first and second flexible printed circuit boards. However, in the embodiment, the first and second connection parts CP1 and CP2 of the base 172A or 172B electrically connect the first connection substrate 141A or 141B and the second connection substrate 144A or 144B, which are of a plate type, to the main board 150. In this case, the first connection substrate 141A or 141B and the second connection substrate 144A or 144B do not need to be bent, and thus tolerance at the contact portions between the first and second connection substrates 141A, 141B, 144A and 144B and the base 172A or 172B or tolerance at the contact portion between the base 172A or 172B and the main board 150 is smaller than that in the comparative example. As such, since the accuracy of tolerance is improved, electrical connection between the first and second connection substrates 141A, 141B, 144A and 144B and the main board 150 may be reliably realized.

In addition, even when the size of the main board 150 is small, electrical contact between the first and second connection substrates 141A, 141B, 144A and 144B and the main board 150 is realized reliably, and thus the size of the main board 150 (or the camera module 100A or 100B) may be reduced.

In addition, electrical connection between the liquid lens unit 140A or 140B and the first and second connection substrates 141A, 141B, 144A and 144B is realized reliably. In particular, even when the size of the first and second connection substrates 141A, 141B, 144A and 144B is small, the first and second connection substrates 141A, 141B, 144A and 144B are inhibited from being disconnected or separated from the liquid lens unit, and thus the reliability thereof is improved.

In addition, for example, since the first and second connection substrates 141A, 141B, 144A and 144B do not need to be bent, design constraints of the first and second connection substrates 141A, 141B, 144A and 144B according to the embodiments are relaxed, and thus the freedom of design of the first and second connection substrates 141A, 141B, 144A and 144B may be increased.

In addition, since the first and second connection substrates 141A, 141B, 144A and 144B are provided with the intermediate terminals MF1 to MF4, the supply of driving voltage to the liquid lens 140A or 140B through the first and second connection substrates 141A, 141B, 144A and 144B is easily realized during active alignment, whereby the active alignment process may be easily and accurately performed, and thus the reliability of the camera module may be improved.

In addition, if the first cover 170 is placed to cover the lens holder 120 and the base 172A or 172B after active alignment is performed to align the optical axes of the first lens unit 110, the second lens unit 130, the liquid lens unit 140A or 140B, and the image sensor 182 with each other, the optical axes of the above components 110, 130, 140A, 140B and 182 may be misaligned. However, according to the embodiment, after the first cover 170 is coupled to the lens holder 120 and the base 172A, a driving voltage is supplied to the liquid lens 142 of the liquid lens unit 140A or 140B through the first and second connection parts CP1 and CP2, which are exposed through the fifth through-hole PH5. Thus, the first cover 170 is placed to cover the lens holder 120 and the base 172A or 172B after active alignment is primarily performed to align the optical axes of the first and second lens units 130 and the liquid lens unit 140A or 140B with each other and before active alignment is secondarily performed to align the optical axes of the liquid lens unit 140A or 140B and the image sensor 182 with each other. As such, since the first cover 170 is not coupled to the components after the secondary active alignment process, misalignment of the optical axes may be inhibited.

In addition, the connection frame, which is elastic and included in at least one of the first or second connection substrate, may compensate for a height difference between the liquid lens unit and the base, which may occur due to assembly tolerance or design tolerance.

Meanwhile, an optical device may be implemented using the camera module 100A or 100B including the lens assembly according to the embodiment described above. Here, the optical device may include a device that may process or analyze optical signals. Examples of the optical device may include camera/video devices, telescopic devices, microscopic devices, an interferometer, a photometer, a polarimeter, a spectrometer, a reflectometer, an auto-collimator, and a lens-meter, and the embodiments may be applied to optical devices that may include a lens assembly.

In addition, the optical device may be implemented in a portable device such as, for example, a smartphone, a laptop computer, or a tablet computer. Such an optical device may include the camera module 100A or 100B, a display unit (not shown) configured to output an image, a battery (not shown) configured to supply power to the camera module 100A or 100B, and a body housing in which the camera module 100A or 100B, the display unit, and the battery are mounted. The optical device may further include a communication module, which may communicate with other devices, and a memory unit, which may store data. The communication module and the memory unit may also be mounted in the body housing.

Although only a limited number of embodiments have been described above, various other embodiments are possible. The technical contents of the above-described embodiments may be combined into various forms as long as they are not incompatible with one another, and thus may be implemented in new embodiments.

It will be apparent to those skilled in the art that various changes in form and details may be made without departing from the spirit and essential characteristics of the disclosure set forth herein. Accordingly, the above detailed description is not intended to be construed to limit the disclosure in all aspects and to be considered by way of example. The scope of the disclosure should be determined by reasonable interpretation of the appended claims and all equivalent modifications made without departing from the disclosure should be included in the following claims.

MODE FOR INVENTION

Various embodiments have been described in the best mode for carrying out the disclosure.

INDUSTRIAL APPLICABILITY

A camera module according to embodiments may be used in camera/video devices, telescopic devices, microscopic devices, an interferometer, a photometer, a polarimeter, a spectrometer, a reflectometer, an auto-collimator, a lens-meter, a smartphone, a laptop computer, a tablet computer, etc.

The invention claimed is:
1. A camera module, comprising:
a liquid lens unit;
a lens holder in which the liquid lens unit is disposed;
a main board configured to supply a driving signal to drive the liquid lens unit; and
a base disposed between the liquid lens unit and the main board, the base being configured to transmit the driving signal output from the main board to the liquid lens unit, wherein the base comprises:
a body in which the lens holder is disposed;
a first pillar and a second pillar protruding upwards from the body; and
a first connection part and a second connection part electrically connecting the liquid lens unit to the main board,
wherein the liquid lens unit comprises:
a liquid lens having first and second electrodes;
a first connection substrate disposed on the liquid lens and electrically connected to the first electrode; and
a second connection substrate disposed under the liquid lens and electrically connected to the second electrode,
wherein the main board comprises first and second electrode pads configured to supply the driving signal,
wherein the first connection part connects the first connection substrate to the first electrode pad, and
wherein the second connection part connects the second connection substrate to the second electrode pad.

2. A camera module, comprising:
a liquid lens unit;
a lens holder in which the liquid lens unit is disposed;
a main board configured to supply a driving signal to drive the liquid lens unit;
a base disposed between the liquid lens unit and the main board, the base being configured to transmit the driving signal output from the main board to the liquid lens unit;
a first connection substrate disposed between the liquid lens unit and the base; and
a second connection substrate disposed between the liquid lens unit and the base,
wherein the base comprises:
a body in which the lens holder is disposed;
a first pillar protruding upwards from the body, the first pillar comprising a stepped portion formed at an upper side thereof; and
a second pillar protruding upwards from the body and comprising a stepped portion formed at an upper side thereof,
wherein a portion of the first connection substrate is disposed on the stepped portion of the first pillar,
wherein a portion of the second connection substrate is disposed on the stepped portion of the second pillar,
wherein the stepped portion of the first pillar comprises a first connection part formed on a surface thereof,
wherein the stepped portion of the second pillar comprises a second connection part formed on a surface thereof,
wherein the first connection substrate is electrically connected to the first connection part, and
wherein the second connection substrate is electrically connected to the second connection part.

3. The camera module according to claim 1, comprising:
first and second lens units disposed so as to overlap the liquid lens unit in an optical-axis direction,
wherein the lens holder accommodates the first and second lens units and the liquid lens unit disposed between the first lens unit and the second lens unit, and
wherein the base comprises:
first and second sidewalls facing each other in a first direction intersecting the optical-axis direction; and
third and fourth sidewalls facing each other in a second direction intersecting both the optical-axis direction and the first direction.

4. The camera module according to claim 1, wherein the liquid lens unit comprises a spacer accommodating at least a portion of the liquid lens.

5. The camera module according to claim 4, wherein the first connection substrate is disposed on a top surface of the spacer and a top surface of the liquid lens, and
wherein the second connection substrate is disposed on a bottom surface of the spacer and a bottom surface of the liquid lens.

6. The camera module according to claim 1, wherein the first connection part is disposed on one surface of the first pillar, and the second connection part is disposed on one surface of the second pillar.

7. The camera module according to claim 1, wherein each of the first pillar and the second pillar has a stepped surface, and a depth of the stepped surface of the first pillar and a depth of the stepped surface of the second pillar are different from each other.

8. The camera module according to claim 1, wherein the first and second connection parts are disposed on a surface of the base so as to be spaced apart from each other.

9. The camera module according to claim 1, comprising a cover disposed so as to surround the liquid lens unit and the base,
wherein the cover includes a first recess formed therein to expose a portion of at least one of the first or second connection part to the outside.

10. The camera module according to claim 2, wherein a height of the stepped portion of the first pillar is different from a height of the stepped portion of the second pillar.

11. The camera module according to claim 10, wherein the height of the stepped portion of the first pillar is greater than the height of the stepped portion of the second pillar.

12. The camera module according to claim 3, wherein the lens holder includes first and second openings disposed so as to face each other in the first direction,
wherein the liquid lens unit is inserted into the first opening and the second opening in the lens holder, and
wherein the first and second connection parts are respectively disposed on the third and fourth sidewalls.

13. The camera module according to claim 12, wherein the third sidewall includes a first edge portion, which is in contact with the first sidewall, and a second edge portion, which is in contact with the second sidewall,
wherein the fourth sidewall includes a first edge portion, which is in contact with the first sidewall, and a second edge portion, which is in contact with the second sidewall, and
wherein the first connection part is disposed on the first edge portion of the third sidewall, and the second connection part is disposed on the first edge portion of the fourth sidewall.

14. The camera module according to claim 4, wherein the spacer comprises an upper spacer disposed on the liquid lens and a lower spacer disposed under the liquid lens, and
wherein the first connection substrate is coupled to the upper spacer and the liquid lens,
wherein the second connection substrate is coupled to the lower spacer and the liquid lens.

15. The camera module according to claim 14, wherein the first connection substrate is integrally formed with the upper spacer,
wherein the second connection substrate is integrally formed with the lower spacer, and
wherein the upper spacer and the lower spacer are coupled to each other.

* * * * *